United States Patent
Takayama et al.

(10) Patent No.: US 12,408,489 B2
(45) Date of Patent: Sep. 2, 2025

(54) SEMICONDUCTOR LIGHT-EMITTING DEVICE

(71) Applicant: Nuvoton Technology Corporation Japan, Kyoto (JP)

(72) Inventors: Toru Takayama, Toyama (JP); Shinji Yoshida, Shiga (JP); Kunimasa Takahashi, Osaka (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 784 days.

(21) Appl. No.: 17/389,163

(22) Filed: Jul. 29, 2021

(65) Prior Publication Data
US 2021/0359163 A1    Nov. 18, 2021

Related U.S. Application Data

(63) Continuation-in-part of application No. PCT/JP2019/050454, filed on Dec. 24, 2019.

(30) Foreign Application Priority Data

Jan. 30, 2019 (JP) ................................ 2019-014864

(51) Int. Cl.
*H10H 20/825* (2025.01)
*H10H 20/816* (2025.01)
*H10H 20/855* (2025.01)

(52) U.S. Cl.
CPC ...... *H10H 20/825* (2025.01); *H10H 20/8162* (2025.01); *H10H 20/855* (2025.01)

(58) Field of Classification Search
CPC . H10H 20/825; H10H 20/8162; H10H 20/811
See application file for complete search history.

(56) References Cited

U.S. PATENT DOCUMENTS 5,952,680 A * 9/1999 Strite ................. H01L 33/325
257/89
6,555,403 B1 * 4/2003 Domen ................ B82Y 20/00
257/11

(Continued)

FOREIGN PATENT DOCUMENTS

JP     2000-299532 A    10/2000
JP     2002-270971 A     9/2002

(Continued)

OTHER PUBLICATIONS

International Search Report issued in corresponding International Patent Application No. PCT/JP2019/050454, dated Mar. 17, 2020, with English translation.

*Primary Examiner* — Vincent Wall
(74) *Attorney, Agent, or Firm* — Rimon P.C.

(57) ABSTRACT

A semiconductor light-emitting device includes: a first semiconductor layer containing a first conductivity type nitride semiconductor; an active layer containing a nitride semiconductor including Ga or In; an electron barrier layer containing a nitride semiconductor including at least Al, and being of a second conductivity type; and a second semiconductor layer containing a second conductivity type nitride semiconductor. The electron barrier layer includes a region where an Al composition ratio increases monotonically toward the second semiconductor layer. A maximum impurity concentration position of the second conductivity type in the electron barrier layer is located between an interface on an active layer side of the electron barrier layer and an intermediate position between a maximum Al composition ratio position of the electron barrier layer in the region and an interface on an active layer side of the electron barrier layer.

23 Claims, 30 Drawing Sheets

(56) References Cited

U.S. PATENT DOCUMENTS

| | | | |
|---|---|---|---|
| 2002/0117677 A1* | 8/2002 | Okuyama | H01L 33/24 |
| | | | 257/94 |
| 2003/0128729 A1* | 7/2003 | Matsumura | H01S 5/227 |
| | | | 372/46.01 |
| 2007/0290230 A1* | 12/2007 | Kawaguchi | H10H 20/825 |
| | | | 257/E29.328 |
| 2008/0137701 A1 | 6/2008 | Freund | |
| 2014/0294029 A1* | 10/2014 | Masui | H01S 5/320225 |
| | | | 372/45.012 |
| 2016/0149078 A1* | 5/2016 | Takeuchi | H01S 5/34333 |
| | | | 257/13 |
| 2018/0109076 A1* | 4/2018 | Takayama | H01S 5/2206 |
| 2019/0074665 A1* | 3/2019 | Takayama | H01S 5/34346 |
| 2020/0299862 A1* | 9/2020 | Fukuda | H01L 21/02634 |
| 2020/0412101 A1* | 12/2020 | Takayama | H01S 5/3407 |
| 2021/0359163 A1* | 11/2021 | Takayama | H01L 33/04 |

FOREIGN PATENT DOCUMENTS

| | | |
|---|---|---|
| JP | 2014-3329 A | 1/2014 |
| JP | 2014-131019 A | 7/2014 |
| WO | 2017/195502 A1 | 11/2017 |

\* cited by examiner

SEMICONDUCTOR LIGHT-EMITTING DEVICE

CROSS REFERENCE TO RELATED APPLICATIONS

This application is a continuation-in-part of PCT International Application No. PCT/JP2019/050454 filed on Dec. 24, 2019, designating the United States of America, which is based on and claims priority of Japanese Patent Application No. 2019-014864 filed on Jan. 30, 2019. The entire disclosures of the above-identified applications, including the specifications, drawings and claims are incorporated herein by reference in their entirety.

FIELD

The present disclosure relates to a semiconductor light-emitting device.

BACKGROUND

Welding process light sources and vehicle-mounted laser headlight light sources using semiconductor light-emitting devices such as semiconductor laser devices as light sources have recently been attracting attention.

Metals such as gold and copper have high absorption coefficients with respect to light in the blue-violet to blue regions, i.e., wavelengths of 405 nm to 450 nm, and thus laser light sources in the blue-violet to blue regions are suited to use as light sources for laser welding processing devices that process those metals.

Additionally, if a phosphor can be excited by blue laser light to obtain yellow light, an ultra-high power light source which is white as a whole can be obtained.

For these reasons, nitride-based ultra-high-power semiconductor laser devices that can produce laser light in the blue-violet to blue regions, i.e., the 405 to 450 nm wavelength band, are in demand as light sources.

Here, semiconductor laser devices for the stated applications are required to have long-term reliability, such as of about 10,000 hours or more under high-output operation at 3 watts or more, for example.

To realize such a highly-reliable ultra-high power semiconductor laser device, it is necessary to suppress self-heating during laser oscillation to the greatest extent possible. It is therefore necessary to achieve ultra-low power consumption at low operating current and low operating voltage in an ultra-high power semiconductor laser device.

To achieve low operating current, it is important to suppress reactive current (i.e., leakage current) caused by electrons injected into the active layer being thermally excited and leaking out of the active layer into the p-type cladding layer due to self-heating of the device during high-temperature operation or ultra-high power operation.

As described in PTL 1 and 2, a configuration in which an electron barrier layer having a higher band-gap energy than the p-type cladding layer is disposed between the p-type cladding layer and the active layer is effective in suppressing the generation of leakage current. According to this configuration, even if electrons injected into the active layer are thermally excited, it will be difficult for the electrons to pass the electron barrier layer with high band-gap energy, which makes it possible to suppress the generation of leakage current.

CITATION LIST

Patent Literature

PTL 1: Japanese Unexamined Patent Application Publication No. 2002-270971
PTL 2: International Publication No. 2017/195502

SUMMARY

Technical Problem

A structure of the semiconductor light-emitting device disclosed in PTL 1 will be described here with reference to FIGS. 29A and 29B, for example. FIG. 29A is a schematic diagram illustrating the layered structure of the semiconductor light-emitting device disclosed in PTL 1. FIG. 29B is a graph illustrating the band structure of the semiconductor light-emitting device disclosed in PTL 1. As illustrated in FIGS. 29A and 29B, in the semiconductor light-emitting device disclosed in PTL 1, active layer 212 is interposed between n-type layer 211 and p-type layer 213. n-type layer 211 has n-side first nitride semiconductor layer 231b, n-side second nitride semiconductor layer 232b, and lower cladding layer 225. p-type layer 213 has p-side electron confinement layer 228, p-side first nitride semiconductor layer 231a, p-side second nitride semiconductor layer 232a, and upper cladding layer 230. Active layer 212 has well layers 201a and 201b, and barrier layers 202a, 202b, and 202c.

As illustrated in FIG. 29B, p-side electron confinement layer 228, which corresponds to an electron barrier layer having a band-gap energy higher than that of upper cladding layer 230, is disposed between active layer 212 and upper cladding layer 230. According to this structure, even during high-temperature operation, electrons injected into active layer 212 are less likely to leak into upper cladding layer 230 due to the energy barrier of p-side electron confinement layer 228, which is constituted by AlGaN.

However, the energy barrier formed on the valence band side of p-side electron confinement layer 228 inhibits holes from flowing from upper cladding layer 230 toward active layer 212, which increases the operating voltage.

The semiconductor light-emitting device disclosed in PTL 2 will be described next with reference to FIG. 30. FIG. 30 is a schematic diagram illustrating a band-gap energy distribution of the semiconductor light-emitting device disclosed in PTL 2. The semiconductor light-emitting device disclosed in PTL 2 includes n-type AlGaN cladding layer 412, second optical guide layer 413, third optical guide layer 414, multiquantum well active layer 415, first optical guide layer 416, GaN intermediate layer 417, electron barrier layer 418, and p-type AlGaN cladding layer 419. As illustrated in FIG. 30, in PTL 2, the Al composition ratio is gradually changed at the interface on the active layer 415-side of electron barrier layer 418, which is constituted by AlGaN. As a result, a polarization charge produced by the piezoelectric effect and formed at the interface is dispersed to the region where the Al composition ratio changes, which reduces changes in the band structure caused by the polarization charge of electron barrier layer 418 and lowers the operating voltage.

Here, if the Al composition ratio of the n-type cladding layer side of electron barrier layer 418 is gradually increased from the active layer side to the p-type AlGaN cladding layer 419 side, the polarization charge and band-gap can be gradually changed. At this time, if a change in the band structure of the valence band caused by the polarization charge and the change in the band-gap energy can be caused to cancel out, the energy barrier can be increased with respect to electrons while suppressing an increase in the energy barrier with respect to holes in electron barrier layer 418. This makes it possible to suppress an increase in the operating voltage caused by using electron barrier layer 418.

However, as described above, ultra-high power semiconductor laser devices capable of long-term operation of 10,000 hours or more at high temperatures and high output are in demand for laser welding process light sources and vehicle-mounted headlight light sources, and it is therefore necessary to reduce the power consumption thereof to the greatest extent possible.

Having been achieved to solve the above-described problem, an object of the present disclosure is to provide a semiconductor light-emitting device having low power consumption even during high-temperature and high-output operation.

Solution to Problem

To solve the above-described problem, a semiconductor light-emitting device according to one aspect of the present disclosure includes: a first semiconductor layer above a substrate, the first semiconductor layer containing a nitride semiconductor of a first conductivity type; an active layer above the first semiconductor layer, the active layer containing a nitride semiconductor that includes Ga or In; an electron barrier layer above the active layer, the electron barrier layer containing a nitride semiconductor including at least Al and being of a second conductivity type different from the first conductivity type; and a second semiconductor layer above the electron barrier layer, the second semiconductor layer containing a nitride semiconductor of the second conductivity type. The electron barrier layer includes an increasing Al composition ratio region in which an Al composition ratio increases monotonically with proximity to the second semiconductor layer, and a maximum impurity concentration position of an impurity of the second conductivity type in the electron barrier layer is located between an interface on an active layer side of the electron barrier layer and an intermediate position, the intermediate position being a position between a position in the increasing Al composition ratio region where the Al composition ratio of the electron barrier layer is maximum and the interface on an active layer side of the electron barrier layer.

With the semiconductor light-emitting device according to the present disclosure, the polarization charge surface density formed in the electron barrier layer gradually increases from the interface with the active layer to a position where the Al composition ratio reaches a maximum, with proximity to the second semiconductor layer. In this case, the magnitude of the polarization charge per unit of volume is proportional to the rate of change in the polarization charge surface density, and thus a positive polarization charge is formed in the electron barrier layer, the charge having a magnitude that increases in accordance with the rate of change in the Al composition ratio of the electron barrier layer, from the interface with the active layer toward the second semiconductor layer.

On the other hand, in an electron barrier layer having a constant Al composition ratio in the layering direction, the polarization charge surface density changes in steps at the active layer-side interface of the electron barrier layer, and the polarization charge density, converted to units of volume, formed at the stated interface becomes a very high value, in the form of a delta function.

The electron barrier layer according to the present disclosure has a structure in which the Al composition ratio increases monotonically in the layering direction from the active layer side to the position where the Al composition ratio reaches a maximum, which reduces the volume density of the positive polarization charge generated at the interface between the electron barrier layer and the active layer. Electrons are induced in the active layer-side interface of the electron barrier layer in order to satisfy the electrical neutrality condition.

Furthermore, in the electron barrier layer according to the present disclosure, the maximum impurity concentration position of an impurity of the second conductivity type in the electron barrier layer is located between the interface on the active layer side of the electron barrier layer and the intermediate position between a position of the electron barrier layer where the Al composition ratio is maximum in the increasing Al composition ratio region and the active layer-side interface of the electron barrier layer.

For example, if the electron barrier layer is a p-type semiconductor layer, the distribution of a negative charge due to ionized acceptors produced by impurity doping is greater on the active layer-side interface side.

Due to the negative charge from the ionized acceptors, the positive polarization charge at the active layer-side interface of the electron barrier layer is neutralized, and the electron concentration electrically induced at the interface is also reduced. A high concentration of electrically-induced electrons at the interface lowers the band potential in this region, which lowers the potential of the valence band of the electronic barrier layer and increases the potential barrier with respect to holes, leading to an increase in the operating voltage.

The structure of the present disclosure has an effect of reducing the electron concentration electrically induced at this interface, which suppresses an increase in the operating voltage of the semiconductor light-emitting device.

In addition, because a drop in the potential of the band structure in the valence band of the electron barrier layer can be suppressed, the band in the conduction band increases relatively, and the generation of electrons leaking from the active layer beyond the electron barrier layer to the second conductivity type (p-type) layer side can be suppressed. This makes it possible to suppress leakage current even during high-temperature and high-output operation of the semiconductor light-emitting device. In other words, the temperature characteristics of the semiconductor light-emitting device are improved.

The effect of neutralizing the polarization charge at the active layer-side interface of the electron barrier layer by these ionized acceptors can be achieved by creating the distribution shape described below, even if the total doping amount of impurities in the electron barrier layer is made the same as the total doping amount when the electron barrier layer is uniformly doped with impurities, and the doping amount on the active layer-side interface side of the electron barrier layer is made relatively higher. In other words, in the increasing Al composition ratio region, the impurity concentration is distributed so that the maximum impurity concentration position is located on the active layer side relative to the intermediate position between the position of the electron barrier layer where the Al composition ratio is maximum and the active layer-side interface of the electron barrier layer.

This makes it possible to achieve low operating voltage characteristics without increasing free carrier loss due to impurity doping in the electron barrier layer. An effect of suppressing a phenomenon in which, during high-temperature and high-output operation, electrons are thermally excited and leak beyond the electron barrier layer to the second semiconductor layer (i.e., electron overflow), is increased as well.

A semiconductor light-emitting device having a lower operating voltage and lower leakage current than past semiconductor light-emitting devices can be achieved as a result. In addition, because the total doping amount of impurities in the electron barrier layer can be set to the approximately the same level as the total doping amount in the electron barrier layer in the case of a doping profile in which the electron barrier layer is uniformly doped with impurities (Comparative Example 2, described below), an increase in waveguide loss can be suppressed. Therefore, with the semiconductor light-emitting device according to the present disclosure, low operating voltage characteristics can be achieved while suppressing an increase in waveguide loss. This reduces self-heating of the semiconductor light-emitting device, and thus a semiconductor light-emitting device which consumes little power even during high-temperature and high-output operation can be achieved.

Advantageous Effects

According to the present disclosure, a semiconductor light-emitting device which consumes little power even during high-temperature and high-output operation can be provided.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Figure 1A:
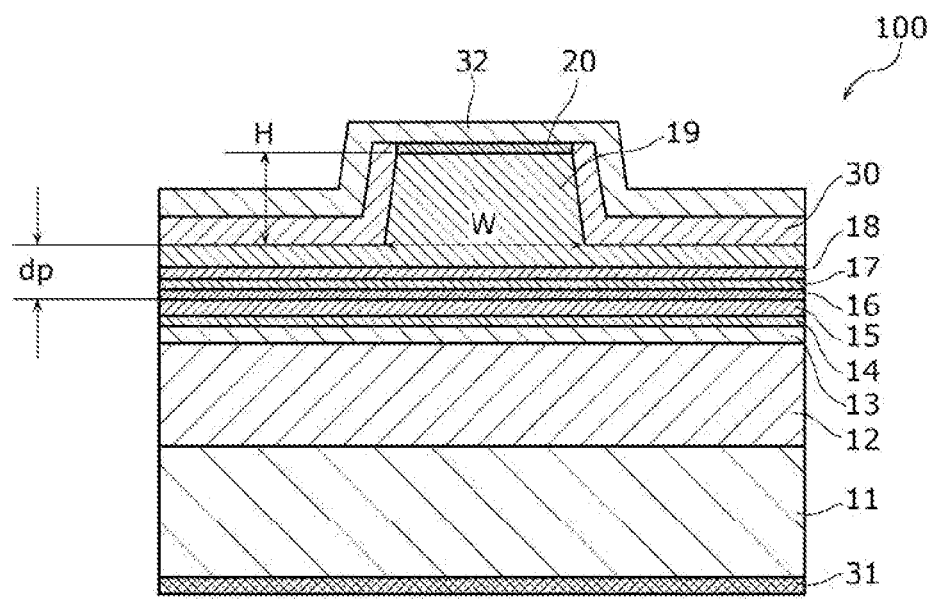
FIG. 1A is a schematic cross-sectional view illustrating the overall configuration of a semiconductor light-emitting device according to Embodiment 1.

Embodiments of the present disclosure will be described hereinafter with reference to the drawings. Note that the following embodiments describe specific examples of the present disclosure. As such, the numerical values, shapes, materials, constituent elements, arrangements of constituent elements, connection states, and the like in the following embodiments are merely examples, and are not intended to limit the present disclosure. Thus, of the constituent elements in the following embodiments, constituent elements not denoted in the independent claims, which express the broadest interpretation of the present disclosure, will be described as optional constituent elements.

Additionally, the drawings are schematic diagrams, and are not necessarily exact illustrations. As such, the scales and so on are not necessarily consistent from drawing to drawing. Note also that configurations that are substantially the same are given the same reference signs in the drawings, and redundant descriptions will be omitted or simplified.

Additionally, in the present specification, terms such as "above" and "below" do not indicate the upward direction (vertically upward) and the downward direction (vertically downward) in an absolute spatial sense, but rather are used as terms defining relative positional relationships based on layering orders in layered configurations. Moreover, terms such as "above" and "below" are used not only in cases where two constituent elements are disposed with an interval therebetween and another constituent element is present between the stated two constituent elements, but also in cases where two constituent elements are disposed in contact with each other.

Embodiment 1

1-1. Overall Configuration

The overall configuration of a semiconductor light-emitting device according to Embodiment 1 will be described with reference to FIG. 1A. FIG. 1A is a schematic cross-sectional view illustrating the overall configuration of semiconductor light-emitting device 100 according to the present embodiment.

Semiconductor light-emitting device 100 according to the present embodiment is a nitride semiconductor laser device. FIG. 1A illustrates a cross-section perpendicular to a resonance direction of semiconductor light-emitting device 100.

As illustrated in FIG. 1A, semiconductor light-emitting device 100 includes substrate 11, first semiconductor layer 12, active layer 15, electron barrier layer 18, and second semiconductor layer 19. In the present embodiment, semiconductor light-emitting device 100 further includes first optical guide layer 13, second optical guide layer 14, third optical guide layer 16, intermediate layer 17, contact layer 20, current blocking layer 30, n-side electrode 31, and p-side electrode 32.

Substrate 11 is a plate-shaped base on which the semiconductor layers of semiconductor light-emitting device 100 are layered. When x represents an atomic composition ratio of In and y represents an atomic composition ratio of Ga, substrate 11 has a composition expressed by $In_xGa_yAl_{1-x-y}N$ ($0 \leq x < 1$, $0 < y \leq 1$, $0 \leq 1-x-y \leq 1$). Substrate 11 is a GaN substrate in the present embodiment.

First semiconductor layer 12 is a layer, disposed above substrate 11, that contains a nitride semiconductor of a first conductivity type. In the present embodiment, the first conductivity type is the n type. First semiconductor layer 12 is constituted by an n-type AlGaN layer having a thickness of 1.5 μm.

First optical guide layer 13 is an optical guide layer that is disposed above first semiconductor layer 12 and has a higher refractive index than first semiconductor layer 12. In the present embodiment, first optical guide layer 13 is a semiconductor layer of the first conductivity type, constituted by n-type GaN and having a thickness of 100 nm.

Second optical guide layer 14 is a first conductivity-side optical guide layer disposed between active layer 15 and first semiconductor layer 12 and containing In. In the present embodiment, second optical guide layer 14 is a layer that is disposed above first optical guide layer 13 and is constituted by InGaN having a thickness of 185 nm.

Active layer 15 is a layer that is disposed above first semiconductor layer 12 and that contains a nitride semiconductor including Ga or In. In the present embodiment, active layer 15 includes undoped multiquantum wells that are disposed above second optical guide layer 14.

Third optical guide layer 16 is a second conductivity-side optical guide layer disposed between active layer 15 and electron barrier layer 18 and containing In. In the present embodiment, third optical guide layer 16 is a layer that is disposed above active layer 15 and is constituted by InGaN having a thickness of 90 nm. Third optical guide layer 16 has a composition ratio gradient region in which a composition ratio of the In decreases with proximity to electron barrier layer 18. The composition ratio gradient region is located in a second semiconductor layer 19-side (intermediate layer 17-side) region of third optical guide layer 16.

Intermediate layer 17 is a layer that is disposed between electron barrier layer 18 and active layer 15 and that contains a nitride semiconductor. In the present embodiment, intermediate layer 17 is disposed between electron barrier layer 18 and the second conductivity-side optical guide layer (third optical guide layer 16), is constituted by of $Ga_{1-x}In_xN$ (0≤x<1) of a second conductivity type, and has a lower In composition ratio than the second conductivity-side optical guide layer (third optical guide layer 16). To be more specific, intermediate layer 17 contains GaN, of the second conductivity type, having a thickness of 3 nm. The second conductivity type is a conductivity type different from the first conductivity type, and is the p-type in the present embodiment.

By including intermediate layer 17, semiconductor light-emitting device 100 can reduce stress generated at an interface due to a difference in lattice constants between electron barrier layer 18 and the second conductivity-side optical guide layer. This makes it possible to suppress the occurrence of crystal defects in semiconductor light-emitting device 100. Furthermore, by having the conductivity type of intermediate layer 17 be the p-type, the operating voltage of semiconductor light-emitting device 100 can be reduced.

Electron barrier layer 18 is a layer, of the second conductivity type, that is disposed above active layer 15 and that contains a nitride semiconductor including at least Al. In the present embodiment, electron barrier layer 18 is disposed between intermediate layer 17 and second semiconductor layer 19, and is constituted by p-type AlGaN. In the present embodiment, an average lattice constant of electron barrier layer 18 is lower than an average lattice constant of substrate 11. Additionally, an average strain of a lattice in a direction parallel to a main surface of substrate 11 arising in electron barrier layer 18 is a tensile strain. The configuration of electron barrier layer 18 will be described in detail later.

Second semiconductor layer 19 is a semiconductor layer, disposed above electron barrier layer 18, that contains a nitride semiconductor of a second conductivity type different from the first conductivity type. In the present embodiment, second semiconductor layer 19 is a 660 nm-thick p-type AlGaN cladding layer.

Contact layer 20 is a layer, disposed above second semiconductor layer 19, that contains a nitride semiconductor of the second conductivity type. In the present embodiment, contact layer 20 is constituted by 0.05 µm-thick p-type GaN.

Current blocking layer 30 is an insulating layer that is disposed above second semiconductor layer 19 and is transmissive with respect to light from active layer 15. In the present embodiment, current blocking layer 30 is constituted by $SiO_2$.

n-side electrode 31 is a conductive layer disposed below substrate 11. In-side electrode 31 is, for example, a single-layer or multi-layer film formed from at least one of Cr, Ti, Ni, Pd, Pt, and Au.

p-side electrode 32 is a conductive layer disposed above contact layer 20. In the present embodiment, p-side electrode 32 is disposed above contact layer 20 and current blocking layer 30. p-side electrode 32 is, for example, a single-layer or multi-layer film formed from at least one of Cr, Ti, Ni, Pd, Pt, and Au.

A ridge is formed in second semiconductor layer 19 of semiconductor light-emitting device 100. In the present embodiment, a ridge width W is approximately 30 µm. Additionally, as illustrated in FIG. 1A, a distance between a lower end part of the ridge and active layer 15 is represented by dp. A distance between the lower end part of the ridge and an upper end part of the ridge is represented by H. A resonator length of semiconductor light-emitting device 100 according to the present embodiment is approximately 1,200 µm.

Here, in the present embodiment, in order to confine light to the direction perpendicular to active layer 15 (a normal direction relative to the main surface of substrate 11), the Al composition ratios of first semiconductor layer 12 constituted by an n-type AlGaN layer and second semiconductor layer 19 constituted by a p-type AlGaN layer are set to 0.035 (3.5%). As a result, the refractive indices of first semiconductor layer 12 and second semiconductor layer 19 become smaller than the effective refractive indices in the optical field range of semiconductor light-emitting device 100, and thus first semiconductor layer 12 and second semiconductor layer 19 function as cladding layers.

Increasing the Al composition ratio of first semiconductor layer 12, which is constituted by an n-type AlGaN layer, and second semiconductor layer 19, which is constituted by a p-type AlGaN layer, can increase the refractive index difference between active layer 15, and first semiconductor layer 12 and second semiconductor layer 19 functioning as cladding layers. This makes it possible to strongly confine light in the layering direction of active layer 15 (i.e., the direction perpendicular to the main surface of substrate 11), which makes it possible to reduce an oscillation threshold current value. However, due to the difference in the coefficient of thermal expansion between the AlGaN layers and substrate 11, if the Al composition ratios of first semiconductor layer 12 and second semiconductor layer 19, which are constituted by AlGaN, is increased excessively, lattice defects will occur, which leads to reduced reliability. Accordingly, in the present embodiment, the Al composition ratios of first semiconductor layer 12 and second semiconductor layer 19 are set to at most 0.05 (i.e., 5%).

Figure 1B:
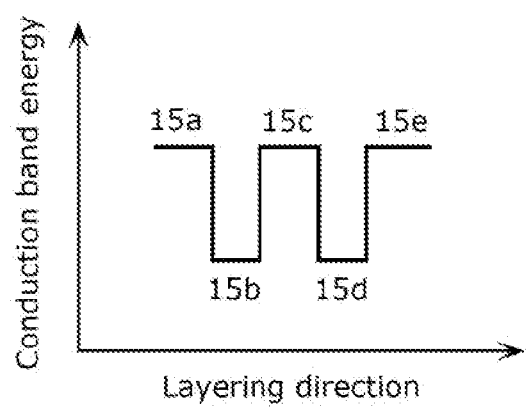
FIG. 1B is a graph illustrating a conduction band energy distribution of an active layer with respect to a layering direction, according to Embodiment 1.

Active layer 15 according to the present embodiment will be described next with reference to FIG. 1B. FIG. 1B is a graph illustrating a conduction band energy distribution of active layer 15 with respect to the layering direction, according to the present embodiment. To achieve laser oscillation at a wavelength of 450 nm, active layer 15 has a Double Quantum Well (DQW) structure with two well layers 15b and 15d and three barrier layers 15a, 15c, and 15e, as illustrated in FIG. 1B. The two well layers 15b and 15d are respectively disposed between two adjacent barrier layers of the three barrier layers 15a, 15c, and 15e.

Well layers 15b and 15d are constituted by InGaN having a thickness of 3 nm and an In composition ratio of 0.16 (i.e., 16%). Barrier layers 15a, 15c, and 15e are constituted by InGaN having an In composition ratio of 0.04 (i.e., 4%). Barrier layers 15a, 15c, and 15e have thicknesses of 7 nm, 7 nm, and 5 nm, respectively, and are constituted by InGaN having an In composition ratio of 0.04 (i.e., 4%). In the well layers, a high In composition ratio of at least 15% is required to obtain laser oscillation light in the 450 nm band. In this case, lattice irregularity between the well layers and substrate 11 is at least 1.7%, and if the thickness is made too great, lattice defects will occur. Conversely, if the thickness is made too low, the light confinement factor in the layering direction toward the well layers drops, resulting in higher oscillation threshold and operating carrier density, which leads to an increase in leakage current during high-temperature operation. Therefore, in the present embodiment, the thickness of the well layers is, for example, at least 2 nm and at most 3.3 nm.

Additionally, if the In composition ratio of the well layers is set to 0.23 (23%) and the band-gap energy of the well layers is reduced, laser oscillation light in the 467 nm wavelength band can be obtained.

Second optical guide layer 14 and third optical guide layer 16 are layers which, by containing In, have higher refractive indices than first semiconductor layer 12, which is constituted by n-type AlGaN, and second semiconductor layer 19, which is constituted by a p-type AlGaN layer. This makes it possible to increase the effective refractive index for the optical field propagating through a waveguide corresponding to the ridge, and increase the effect of confining the optical field in the layering direction by first semiconductor layer 12 and second semiconductor layer 19. Waveguide loss in semiconductor light-emitting device 100 can therefore be reduced.

Here, when the In composition ratios of second optical guide layer 14 and third optical guide layer 16 are low, the effect of confining light in the layering direction to the well layers decreases, which increases the oscillation threshold and the operating carrier density. This results in an increase in leakage current during high-temperature operation. Conversely, if the In composition ratios of second optical guide layer 14 and third optical guide layer 16 are high, lattice defects are more likely to occur due to increased lattice irregularity with substrate 11. Therefore, in order to increase the light confinement factor in the layering direction (vertical direction) toward the well layers without causing lattice defects, in the present embodiment, the In composition ratios of second optical guide layer 14 and third optical guide layer 16 are, for example, at least 0.03 (i.e., 3%) and at most 0.06 (i.e., 6%). In the present embodiment, the In composition ratio of second optical guide layer 14 and third optical guide layer 16 is set to 0.03 (i.e., 3%) to achieve both a suppression of lattice defects and an increase in the light confinement factor in the layering direction toward the well layer.

Additionally, first optical guide layer 13 is a GaN layer having a lattice constant of a magnitude between the respective lattice constants of first semiconductor layer 12 and second optical guide layer 14, and a forbidden band width energy of a magnitude between the respective forbidden band width energies of first semiconductor layer 12 and second optical guide layer 14. This suppresses spike-shaped deformation of the band structure caused by a polarization charge generated at the interface, compared to a case where second optical guide layer 14 is formed directly above first semiconductor layer 12, which is constituted by AlGaN. This makes it possible to facilitate the conduction of electrons to active layer 15.

Additionally, intermediate layer 17 is a GaN layer having a lattice constant of a magnitude between the respective lattice constants of electron barrier layer 18 and third optical guide layer 16, and a forbidden band width energy of a magnitude between the respective forbidden band width energies of electron barrier layer 18 and third optical guide layer 16.

Additionally, if second optical guide layer 14, active layer 15, and third optical guide layer 16, which contain In and have compressive lattice strain, are layered in that order, and electron barrier layer 18, which is constituted by an AlGaN layer having tensile lattice strain, is layered directly thereabove, stress arising at the interface will increase, and crystal defects may occur. Using 3 nm-thick GaN as intermediate layer 17 makes it possible to alleviate stress at the interface.

If intermediate layer 17 becomes too thick, second semiconductor layer 19, which has a low refractive index, will move away from active layer 15, which weakens the effect of confining light in the layering direction to active layer 15. Accordingly, intermediate layer 17 is made as thin as possible, at most 10 nm. In the semiconductor light-emitting device according to the present embodiment, intermediate layer 17 is 3 nm thick.

In semiconductor light-emitting device 100 according to the present embodiment, dielectric current blocking layer 30 constituted by $SiO_2$ and having a thickness of 0.1 µm is formed on the ridge-side surface. In this structure, current blocking layer 30 ensures that current injected from contact layer 20 flows only to the ridge area. Accordingly, the injection of current is focused on the region of active layer 15 located below a bottom part of the ridge. As a result, a population inversion state necessary for laser oscillation can be achieved with a relatively low injection current of about one hundred mA. Light generated by recombination of carriers constituted by electrons and holes injected into active layer 15 is confined by second optical guide layer 14, third optical guide layer 16, first semiconductor layer 12, and second semiconductor layer 19 in the layering direction of active layer 15. On the other hand, in the direction parallel to active layer 15 (the direction perpendicular to the layering direction; also called the "horizontal direction" hereinafter), current blocking layer 30 has a lower refractive index than first semiconductor layer 12 and second semiconductor layer 19, which enables light confinement. In addition, current blocking layer 30 has low optical absorption with respect to laser oscillation light, and thus a low-loss waveguide can be realized. In addition, the optical field propagating through the waveguide can be largely spread on current blocking layer 30, so that $\Delta N$ (a difference in the effective refractive index in the layering direction inside and outside the ridge) of the order of $10^{-3}$, which is suitable for high-output operation, can be realized with precision. Furthermore, by adjusting distance dp between current blocking layer 30 and active layer 15, the magnitude of $\Delta N$ can be precisely adjusted on the order of $10^{-3}$ as well. This makes it possible to achieve semiconductor light-emitting device 100 having low operating current while precisely adjusting the optical field. In the present embodiment, distance dp and the like are adjusted so that $\Delta N$ is $4.8 \times 10^{-3}$.

Electron barrier layer 18 is formed on intermediate layer 17 constituted by p-type GaN, and the magnitude of the forbidden band width energy of electron barrier layer 18 is greater than that of second semiconductor layer 19, which is constituted by p-type AlGaN. This makes it possible to increase the potential of the conduction band of electron barrier layer 18 and form an energy barrier. As a result, a phenomenon in which electrons injected into active layer 15 are thermally excited and leak into second semiconductor layer 19 (i.e., electron overflow) can be suppressed, which makes it possible to improve the high-temperature operation characteristics of semiconductor light-emitting device 100.

Here, the forbidden band width energy of a layer constituted by AlGaN increases in proportion to the Al composition ratio. Accordingly, in the present embodiment, the Al composition ratio of electron barrier layer 18 is higher than the Al composition ratio of second semiconductor layer 19 constituted by p-type AlGaN, e.g., at least 0.15 (i.e., 15%).

In the present embodiment, of the layers directly above third optical guide layer 16, which is constituted by InGaN, a region which does not contain Al is intermediate layer 17. Of the regions directly above intermediate layer 17 and containing Al, a region lower than second semiconductor layer 19 is electron barrier layer 18. In electron barrier layer 18, the Al composition ratio increases gradually from the bottom to the top, and has a maximum value of at least 15%. In electron barrier layer 18, the Al composition ratio decreases upward from the position having the maximum value, and matches the Al composition ratio of second semiconductor layer 19 at the second semiconductor layer 19-side interface. The Al composition ratio and the shape of an impurity concentration distribution in electron barrier layer 18 will be described in detail later.

1-2. Configuration of Electron Barrier Layer According to Comparative Example 1

Figure 2:
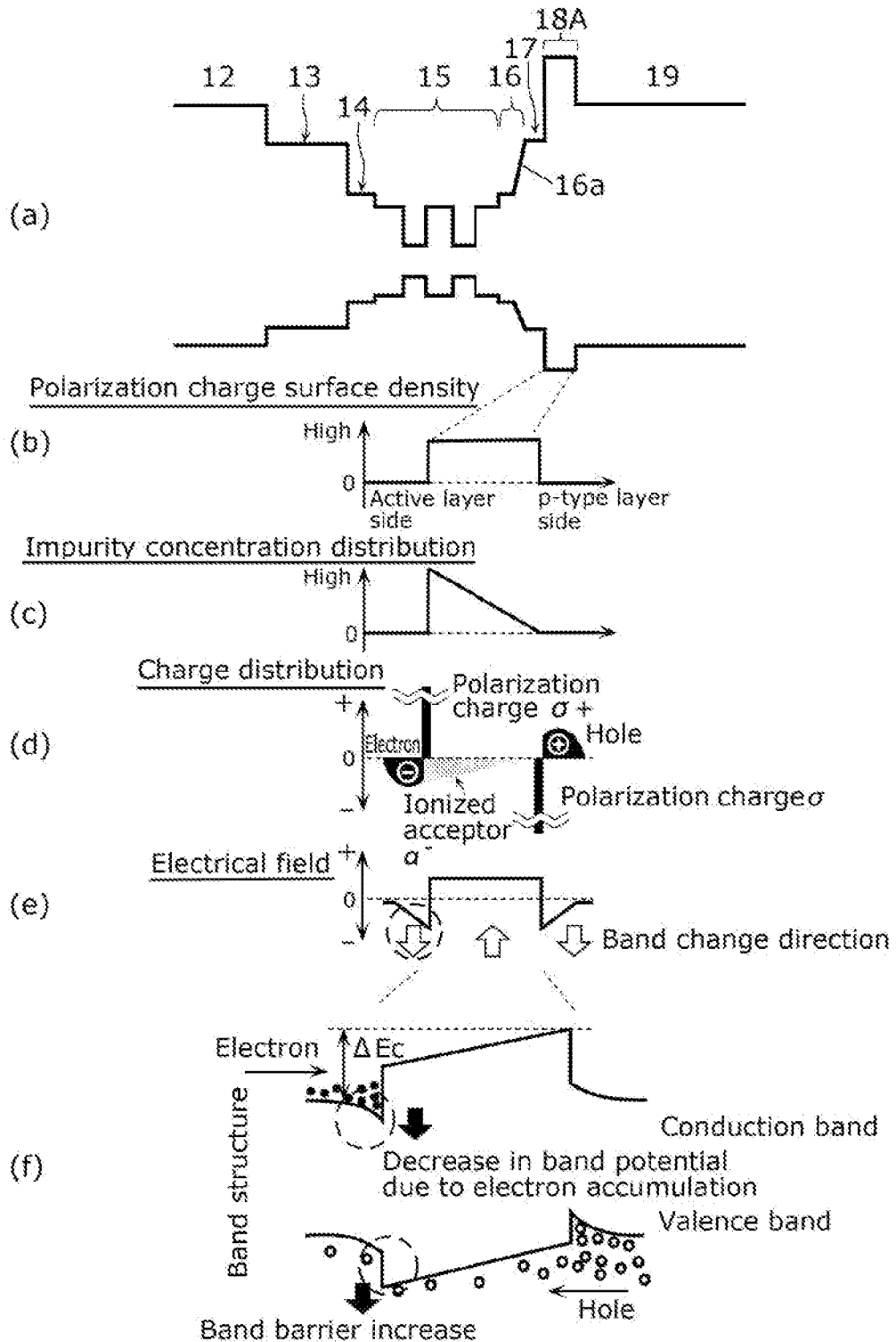
FIG. 2 is a schematic diagram illustrating the configuration of an electron barrier layer of a semiconductor light-emitting device according to Comparative Example 1.

Before describing the actions and effects of electron barrier layer 18 according to the present embodiment, the configuration of an electron barrier layer according to Comparative Example 1 will be described with reference to FIG. 2. FIG. 2 is a schematic diagram illustrating the configuration of electron barrier layer 18A of a semiconductor light-emitting device according to Comparative Example 1. Schematic diagrams (a), (b), (c), (d), (e) and (f) in FIG. 2 indicate a band-gap energy distribution of the semiconductor light-emitting device, as well as a polarization charge surface density distribution, an impurity concentration distribution, a charge distribution, an electrical field distribution, and a band structure of electron barrier layer 18A, according to Comparative Example 1, respectively.

The semiconductor light-emitting device according to Comparative Example 1 differs from semiconductor light-emitting device 100 according to the present embodiment in terms of the configuration of electron barrier layer 18A. Electron barrier layer 18A of the semiconductor light-emitting device according to Comparative Example 1 will be described next, focusing on the differences from electron barrier layer 18 according to the present embodiment. As indicated in schematic diagram (a) in FIG. 2, the semiconductor light-emitting device according to Comparative Example 1 has composition ratio gradient region 16a similar to that of semiconductor light-emitting device 100 according to the present embodiment.

In electron barrier layer 18A according to Comparative Example 1, a distribution of the Al composition ratio is uniform in the layering direction. As a result, the band-gap energy is constant in the layering direction of electron barrier layer 18A, as indicated by schematic diagram (a) in FIG. 2.

The polarization charge surface density in electron barrier layer 18A will be described next with reference to schematic diagram (b) in FIG. 2. The polarization charge surface density formed in a nitride semiconductors depends on the sum of a piezoelectric polarization component produced by strain in the constituent layers thereof and a spontaneous polarization component determined by the atomic composition. Accordingly, the surface density of a polarization charge arising in each layer consists of the sum of the piezoelectric polarization component produced by strain and the spontaneous polarization component. Both the magnitude of strain and the magnitude of spontaneous polarization in each layer are proportional to the atomic composition. As such, the surface density of the polarization charge formed in an AlGaN layer is proportional to the Al composition of the AlGaN layer. The polarization charge surface density formed in electron barrier layer 18A according to Comparative Example 1, in which the Al composition ratio is constant, is therefore constant as well.

As indicated in schematic diagram (c) in FIG. 2, the impurity (Mg) concentration distribution within electron barrier layer 18A decreases with distance from the active layer. Note that the total doping amount of impurities in electron barrier layer 18A is the same as the total doping amount of impurities in electron barrier layer 18 according to the present embodiment.

Additionally, the magnitude of a polarization charge volume density is proportional to a rate of change in the polarization charge surface density. Thus at the interface of electron barrier layer 18A, where the polarization charge surface density changes in a stepped shape as indicated in schematic diagram (b) in FIG. 2, the polarization charge volume density is distributed in the form of a $\Delta$ function, as indicated in schematic diagram (d) of FIG. 2. A positive polarization charge ($\sigma+$) is formed at the active layer 15-side interface of electron barrier layer 18A, and a negative polarization charge ($\sigma-$) is formed at the second semiconductor layer 19-side interface of electron barrier layer 18A. As a result, carriers of opposite polarities are induced in both interfaces to satisfy the electrical neutrality condition. In other words, electrons are induced in the active layer 15-side interface of electron barrier layer 18A, and holes are induced in the second semiconductor layer 19-side interface of electron barrier layer 18A.

Additionally, electron barrier layer 18A is doped with an impurity (Mg) that serves as an acceptor. As such, when the impurity is activated and functions as an acceptor, ionized acceptors having negative charges are formed. The concentration of the ionized acceptors which are formed depends on the concentration of the impurity used for the doping.

In an AlGaN layer, the activation rate of Mg decreases as the Al composition ratio increases. The activation rate of acceptors also decreases as the band potential increases. With electron barrier layer 18A according to Comparative Example 1, the band of electron barrier layer 18A changes such that the second semiconductor layer 19-side potential increases due to the influence of piezoelectric polarization. At this time, an energy difference (Efa–Ev) between the band potential of a valence band (Ev) and the Fermi potential of holes (Efa) on the second semiconductor layer 19-side of electron barrier layer 18A drops, and thus the activation rate of p-type layer-side impurities in electron barrier layer 18A drops. Accordingly, regardless of whether a maximum impurity concentration position is closer to the active layer 15-side interface than the second semiconductor layer 19-side interface, a maximum impurity concentration position is closer to the second semiconductor layer 19-side interface than the active layer 15-side interface, or the impurity concentration distribution is uniform, the concentration of ionized acceptors in electron barrier layer 18A, on the side closer to second semiconductor layer 19 of electron barrier layer 18A, decreases.

Based on this, the charge distribution near electron barrier layer 18A, i.e., the distributions of the piezoelectric polarization charge, carriers, and ionized acceptors, becomes as indicated in schematic diagram (d) in FIG. 2.

The polarization charge density at the active layer 15-side interface of electron barrier layer 18A according to Comparative Example 1 is extremely high, and thus the concentration of electrons electrically induced in the active layer 15-side interface of electron barrier layer 18A increases. When there is a high electron concentration in this region, an electrical field is formed in the layered structure in a direction in which the band potential decreases, as indicated in schematic diagram (e) in FIG. 2. As a result, the potential of the valence band of electron barrier layer 18A drops, and a potential barrier of electron barrier layer 18A with respect to holes increases. At the same time, the potential of the conduction band of electron barrier layer 18A also decreases, and thus the potential barrier of electron barrier layer 18A with respect to the electrons injected into active layer 15 shrinks. This makes it easier for the electrons injected into active layer 15 to leak beyond electron barrier layer 18A and into second semiconductor layer 19.

Schematic diagram (f) in FIG. 2 indicates a change in the band potential near electron barrier layer 18A when, using electron barrier layer 18A of FIG. 2, the maximum impurity concentration distribution position in electron barrier layer 18A is taken as the interface with active layer 15.

In this manner, a large amount of electrons accumulate at the active layer 15-side interface of electron barrier layer 18A and the band potential drops significantly, and thus the potential barrier ($\Delta Ec$) with respect to electrons shrinks and the potential barrier with respect to holes grows, which results in a decrease in temperature characteristics and an increase in operating voltage.

Based on the above, with electron barrier layer 18A according to Comparative Example 1, in which the Al composition ratio is constant, the piezoelectric polarization charge density at the active layer 15-side interface of electron barrier layer 18A will be extremely high even if the maximum impurity concentration position in electron barrier layer 18A is set to the interface with active layer 15. As such, the influence on the ionized acceptor distribution within electron barrier layer 18A is low, and the effects with respect to the increase in operating voltage and the decrease in temperature characteristics due to the piezoelectric polarization of electron barrier layer 18A are small. In the following descriptions, an electron barrier layer having a constant Al composition ratio and an impurity concentration distribution independent of the maximum impurity concentration position will be referred to as "Comparative Example 1".

1-3. Configuration of Electron Barrier Layer According to Embodiment 1

Figure 3:
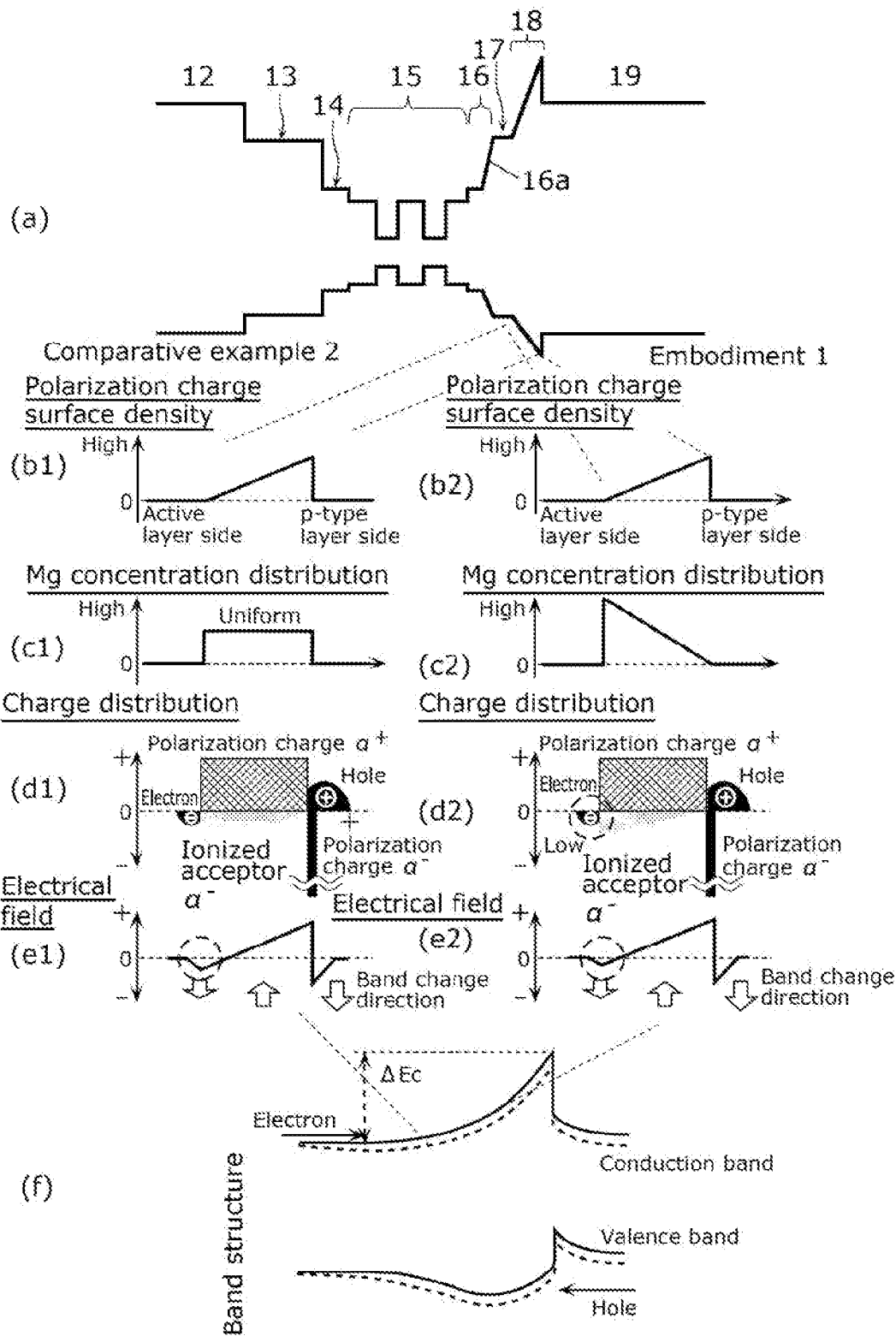
FIG. 3 is a schematic diagram illustrating the configuration of an electron barrier layer of a semiconductor light-emitting device according to Embodiment 1 and Comparative Example 2.

Next, the configuration of electron barrier layer 18 according to the present embodiment will be described with reference to FIG. 3. FIG. 3 is a schematic diagram illustrating the configuration of electron barrier layer 18 of semiconductor light-emitting device 100 according to the present embodiment. Schematic diagrams (a), (b2), (c2), (d2), (e2) and (f) in FIG. 3 indicate a band-gap energy distribution of semiconductor light-emitting device 100, as well as a polarization charge surface density distribution, an impurity concentration distribution, a charge distribution, an electrical field distribution, and a band structure of electron barrier layer 18, according to the present embodiment, respectively. Note that the configuration of an electron barrier layer according to Comparative Example 2 is also illustrated in FIG. 3. Schematic diagrams (b1), (c1), (d1), and (e1) in FIG. 3 indicate a polarization charge surface density distribution, an impurity concentration distribution, a charge distribution, and an electrical field distribution of the electron barrier layer according to Comparative Example 2, respectively. Additionally, schematic diagram (f) in FIG. 3 indicates band structures according to the present embodiment and Comparative Example 2 with a solid line and a broken line, respectively.

Electron barrier layer 18 according to the present embodiment has an increasing Al composition ratio region in which the Al composition ratio increases monotonically with proximity to second semiconductor layer 19. Here, the configuration in which the Al composition ratio increases monotonically includes a configuration in which there is a region where the Al composition ratio is constant in the layering direction. A configuration in which, for example, the Al composition ratio increases in steps is also included. In electron barrier layer 18 according to the present embodiment, electron barrier layer 18 as a whole is the increasing Al composition ratio region, and the Al composition ratio increases at a constant rate of change in the layering direction. The electron barrier layer according to Comparative Example 2 and electron barrier layer 18 according to the present embodiment have the same Al composition ratio distribution.

The maximum impurity concentration position of an impurity of the second conductivity type in electron barrier layer 18 is located between an interface on the active layer 15 side of electron barrier layer 18 and an intermediate position between a position of electron barrier layer 18 where the Al composition ratio is maximum in the increasing Al composition ratio region and the active layer 15-side interface of electron barrier layer 18. In the present embodiment, the position of electron barrier layer 18 where the Al composition ratio is maximum is the second semiconductor layer 19-side interface of electron barrier layer 18, and as indicated in schematic diagram (c2) in FIG. 3, the maximum impurity concentration position of the impurity of the second conductivity type in electron barrier layer 18 is the active layer 15-side interface of electron barrier layer 18. In electron barrier layer 18, the impurity concentration decreases monotonically with proximity to second semiconductor layer 19. Here, the configuration in which the impurity concentration decreases monotonically includes a configuration in which there is a region where the impurity concentration is constant in the layering direction. A configuration in which, for example, the impurity concentration decreases in steps is also included. In electron barrier layer 18 according to the present embodiment, the impurity concentration decreases at a constant rate of change in the layering direction.

On the other hand, in the electron barrier layer according to Comparative Example 2, the concentration of the impurity (Mg) is uniform in the layering direction, as indicated in schematic diagram (c1) in FIG. 3. Note that the total doping amount of impurities of the second conductivity type in the electron barrier layer according to Comparative Example 2 is the same as the total doping amount of impurities of the second conductivity type in electron barrier layer 18 according to the present embodiment. In the following descriptions, an electron barrier layer having an increasing Al composition ratio region and a constant impurity concentration distribution will be referred to as "Comparative Example 2".

The polarization charge surface density formed in electron barrier layer 18 according to the present embodiment increases as the Al composition ratio increases, as indicated in schematic diagram (b2) in FIG. 3.

The magnitude of the polarization charge volume density is proportional to the rate of change in the polarization charge surface density, and thus the polarization charge volume density which is formed is constant within electron barrier layer 18, as indicated in schematic diagrams (d1) and (d2) in FIG. 3.

Additionally, electron barrier layer 18 is doped with an impurity (Mg) that serves as an acceptor. As such, when the impurity is activated and functions as an acceptor, ionized acceptors having negative charges are formed. The concentration of the ionized acceptors which are formed depends on the concentration of the impurity used for the doping.

In an AlGaN layer, the activation rate of Mg decreases as the Al composition ratio increases. Additionally, the band of electron barrier layer 18 changes such that the potential on the side of second semiconductor layer 19, which is of the second conductivity type, increases due to the influence of piezoelectric polarization. At this time, an energy difference (Efa–Ev) between the band potential of a valence band (Ev) and the Fermi potential of holes (Efa) on the second semiconductor layer 19-side of electron barrier layer 18 drops, and thus the activation rate of the second semiconductor layer 19-side impurities within electron barrier layer 18 drops. Accordingly, regardless of whether a maximum impurity concentration position is closer to the active layer 15-side interface than the second semiconductor layer 19-side interface of electron barrier layer 18, a maximum impurity concentration position is closer to the second semiconductor layer 19-side interface than the active layer 15-side interface, or the impurity concentration distribution is uniform, the concentration of ionized acceptors in electron barrier layer 18, on the side closer to second semiconductor layer 19 of electron barrier layer 18, decreases.

The distribution of charge (i.e., piezoelectric polarization charge (volume density), ionized acceptors, and carriers) near the electronic barrier layers in Comparative Example 2 and the present embodiment are indicated in schematic diagrams (d1) and (d2) in FIG. 3, respectively. The polarization charge volume density of the electron barrier layer in both Comparative Example 2 and the present embodiment is lower than in Comparative Example 1, which produces an effect of compensating a positive polarization charge with a negative charge caused by the ionized acceptors. In particular, the polarization charge compensation effect on the active layer 15 side of electron barrier layer 18 is highest when the impurity concentration in electron barrier layer 18 is increased on the active layer 15 side, as in electron barrier layer 18 according to the present embodiment. To be more specific, the polarization charge compensation effect is highest when the maximum impurity concentration position in electron barrier layer 18 is located between the interface on the active layer 15 side of electron barrier layer 18 and the intermediate position between the position of electron barrier layer 18 where the Al composition ratio is maximum in the increasing Al composition ratio region and the active layer 15-side interface of electron barrier layer 18. As a result, the electron concentration induced in the region near the active layer 15-side interface is lower in electron barrier layer 18 according to the present embodiment than in the electron barrier layer according to Comparative Example 2, as indicated by schematic diagrams (e1) and (e2) in FIG. 3. Because the electron concentration in this region is low, an electrical field in the direction in which the band potential is reduced, which is formed in the layering direction, is also lower in electron barrier layer 18 according to the present embodiment than in the electron barrier layer according to Comparative Example 2, as indicated in schematic diagrams (e1) and (e2) in FIG. 3.

Accordingly, as indicated in schematic diagram (f) in FIG. 3, the amount of decrease in the potential of the valence band of electron barrier layer 18 according to the present embodiment is smaller than that of the electron barrier layer according to Comparative Example 2, and thus the potential barrier of electron barrier layer 18 with respect to holes shrinks. At the same time, the amount of decrease in the potential of the conduction band of electron barrier layer 18 shrinks as well, and thus the potential barrier with respect to electrons grows. This makes it possible to suppress leakage current, in which the electrons injected into active layer 15 to leak beyond electron barrier layer 18A and into second semiconductor layer 19.

In this manner, the amount of electrons accumulated at the active layer 15-side interface of electron barrier layer 18 according to the present embodiment is low and the drop in the band potential is also low, and thus the potential barrier ($\Delta Ec$) with respect to electrons grows. In addition, the potential barrier with respect to holes shrinks. As such, with semiconductor light-emitting device 100 according to the present embodiment, the temperature characteristics can be improved and the operating voltage can be reduced. Furthermore, if doping is performed such that the maximum impurity concentration position is located closer to active layer 15 in electron barrier layer 18, the amount of decrease in the band potential drops, which enhances the above-described effect.

As described above, if, in electron barrier layer 18 in which the Al composition ratio increases monotonically, the maximum position of the impurity concentration distribution in electron barrier layer 18 is located on the active layer 15 side, the piezoelectric polarization charge density formed within electron barrier layer 18 can be reduced. As such, the piezoelectric polarization charge which is a positive charge can be compensated by the negatively-charged ionized acceptors in electron barrier layer 18. As a result, the concentration of electrons induced in the active layer 15-side interface of electron barrier layer 18 decreases, which makes it possible to reduce the operating voltage and improve the temperature characteristics.

Here, if the total amount of impurities with which electron barrier layer 18 is doped is the same as the total doping amount of the electron barrier layer in a case where the electron barrier layer described in Comparative Example 2 is uniformly doped with impurities, and the maximum position of the impurity concentration distribution in electron barrier layer 18 is located on the active layer 15 side, the operating voltage can be reduced and the temperature characteristics can be improved without increasing free carrier loss due to the impurity doping.

Furthermore, if the total amount of impurities with which electron barrier layer 18 is doped is less than the total doping amount of the electron barrier layer in a case where the electron barrier layer described in Comparative Example 2 is uniformly doped with impurities, and the maximum impurity concentration position in electron barrier layer 18 is located on the active layer 15 side, the operating voltage can be reduced and the temperature characteristics can be improved while reducing free carrier loss due to the impurity doping.

If, using electron barrier layer 18 according to the present embodiment, the maximum impurity concentration position within electron barrier layer 18 is located on the active layer 15 side, a drop in the valence band potential is suppressed, and the conduction band potential is increased, as indicated in schematic diagram (f) in FIG. 3. This makes it possible to reduce the potential barrier with respect to holes and increase the potential barrier with respect to electron leakage, which in turn makes it possible to reduce the operating voltage and improve the temperature characteristics.

When electron barrier layer 18 is formed with an AlGaN layer, and an average strain of the lattice in the direction parallel to the main surface of substrate 11 that occurs in electron barrier layer 18 due to lattice irregularity with substrate 11 is a tensile strain, the piezoelectric polarization component produced by the strain in electron barrier layer 18 and the spontaneous polarization component determined by the atomic composition of electron barrier layer 18 constituted by an AlGaN layer strengthen each other due to the directions of the electrical field of polarization being the same. This increases the influence of the piezoelectric effect. Furthermore, if the average strain occurring in electron barrier layer 18 is tensile, the piezoelectric polarization component produced by lattice irregularity arising throughout electron barrier layer 18 as a whole and the spontaneous polarization component of electron barrier layer 18 determined by the atomic composition will strengthen each other, which increases the influence of the piezoelectric effect.

In contrast, the above-described structure of electron barrier layer 18 in which the Al composition ratio increases monotonically, locating the maximum position of the impurity concentration distribution toward active layer 15, and the like are effective in suppressing the influence of the piezoelectric effect, which reduces the operating voltage and improves the temperature characteristics.

The above effects can also be achieved by using an $In_xGa_yAl_{1-x-y}N$ substrate ($0 \leq x < 1$, $0 < y \leq 1$, $0 \leq 1-x-y \leq 1$) as substrate 11, instead of a GaN substrate or an AlGaN substrate having a lattice constant higher than the average lattice constant of the electron barrier layer.

Embodiment 2

A semiconductor light-emitting device according to Embodiment 2 will be described next. The semiconductor light-emitting device according to the present embodiment differs from semiconductor light-emitting device 100 according to Embodiment 1 in terms of the distribution of the Al composition ratio in the electron barrier layer. The electron barrier layer of the semiconductor light-emitting device according to the present embodiment will be described hereinafter with reference to FIG. 4.

2-1. Configuration of Electron Barrier Layer

Figure 4:
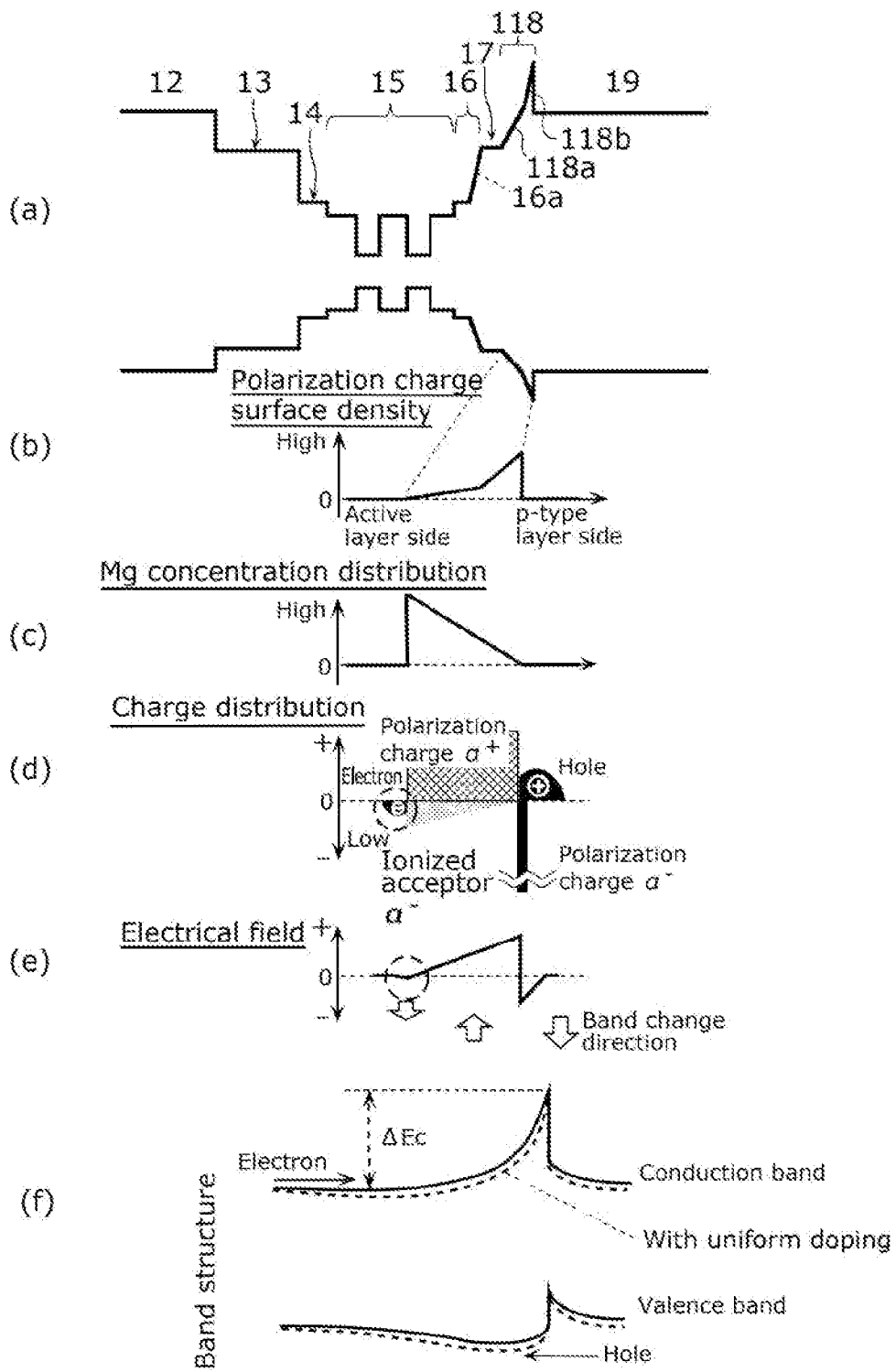
FIG. 4 is a schematic diagram illustrating the configuration of an electron barrier layer of a semiconductor light-emitting device according to Embodiment 2.

FIG. 4 is a schematic diagram illustrating the configuration of electron barrier layer 118 of the semiconductor light-emitting device according to the present embodiment. Schematic diagrams (a), (b), (c), (d), (e) and (f) in FIG. 4 indicate a band-gap energy distribution of the semiconductor light-emitting device, as well as a polarization charge surface density distribution, an impurity concentration distribution, a charge distribution, an electrical field distribution, and a band structure of electron barrier layer 118, according to the present embodiment, respectively.

Like electron barrier layer 18 according to Embodiment 1, electron barrier layer 118 according to the present embodiment has an increasing Al composition ratio region in which the Al composition ratio increases monotonically with proximity to second semiconductor layer 19. Additionally, the maximum impurity concentration position of an impurity of the second conductivity type in electron barrier layer 118 is located between an interface on the active layer 15 side of electron barrier layer 118 and an intermediate position between a position of electron barrier layer 118 where the Al composition ratio is maximum in the increasing Al composition ratio region and the active layer 15-side interface of electron barrier layer 118. As indicated in schematic diagram (c) in FIG. 4, in the present embodiment, the position of electron barrier layer 118 where the Al composition ratio is maximum is the second semiconductor layer 19-side interface of electron barrier layer 118, and the maximum impurity concentration position of the impurity of the second conductivity type in electron barrier layer 118 is the active layer 15-side interface of electron barrier layer 118. In electron barrier layer 118, the impurity concentration decreases monotonically with proximity to second semiconductor layer 19.

As indicated in schematic diagram (a) in FIG. 4, in the present embodiment, the increasing Al composition ratio region includes first region 118a, in which the Al composition ratio changes at a first rate of change, and second region 118b, which is disposed between first region 118a and second semiconductor layer 19 and in which the Al composition ratio changes at a second rate of change, the second rate of change being greater than the first rate of change. In other words, the rate of change of the Al composition ratio in the layering direction changes from a small value to a large value with proximity to second semiconductor layer 19. Although the first rate of change and the second rate of change are constant in first region 118a and second region 118b, respectively, in the present embodiment, these rates of change need not be constant.

The polarization charge surface density formed in electron barrier layer 118 increases as the Al composition ratio increases, as indicated in schematic diagram (b) in FIG. 4. The magnitude of the polarization charge volume density is proportional to the rate of change in the polarization charge surface density, and thus the amount of the polarization charge volume density which is formed is higher in second region 118b than in first region 118a, as indicated in schematic diagram (d) in FIG. 4. Additionally, in the present embodiment, the polarization charge volume density is constant in each of first region 118a and second region 118b.

Additionally, as indicated in schematic diagram (c) in FIG. 4, electron barrier layer 118 according to the present embodiment is doped with impurities at the same concentration distribution as electron barrier layer 18 according to Embodiment 1. Ionized acceptors are therefore formed in electron barrier layer 118, in the same manner as with electron barrier layer 18 according to Embodiment 1.

The distribution of the charge near electron barrier layer 118 (the piezoelectric polarization charge (volume density), ionized acceptors, and carriers) becomes as indicated in schematic diagram (d) in FIG. 4. As indicated in schematic diagram (d) in FIG. 4, the polarization charge volume density on the active layer 15-side of electron barrier layer 118 is even lower than in electron barrier layer 18 according to Embodiment 1. This increases the effect of compensating the polarization charge which is a positive charge on the side of active layer 15, which has a negative charge caused by the ionized acceptors.

When the impurity concentration is increased on the active layer 15-side of electron barrier layer 118, the polarization charge compensation effect on the active layer 15 side is the highest. As a result, the concentration of electrons induced in a region near the active layer 15-side interface of electron barrier layer 118 is lower than in electron barrier layer 18 according to Embodiment 1. The electron concentration in this region is low, and thus an electrical field in the direction in which the band potential is reduced, which is formed in the layering direction, shrinks even more.

As a result, the amount of decrease in the valence band potential of electron barrier layer 118 decreases even more than in electron barrier layer 18 according to Embodiment 1, and the potential barrier of electron barrier layer 118 with respect to holes also shrinks.

At the same time, the amount of decrease in the potential of the conduction band of electron barrier layer 118 shrinks even more as well, and thus the potential barrier with respect to electrons grows even more. This makes it possible to further suppress leakage current, in which the electrons injected into active layer 15 to leak beyond electron barrier layer 118 and into second semiconductor layer 19.

Schematic diagram (f) in FIG. 4 indicates a change in the band potential near electron barrier layer 118 when, using electron barrier layer 118 according to the present embodiment, the maximum impurity concentration position in electron barrier layer 118 is located toward active layer 15. Note that for the purpose of comparison, in schematic diagram (f) in FIG. 4, the broken line indicates a band structure for a case where the total doping amount of impurities in the electron barrier layer is the same as in electron barrier layer 118 according to the present embodiment and the impurities are distributed uniformly throughout the electron barrier layer.

As indicated in schematic diagram (f) in FIG. 4, the amount of electrons accumulated on the active layer 15-side interface of electron barrier layer 118 is even lower than in electron barrier layer 18 according to Embodiment 1, and the drop in the band potential is even lower as well. This further increases the potential barrier ($\Delta Ec$) with respect to electrons and further reduces the potential barrier with respect to holes, which makes it possible to further improve the temperature characteristics and reduce the operating voltage.

Furthermore, if doping is performed such that the maximum impurity concentration position is located closer to active layer 15 in electron barrier layer 118, the amount of decrease in the band potential drops, which enhances the above-described effect.

Based on the foregoing, with electron barrier layer 118, in which the rate of change of the Al composition ratio changes from a small value to a large value with proximity to second semiconductor layer 19, if the maximum impurity concentration position in electron barrier layer 118 is located toward active layer 15, the piezoelectric polarization charge density near the active layer 15-side interface formed in electron barrier layer 118 can be reduced. As such, the ionized acceptors in electron barrier layer 118 increase the effect of compensating the piezoelectric polarization charge, which is a positive charge distributed near the active layer 15-side interface, with ionized acceptors having a negative charge. As a result, the concentration of electrons induced in the region near the active layer 15-side interface of electron barrier layer 118 decreases further, which makes it possible to further reduce the operating voltage and improve the temperature characteristics.

2-2. Simulation Results

Results of simulations of the semiconductor light-emitting devices according to Embodiments 1 and 2 will be described next.

2-2-1. Band Structure and Charge Distribution of Comparative Example

Figure 5:
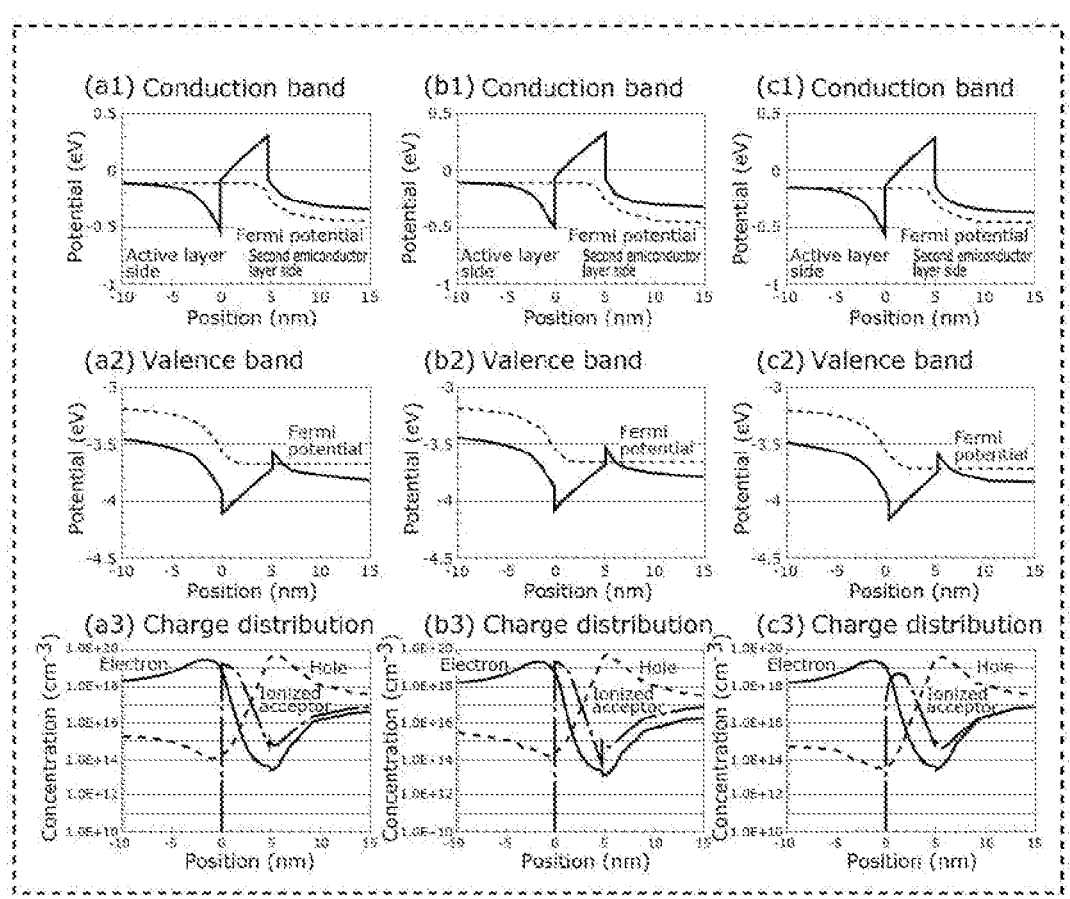
FIG. 5 is a diagram illustrating simulation results of a band structure and a charge distribution in an electron barrier layer according to a comparative example.

First, simulation results of a band structure and a charge distribution in an electron barrier layer according to a comparative example will be described with reference to FIG. 5. FIG. 5 is a diagram illustrating simulation results of a band structure and a charge distribution in an electron barrier layer according to a comparative example. FIG. 5 illustrates simulation results for a case where the Al composition ratio is distributed uniformly in the layering direction in the same electron barrier layer as that indicated in schematic diagram (a) in FIG. 2. Graphs (a1), (a2), and (a3) in FIG. 5 indicate the conduction band potential distribution, valence band potential distribution, and charge distribution, respectively, when the electron barrier layer is uniformly doped with the impurity Mg at a concentration of $1.5 \times 10^{19}$ cm$^{-3}$. Graphs (b1), (b2), and (b3) in FIG. 5 indicate the conduction band potential distribution, the valence band potential distribution, and the charge distribution, respectively, when doping is performed such that the concentration of the impurity Mg in the electron barrier layer has a maximum value of $2.8 \times 10^{19}$ cm$^{-3}$ at the active layer 15-side interface, the concentration of the impurity Mg decreases monotonically from the active layer 15-side interface toward the second semiconductor layer 19-side interface, and the second semiconductor layer 19-side interface has the same concentration as the concentration of the impurity Mg in second semiconductor layer 19 (Comparative Example 1). In this case, the average concentration of the impurity Mg in the electron barrier layer is $1.5 \times 10^{19}$ cm$^{-3}$. Graphs (c1), (c2), and (c3) in FIG. 5 indicate the conduction band potential distribution, the valence band potential distribution, and the charge distribution, respectively, when doping is performed such that the concentration of the impurity Mg in the electron barrier layer increases linearly and monotonically from an undoped state, which is the concentration at the active layer 15-side interface, toward the second semiconductor layer 19-side interface, reaching a maximum value of $2.8 \times 10^{19}$ cm$^{-3}$ at the second semiconductor layer 19-side interface (Comparative Example 1). In this case, the average concentration of the impurity Mg in the electron barrier layer is $1.5 \times 10^{19}$ cm$^{-3}$. The horizontal axis in each graph represents the position in the layering direction, with the 0 nm position corresponding to the interface between the electron barrier layer and active layer 15, and the 5 nm position corresponding to the interface between the electron barrier layer and second semiconductor layer 19. The Fermi potential is also represented as a broken line in (a1), (a2), (b1), (b2), (c1) and (c2) in FIG. 5. The electron, hole, and ionized acceptor distributions are represented by a solid line, a broken line, and a dot-dash line, respectively, in (a3), (b3), and (c3) in FIG. 5.

As illustrated in FIG. 5, even if the shape of the impurity concentration distribution is changed, the electron concentration at the interface of the electron barrier layer is at least $1 \times 10^{19}$ cm$^{-3}$, and the band structure is almost the same. The piezoelectric polarization charge at the interface of the electron barrier layer is high, and thus the piezoelectric polarization charge compensation effect by the ionized acceptors is small.

2-2-2. Band Structure and Charge Distribution of Embodiment 1

Figure 6:
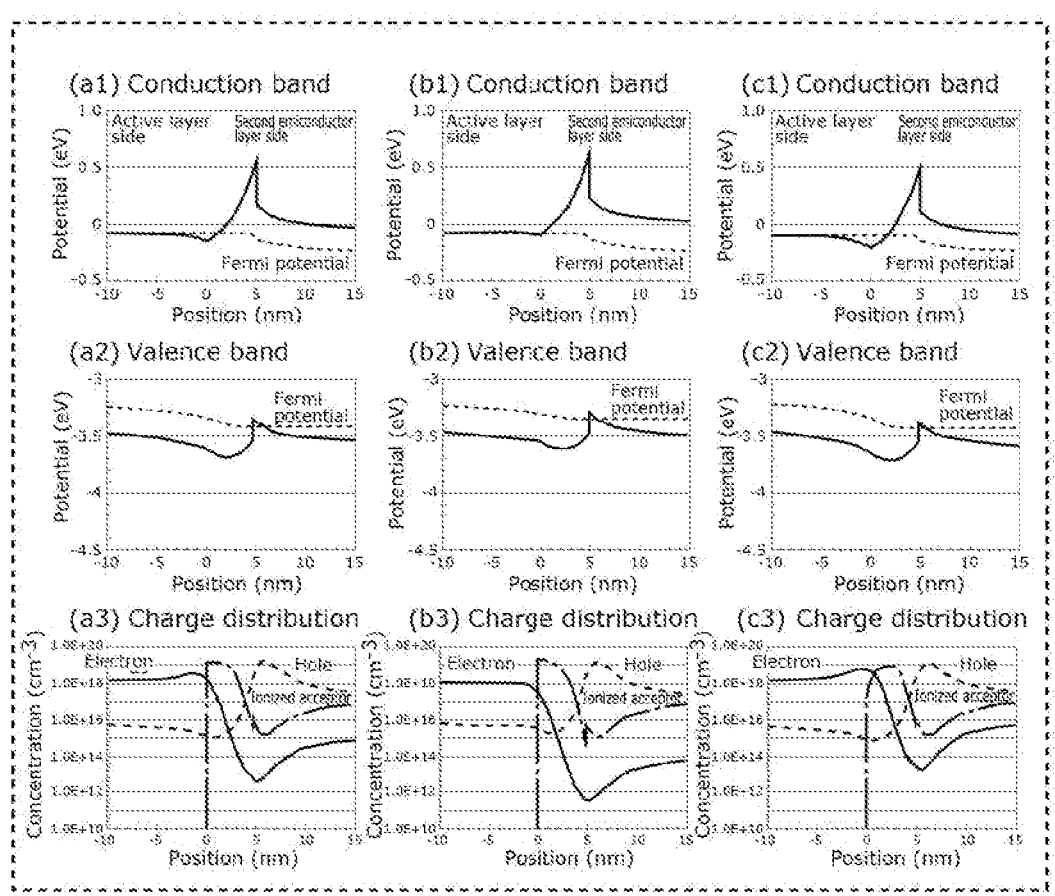
FIG. 6 is a diagram illustrating simulation results of a band structure and a charge distribution in an electron barrier layer according to Embodiment 1.

Next, simulation results of a band structure and a charge distribution in electron barrier layer 18 according to Embodiment 1 will be described with reference to FIG. 6. FIG. 6 is a diagram illustrating simulation results of a band structure and a charge distribution in electron barrier layer 18 according to Embodiment 1. FIG. 6 illustrates simulation results for a case where the Al composition ratio increases linearly with proximity to second semiconductor layer 19 in the electron barrier layer, in the same manner as schematic diagram (a) in FIG. 3. Graphs (a1), (a2), and (a3) in FIG. 6 indicate the conduction band potential distribution, valence band potential distribution, and charge distribution, respectively, when the electron barrier layer is uniformly doped with the impurity Mg at a concentration of $1.5 \times 10^{19}$ cm$^{-3}$. Graphs (b1), (b2), and (b3) in FIG. 6 are graphs indicating the simulation results for electron barrier layer 18 according to Embodiment 1. Graphs (b1), (b2), and (b3) in FIG. 6 indicate the conduction band potential distribution, the valence band potential distribution, and the charge distribution, respectively, when doping is performed such that the concentration of the impurity Mg in electron barrier layer 18 has a maximum value of $2.8 \times 10^{19}$ cm$^{-3}$ at the active layer 15-side interface, decreases linearly and monotonically from the active layer 15-side interface toward the second semiconductor layer 19-side interface, and the second semiconductor layer 19-side interface has the same concentration as the concentration of the impurity Mg in second semiconductor layer 19. In this case, the average concentration in the electron barrier layer is $1.5 \times 10^{19}$ cm$^{-3}$. Graphs (c1), (c2), and (c3) in FIG. 6 indicate the conduction band potential distribution, the valence band potential distribution, and the charge distribution, respectively, when doping is performed such that the concentration of the impurity Mg in the electron barrier layer increases linearly and monotonically from an undoped state, which is the concentration at the active layer 15-side interface, toward the second semiconductor layer 19-side interface, reaching a maximum value of $2.8 \times 10^{19}$ cm$^{-3}$ at the second semiconductor layer 19-side interface. In this case, the average concentration of the impurity Mg in the electron barrier layer is $1.5 \times 10^{19}$ cm$^{-3}$. The horizontal axis in each graph represents the position in the layering direction, with the 0 nm position corresponding to the interface between the electron barrier layer and active layer 15, and the 5 nm position corresponding to the interface between the electron barrier layer and second semiconductor layer 19. The Fermi potential is also represented as a broken line in (a1), (a2), (b1), (b2), (c1) and (c2) in FIG. 6. The electron, hole, and ionized acceptor distributions are represented by a solid line, a broken line, and a dot-dash line, respectively, in (a3), (b3), and (c3) in FIG. 6.

As indicated by graph (b3) in FIG. 6, when doping with impurities such that the concentration is maximum at the active layer 15-side interface of electron barrier layer 18, the electron concentration as the interface of electron barrier layer 18 drops to approximately $1 \times 10^{18}$ cm$^{-3}$, and the band structure change is smaller than that indicated in graphs (a3) and (c3) in FIG. 6.

Additionally, the piezoelectric polarization charge in electron barrier layer 18 can be compensated by the piezoelectric polarization charge produced by the ionized acceptors, which reduces the concentration of electrons induced near the active layer 15-side interface of electron barrier layer 18. This increases the potential barrier ($\Delta$Ec) with respect to electrons and reduces the potential barrier with respect to holes, which makes it possible to improve the temperature characteristics and reduce the operating voltage.

2-2-3. Operating Voltage (when Al Composition Ratio is Uniform in Layering Direction)

Simulation results pertaining to a relationship between the Al composition ratio distribution and impurity concentration distribution in the electron barrier layer, and the operating voltage of the semiconductor light-emitting device, will be described next with reference to FIGS. 7 to 17.

First, simulation results for a case where the Al composition ratio in the electron barrier layer is uniform in the layering direction will be described with reference to FIG. 7.

Figure 7:
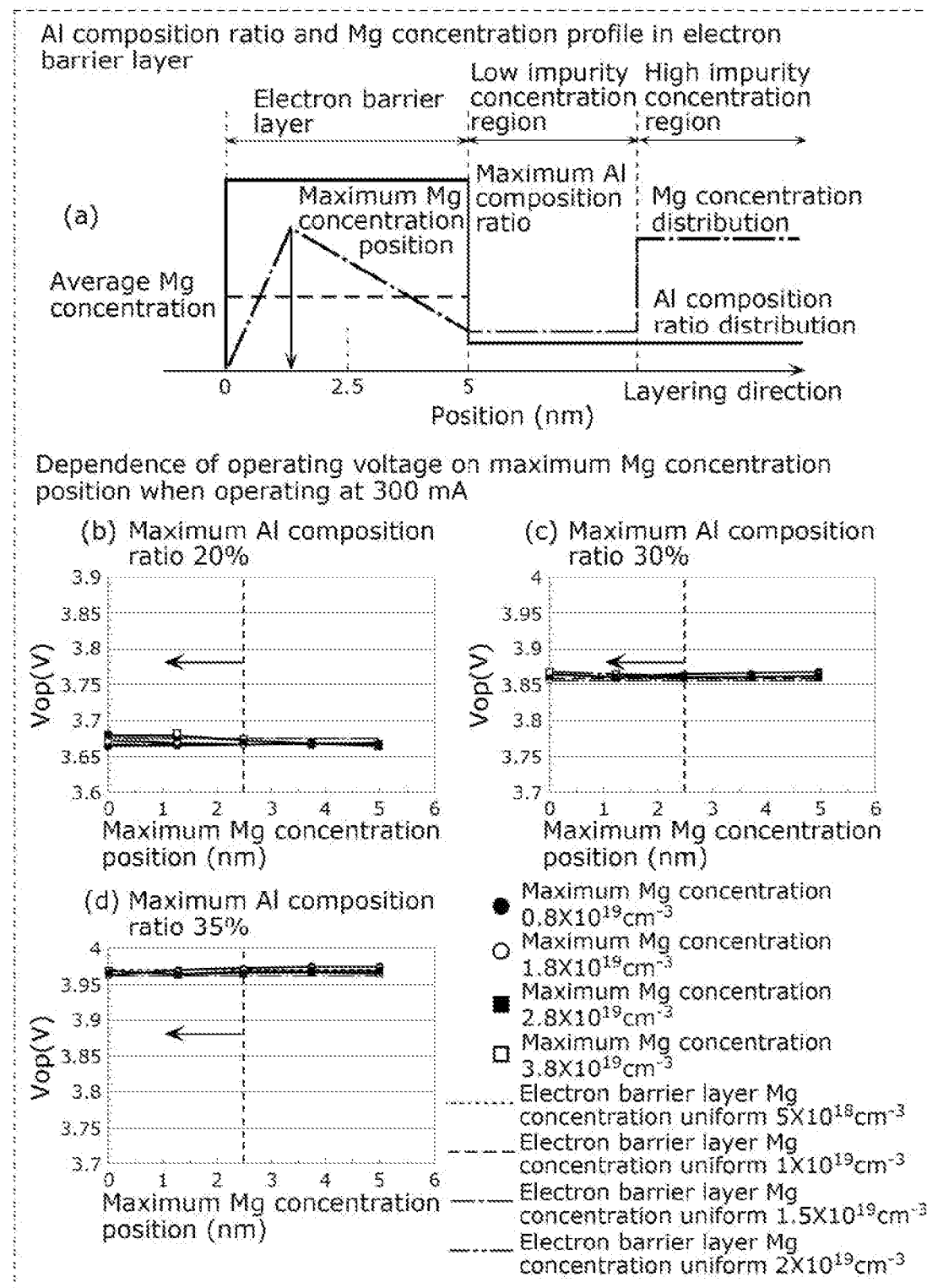
FIG. 7 is a diagram illustrating a relationship between an operating voltage and a maximum impurity concentration position when an Al composition ratio in the electron barrier layer according to the comparative example is uniform in the layering direction.

FIG. 7 is a diagram illustrating a relationship between the operating voltage and the maximum impurity concentration position when the Al composition ratio in the electron barrier layer according to a comparative example is uniform in the layering direction. Graph (a) in FIG. 7 is a graph indicating the Al composition ratio distribution and the impurity concentration distribution in the electron barrier layer and second semiconductor layer 19. The horizontal axis in graph (a) in FIG. 7 represents the position in the layering direction.

Graphs (b), (c), and (d) in FIG. 7 indicate a relationship between the operating voltage (Vop) and the maximum impurity concentration position (maximum Mg concentration position) during 300-mA operation of a semiconductor light-emitting device having maximum Al composition ratios of 20%, 30%, and 35% in the electron barrier layer, respectively. Graphs (b), (c) and (d) in FIG. 7 indicate simulation results when the maximum impurity concentration (maximum Mg concentration) is varied as a parameter. In these simulations, the maximum impurity concentration position is varied from the active layer 15-side interface to the second semiconductor layer 19-side interface. The impurity concentration is varied linearly.

The dotted line, the broken line, the dot-dash line, and the double dot-dash line in the graphs represent the simulation results when the electron barrier layer is doped uniformly with an impurity concentration (Mg concentration) of $5 \times 10^{18}$ cm$^{-3}$, $1 \times 10^{19}$ cm$^{-3}$, $1.5 \times 10^{19}$ cm$^{-3}$, and $2 \times 10^{19}$ cm$^{-3}$, respectively. The black circles, white circles, black squares, and white squares in each graph indicate the simulation results for cases where the doping is performed with a maximum impurity concentration of $0.8 \times 10^{19}$ cm$^{-3}$, $1.8 \times 10^{19}$ cm$^{-3}$, $2.8 \times 10^{19}$ cm$^{-3}$, and $3.8 \times 10^{19}$ cm$^{-3}$, respectively. Under these conditions, the average values of the impurity concentration in the electron barrier layer are $5 \times 10^{18}$ cm$^{-3}$, $1 \times 10^{19}$ cm$^{-3}$, $1.5 \times 10^{19}$ cm$^{-3}$, and $2 \times 10^{19}$ cm$^{-3}$, respectively, when the maximum impurity concentration position is at the active layer 15-side interface. The average values of the impurity concentration in the electron barrier layer are $4 \times 10^{18}$ cm$^{-3}$, $0.9 \times 10^{19}$ cm$^{-3}$, $1.4 \times 10^{19}$ cm$^{-3}$, and $1.9 \times 10^{19}$ cm$^{-3}$, respectively, when the maximum impurity concentration position is at the second semiconductor layer 19-side interface. Note that simulation results for a case where Mg is used as the impurity of the second conductivity type are indicated in FIG. 7, and in FIGS. 8 to 17 described later. The conditions for the impurity concentration in graphs (b) to (d) in FIGS. 8 to 13, FIGS. 16 and 17, and FIGS. 14 and 15, described later, are the same as the conditions for the impurity concentration in graphs (b) to (d) in FIG. 7.

In this simulation, the concentration of the impurity of the second conductivity type in the electron barrier layer decreases monotonically from the maximum impurity concentration position toward the second semiconductor layer, as indicated in graph (a) in FIG. 7. Additionally, second semiconductor layer 19 has a low impurity concentration region and a high impurity concentration region, the low impurity concentration region being adjacent to the electron barrier layer, and the high impurity concentration region being located between the low impurity concentration region and an interface of second semiconductor layer 19 on a side farther from the electron barrier layer and having a concentration of the impurity of the second conductivity type that is higher than that in the low impurity concentration region. Note that the Al composition ratio in the second semiconductor layer is constant and lower than the Al composition ratio in the electron barrier layer. In this simulation, the low impurity concentration region has a thickness of 170 nm and an impurity concentration of $2 \times 10^{18}$ cm$^{-3}$.

In the simulations indicated in FIGS. 7 to 17, the peak impurity concentration is higher than that when doping with the impurity uniformly, but the total doping amount of the impurity in the electron barrier layer can be made less than the total doping amount of the impurity in the electron barrier layer when doping with the impurity uniformly. Therefore, under the respective simulation conditions indicated in FIGS. 7 to 17, the increase in free carrier loss due to impurity doping can be suppressed as compared to the case of uniform doping.

With the structure of the electron barrier layer according to the comparative example, as indicated in graph (a) in FIG. 7, when the Al composition ratio of the electron barrier layer is constant in the layering direction, the operating voltage during 300-mA operations undergoes almost no change even if the maximum impurity concentration is changed, regardless of whether the Al composition ratio of the electron barrier layer is 20%, 30%, or 35%. Changing the maximum impurity concentration position also has no effect on lowering the operating voltage. This is because, as described above, with electron barrier layer 18 in which the Al composition ratio is constant, the piezoelectric polarization charge density at the active layer 15-side interface of electron barrier layer 18 will be extremely high even if the maximum impurity concentration position in electron barrier layer 18 is set to the interface with active layer 15. As such, the influence on the ionized acceptor distribution within electron barrier layer 18 is low, and the effects with respect to the increase in operating voltage and suppressing a decrease in temperature characteristics due to the piezoelectric polarization of electron barrier layer 18 are small.

2-2-4. Operating Voltage (when Al Composition Ratio Increases Monotonically)

Figure 8:
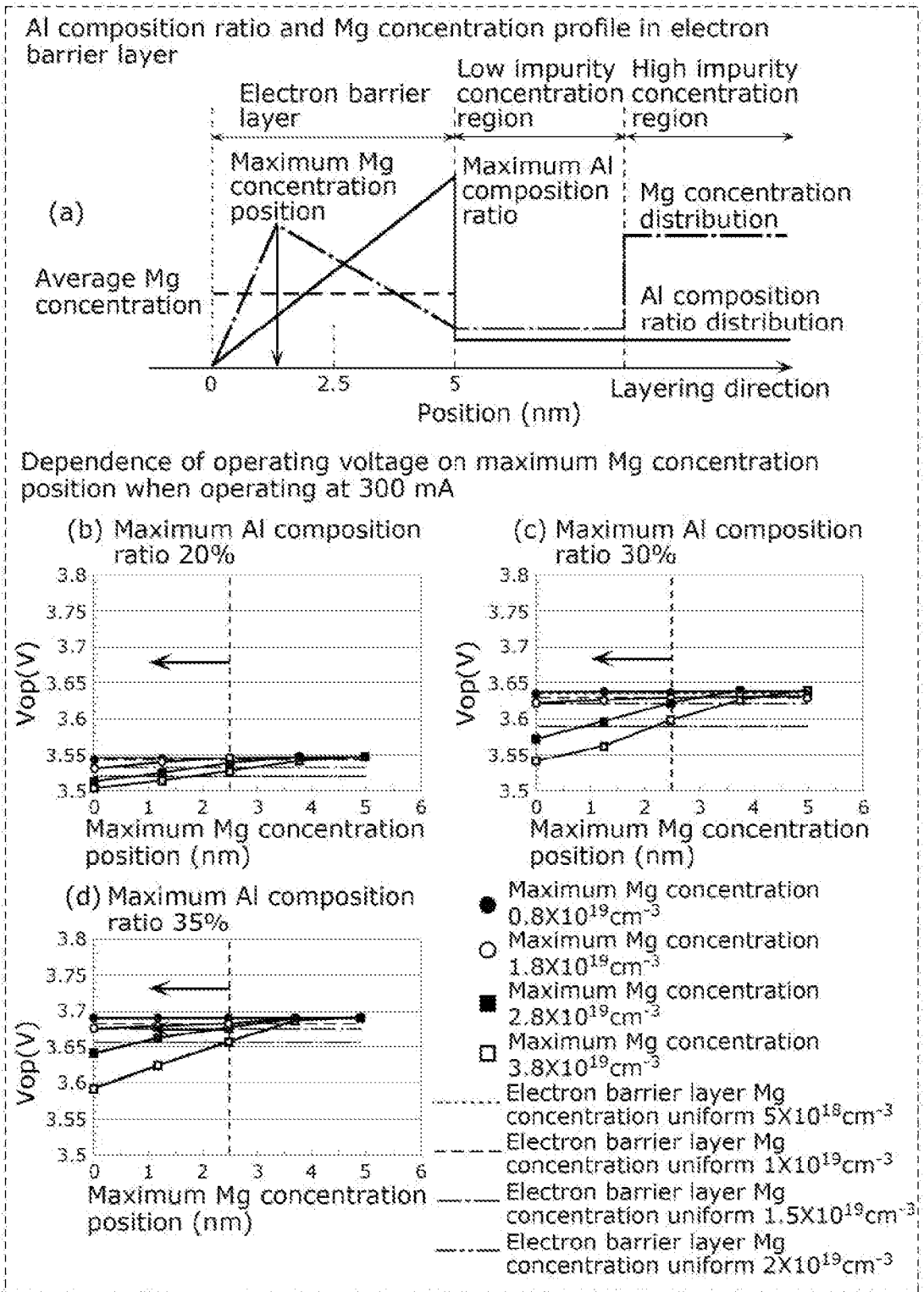
FIG. 8 is a diagram illustrating a relationship between the operating voltage and the maximum impurity concentration position when the Al composition ratio in the electron barrier layer increases monotonically with proximity to a second semiconductor layer in the layering direction.

Next, simulation results for a case where the Al composition ratio in the electron barrier layer increases monotonically with proximity to second semiconductor layer 19 in the layering direction, as in Embodiment 1, will be described with reference to FIG. 8. FIG. 8 is a diagram illustrating a relationship between the operating voltage and the maximum impurity concentration position when the Al composition ratio in the electron barrier layer increases monotonically with proximity to second semiconductor layer 19 in the layering direction. Like graph (a) in FIG. 7, graph (a) in FIG. 8 is a graph indicating the Al composition ratio distribution and the impurity concentration distribution in the electron barrier layer and second semiconductor layer 19. Also, like graphs (b), (c), and (d) in FIG. 7, graphs (b), (c), and (d) in FIG. 8 indicate a relationship between the operating voltage and the maximum impurity concentration position during 300-mA operation of a semiconductor light-emitting device having maximum Al composition ratios of 20%, 30%, and 35% in the electron barrier layer, respectively. The configuration of second semiconductor layer 19 is the same as the configuration used in the simulations indicated in FIG. 7.

As indicated in graphs (b) to (d) in FIG. 8, when the maximum impurity concentration position is located between the interface on the active layer 15 side of the electron barrier layer and an intermediate position in the layering direction of the increasing Al composition ratio region in the electron barrier layer, the operating voltage is reduced as compared to a case of uniform impurity doping (Comparative Example 2). As a result, the operating voltage can be lowered without increasing the total doping amount of impurities, as compared to a case of uniform impurity doping. An increase in the waveguide loss can be suppressed as well.

The effect of lowering the operating voltage is greater when the maximum impurity concentration position is as close as possible to the active layer 15-side interface, and can be further increased if the distance from the active layer 15-side interface side is within 25% of film thickness of the increasing Al composition ratio region.

When the Al composition ratio is at least 20% and at most 35%, the effect of lowering the operating voltage occurs when the maximum impurity concentration is at least $1.8 \times 10^{19}$ cm$^{-3}$, and thus the operating voltage can be lowered without increasing the waveguide loss by using a maximum impurity concentration of $2 \times 10^{19}$ cm$^{-3}$.

The maximum impurity concentration may be at least $2.5 \times 10^{19}$ cm$^{-3}$. This makes it possible to further increase the effect of lowering the operating voltage while suppressing an increase in waveguide loss.

2-2-5. Operating Voltage (when Thickness of Electron Barrier Layer is 10 nm)

Figure 9:
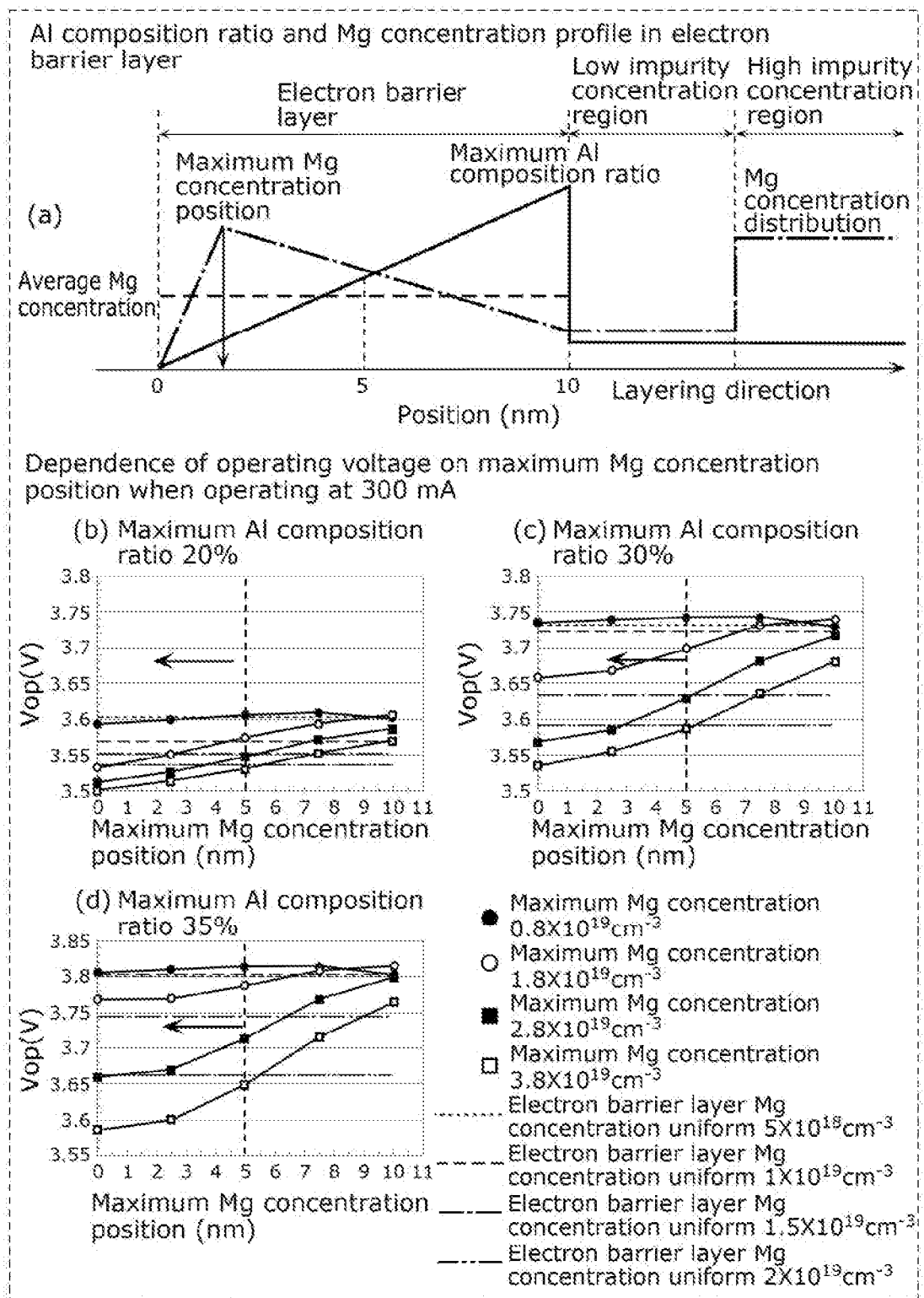
FIG. 9 is a diagram illustrating a relationship between the operating voltage and the maximum impurity concentration position when the electron barrier layer is 10 nm thick.

Next, simulation results for a case where the electron barrier layer is 10 nm thick will be described with reference to FIG. 9. FIG. 9 is a diagram illustrating a relationship between the operating voltage and the maximum impurity concentration position when the electron barrier layer is 10 nm thick. Like graph (a) in FIG. 7, graph (a) in FIG. 9 is a graph indicating the Al composition ratio distribution and the impurity concentration distribution in the electron barrier layer and second semiconductor layer 19. Also, like graphs (b), (c), and (d) in FIG. 7, graphs (b), (c), and (d) in FIG. 9 indicate a relationship between the operating voltage and the maximum impurity concentration position during 300-mA operation of a semiconductor light-emitting device having maximum Al composition ratios of 20%, 30%, and 35% in the electron barrier layer, respectively. In this simulation, the Al composition ratio of the electron barrier layer increases monotonically with proximity to second semiconductor layer 19 in the layering direction, in the same manner as in the example illustrated in FIG. 8. The configuration of second semiconductor layer 19 is the same as the configuration used in the simulations indicated in FIG. 7.

As indicated in graphs (b) to (d) in FIG. 9, even when the electron barrier layer is 10 nm thick, when the maximum impurity concentration position is located between the interface on the active layer 15 side of the electron barrier layer and an intermediate position in the layering direction of the increasing Al composition ratio region, the operating voltage is reduced as compared to a case of uniform impurity doping (Comparative Example 2). An increase in the waveguide loss can be suppressed as well.

The effect of lowering the operating voltage is greater when the maximum impurity concentration position is as close as possible to the active layer 15-side interface, and can be further increased if the distance from the active layer 15-side interface side is within 25% of film thickness of the increasing Al composition ratio region.

When the Al composition ratio is at least 20% and at most 35%, the effect of lowering the operating voltage occurs when the maximum impurity concentration is in a range of at least $1.8 \times 10^{19}$ cm$^{-3}$, and thus the operating voltage can be lowered without increasing the waveguide loss by using a maximum impurity concentration of $2 \times 10^{19}$ cm$^{-3}$.

The maximum impurity concentration may be at least $2.5 \times 10^{19}$ cm$^{-3}$. This makes it possible to further increase the effect of lowering the operating voltage while suppressing an increase in waveguide loss.

2-2-6. Operating Voltage (when Electron Barrier Layer has First Region and Second Region (5 nm Thick))

Figure 10:
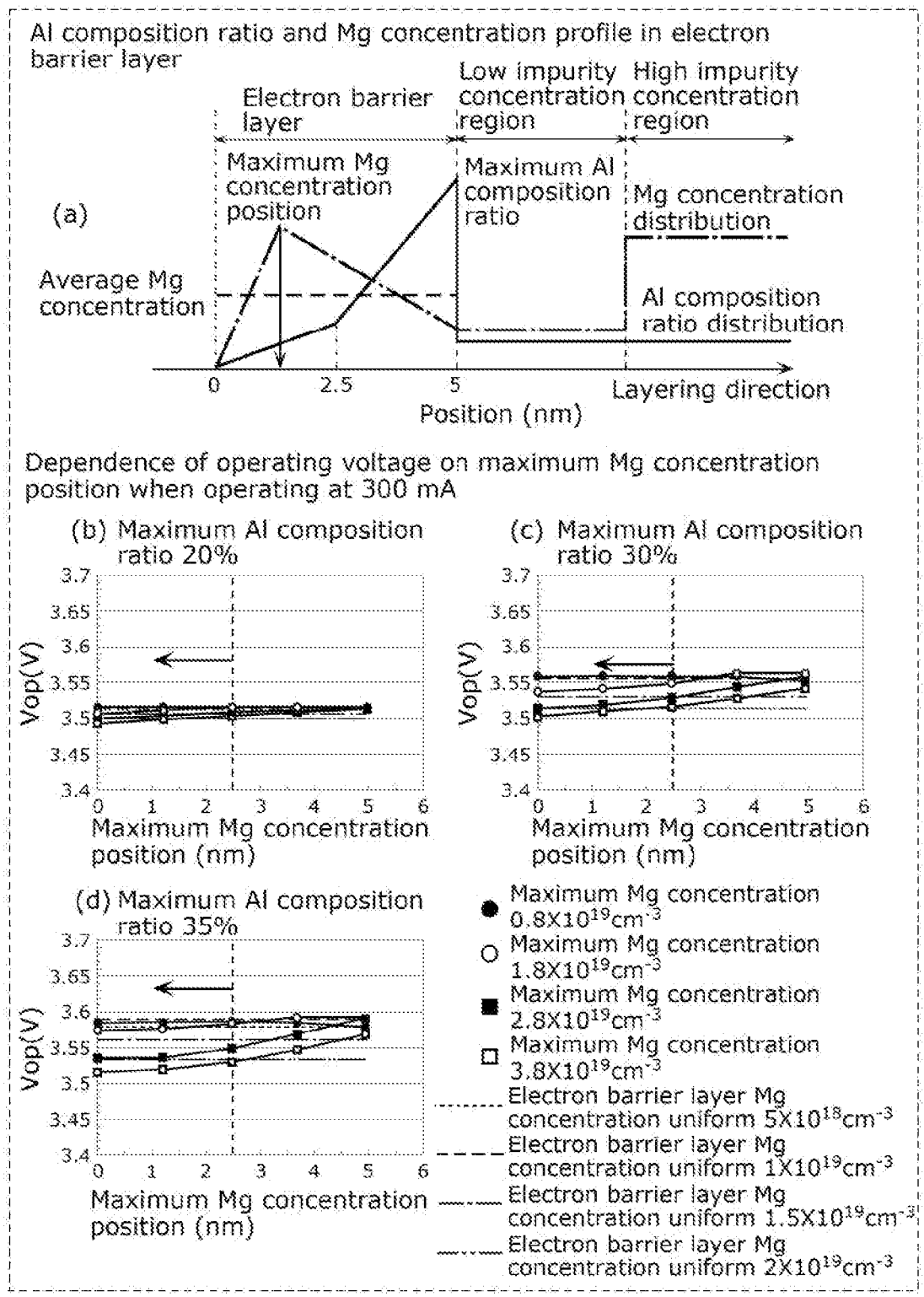
FIG. 10 is a diagram illustrating a relationship between the operating voltage and the maximum impurity concentration position when the electron barrier layer has a first region and a second region.

Next, simulation results in a case where the electron barrier layer includes the first region and the second region will be described with reference to FIG. 10. FIG. 10 is a diagram illustrating a relationship between the operating voltage and the maximum impurity concentration position when the electron barrier layer has the first region and the second region. Like graph (a) in FIG. 7, graph (a) in FIG. 10 is a graph indicating the Al composition ratio distribution and the impurity concentration distribution in the electron barrier layer and second semiconductor layer 19. Also, like graphs (b), (c), and (d) in FIG. 7, graphs (b), (c), and (d) in FIG. 10 indicate a relationship between the operating voltage and the maximum impurity concentration position during 300-mA operation of a semiconductor light-emitting device having maximum Al composition ratios of 20%, 30%, and 35% in the electron barrier layer, respectively. The configuration of second semiconductor layer 19 is the same as the configuration used in the simulations indicated in FIG. 7.

In this simulation, the increasing Al composition ratio region of the electron barrier layer includes the first region, in which the Al composition ratio changes at a first rate of change, and the second region, which is disposed between first region and second semiconductor layer 19 and in which the Al composition ratio changes at a second rate of change, the second rate of change being greater than the first rate of change. In other words, the Al composition ratio of the electron barrier layer increases monotonically at two rates of change, namely the first rate of change and the second rate of change which is greater than the first rate of change, with proximity to second semiconductor layer 19 in the layering direction. When the horizontal axis represents the position in the layering direction and the vertical axis represents the Al composition ratio, the graph indicating the Al composition ratio distribution in the electron barrier layer has a downward convex shape, as indicated by the solid line in schematic diagram (a) in FIG. 10.

In this simulation, the thickness of the electron barrier layer is 5 nm, the thickness of the first region is 2.5 nm, and the Al composition ratio increases linearly from 0% to 5% in the first region. The thickness of the second region is also 2.5 nm, and the Al composition ratio in the second region increases linearly from 5% to the maximum Al composition ratio (20%, 30%, or 35%).

When the maximum impurity concentration position is located between the active layer 15-side interface and an intermediate position in the layering direction of the increasing Al composition ratio region in the electron barrier layer, the operating voltage is reduced as compared to a case of uniform impurity doping (Comparative Example 2). An increase in the waveguide loss can be suppressed as well.

The effect of lowering the operating voltage is greater when the maximum impurity concentration position is as close as possible to the active layer 15-side interface, and can be further increased if the distance from the active layer 15-side interface side is within 25% of film thickness of the increasing Al composition ratio region.

When the Al composition ratio is at least 20% and at most 35%, the effect of lowering the operating voltage occurs when the maximum impurity concentration is at least $1.8 \times 10^{19}$ cm$^{-3}$, and thus the operating voltage can be lowered without increasing the waveguide loss by using a maximum impurity concentration of $2 \times 10^{19}$ cm$^{-3}$.

The maximum impurity concentration may be at least $2.5 \times 10^{19}$ cm$^{-3}$. This makes it possible to further increase the effect of lowering the operating voltage while suppressing an increase in waveguide loss.

2-2-7. Operating Voltage (when Electron Barrier Layer has First Region and Second Region (10 nm Thick))

Figure 11:
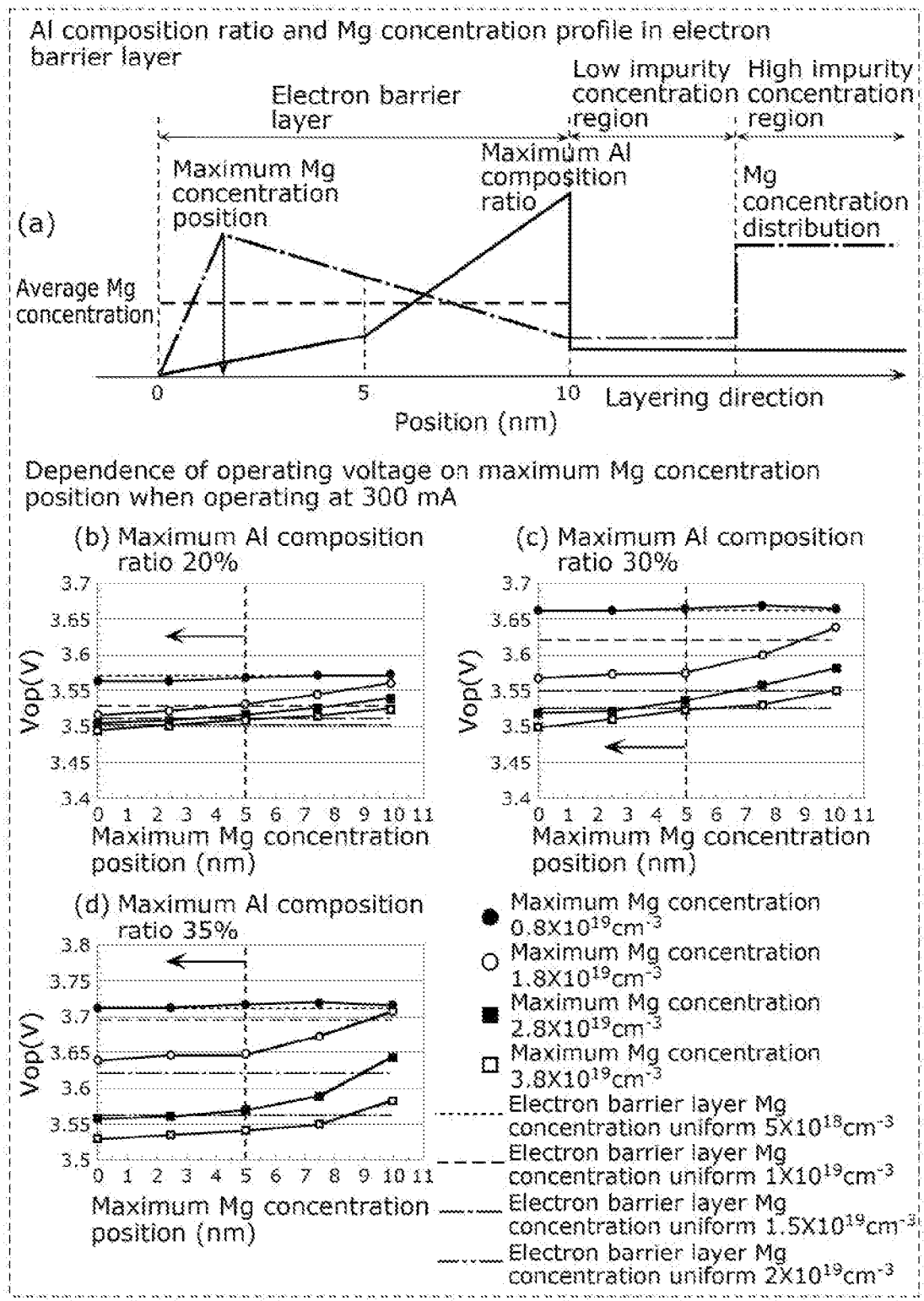
FIG. 11 is a diagram illustrating a relationship between the operating voltage and the maximum impurity concentration position when the electron barrier layer has a first region and a second region and the electron barrier layer is 10 nm thick.

Next, simulation results in a case where the electron barrier layer includes the first region and the second region, and the electron barrier layer is 10 nm thick, will be described with reference to FIG. 11. FIG. 11 is a diagram illustrating a relationship between the operating voltage and the maximum impurity concentration position when the electron barrier layer has a first region and a second region and the electron barrier layer is 10 nm thick. Like graph (a) in FIG. 7, graph (a) in FIG. 11 is a graph indicating the Al composition ratio distribution and the impurity concentration distribution in the electron barrier layer and second semiconductor layer 19. Also, like graphs (b), (c), and (d) in FIG. 7, graphs (b), (c), and (d) in FIG. 11 indicate a relationship between the operating voltage and the maximum impurity concentration position during 300-mA operation of a semiconductor light-emitting device having maximum Al composition ratios of 20%, 30%, and 35% in the electron barrier layer, respectively. The configuration of second semiconductor layer 19 is the same as the configuration used in the simulations indicated in FIG. 7.

In this simulation, the increasing Al composition ratio region of the electron barrier layer includes the first region, in which the Al composition ratio changes at a first rate of change, and the second region, which is disposed between first region and second semiconductor layer 19 and in which the Al composition ratio changes at a second rate of change, the second rate of change being greater than the first rate of change. When the horizontal axis represents the position in the layering direction and the vertical axis represents the Al composition ratio, the graph indicating the Al composition ratio distribution in the electron barrier layer has a downward convex shape, as indicated by the solid line in schematic diagram (a) in FIG. 11.

In this simulation, the thickness of the electron barrier layer is 10 nm, the thickness of the first region is 5 nm, and the Al composition ratio increases linearly from 0% to 5% in the first region. The thickness of the second region is also 5 nm, and the Al composition ratio in the second region increases linearly from 5% to the maximum Al composition ratio (20%, 30%, or 35%).

When the maximum impurity concentration position is located between the active layer 15-side interface and an intermediate position in the layering direction of the increasing Al composition ratio region in the electron barrier layer, the operating voltage is reduced as compared to a case of uniform impurity doping (Comparative Example 2). An increase in the waveguide loss can be suppressed as well.

The effect of lowering the operating voltage is greater when the maximum impurity concentration position is as close as possible to the active layer 15-side interface, and can be further increased if the distance from the active layer 15-side interface side is within 25% of film thickness of the increasing Al composition ratio region.

When the Al composition ratio is at least 20% and at most 35%, the effect of lowering the operating voltage occurs when the maximum impurity concentration is at least $1.8 \times 10^{19}$ cm$^{-3}$, and thus the operating voltage can be lowered without increasing the waveguide loss by using a maximum impurity concentration of $2 \times 10^{19}$ cm$^{-3}$.

The maximum impurity concentration may be at least $2.5 \times 10^{19}$ cm$^{-3}$. This makes it possible to further increase the effect of lowering the operating voltage while suppressing an increase in waveguide loss.

2-2-8. Operating Voltage (when Al Composition Ratio Distribution of Electron Barrier Layer has Upward Convex Shape (Thickness: 5 Nm))

Figure 12:
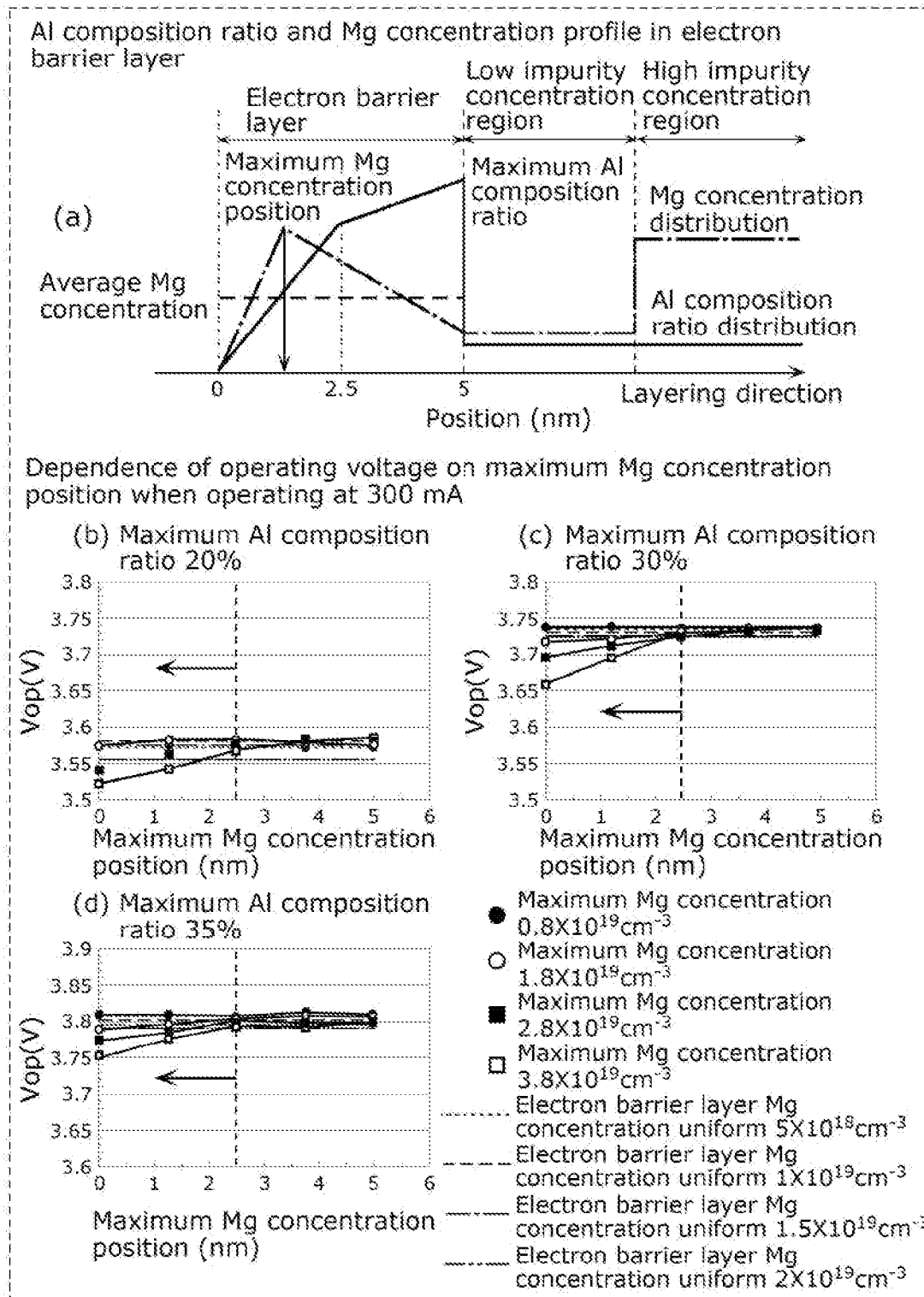
FIG. 12 is a diagram illustrating a relationship between the operating voltage and the maximum impurity concentration position when an Al composition ratio distribution of the electron barrier layer has an upward convex shape.

Next, simulation results for a case where the Al composition ratio distribution of the electron barrier layer has an upward convex shape will be described with reference to FIG. 12. FIG. 12 is a diagram illustrating a relationship between the operating voltage and the maximum impurity concentration position when the Al composition ratio distribution of the electron barrier layer has an upward convex shape. Like graph (a) in FIG. 7, graph (a) in FIG. 12 is a graph indicating the Al composition ratio distribution and the impurity concentration distribution in the electron barrier layer and second semiconductor layer 19. Also, like graphs (b), (c), and (d) in FIG. 7, graphs (b), (c), and (d) in FIG. 12 indicate a relationship between the operating voltage and the maximum impurity concentration position during 300-mA operation of a semiconductor light-emitting device having maximum Al composition ratios of 20%, 30%, and 35% in the electron barrier layer, respectively. The configuration of second semiconductor layer 19 is the same as the configuration used in the simulations indicated in FIG. 7.

In this simulation, the increasing Al composition ratio region of the electron barrier layer includes the first region, in which the Al composition ratio changes at a first rate of change, and the second region, which is disposed between first region and second semiconductor layer 19 and in which the Al composition ratio changes at a second rate of change, the second rate of change being lower than the first rate of change. In other words, the Al composition ratio of the electron barrier layer increases monotonically at two rates of change, namely the first rate of change and the second rate of change which is lower than the first rate of change, with proximity to second semiconductor layer 19 in the layering direction. When the horizontal axis represents the position in the layering direction and the vertical axis represents the Al composition ratio, the graph indicating the Al composition ratio distribution in the electron barrier layer has an upward convex shape, as indicated by the solid line in schematic diagram (a) in FIG. 12.

In this simulation, the thickness of the electron barrier layer is 5 nm, the thickness of the first region is 2.5 nm, and the Al composition ratio in the first region increases linearly from 0% to an Al composition ratio 5% lower than the maximum Al composition ratio. The thickness of the second region is also 2.5 nm, and the Al composition ratio in the second region increases linearly from an Al composition ratio 5% lower than the maximum Al composition ratio to the maximum Al composition ratio (20%, 30%, or 35%).

When the maximum impurity concentration position is located between the active layer 15-side interface and an intermediate position in the layering direction of the increasing Al composition ratio region in the electron barrier layer, the operating voltage is reduced as compared to a case of uniform impurity doping (Comparative Example 2). An increase in the waveguide loss can be suppressed as well. However, these effects are lower than when the electron barrier layer has an Al composition ratio distribution with a linear shape, as indicated in FIG. 8.

The effect of lowering the operating voltage is greater when the maximum impurity concentration position is as close as possible to the active layer 15-side interface, and can be further increased if the distance from the active layer 15-side interface side is within 25% of film thickness of the increasing Al composition ratio region.

When the Al composition ratio is at least 20% and at most 35%, the effect of lowering the operating voltage occurs when the maximum impurity concentration is at least $1.8 \times 10^{19}$ cm$^{-3}$, and thus the operating voltage can be lowered without increasing the waveguide loss by using a maximum impurity concentration of $2 \times 10^{19}$ cm$^{-3}$.

The maximum impurity concentration may be at least $2.5 \times 10^{19}$ cm$^{-3}$. This makes it possible to further increase the effect of lowering the operating voltage while suppressing an increase in waveguide loss.

2-2-9. Operating Voltage (when Al Composition Ratio Distribution of Electron Barrier Layer has Upward Convex Shape (Thickness: 10 Nm))

Figure 13:
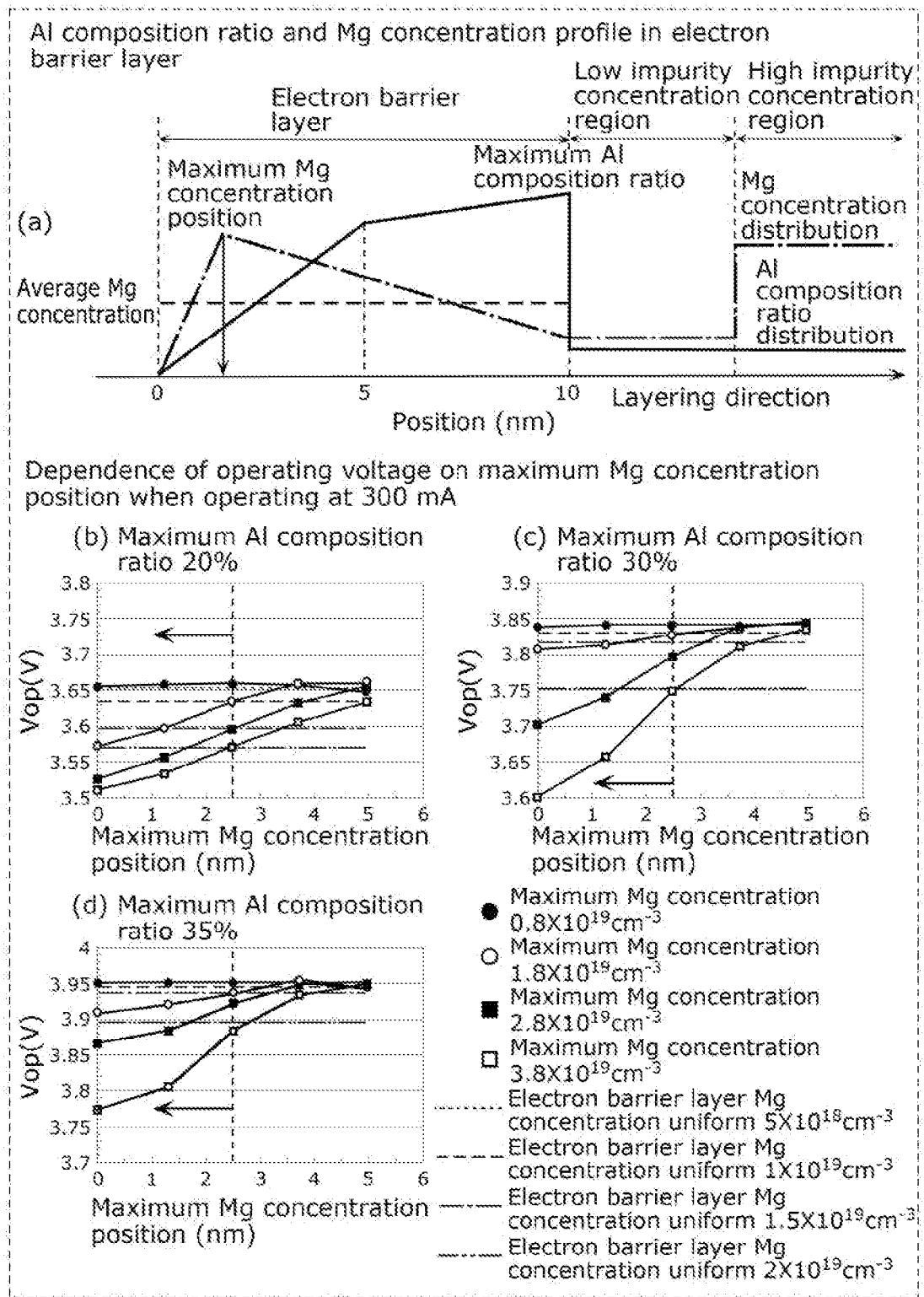
FIG. 13 is a diagram illustrating a relationship between the operating voltage and the maximum impurity concentration position when the Al composition ratio distribution of the electron barrier layer has an upward convex shape.

Next, simulation results for a case where the Al composition ratio distribution of the electron barrier layer has an upward convex shape and the electron barrier layer is 10 nm thick will be described with reference to FIG. 13. FIG. 13 is a diagram illustrating a relationship between the operating voltage and the maximum impurity concentration position when the Al composition ratio distribution of the electron barrier layer has an upward convex shape. Like graph (a) in FIG. 7, graph (a) in FIG. 13 is a graph indicating the Al composition ratio distribution and the impurity concentration distribution in the electron barrier layer and second semiconductor layer 19. Also, like graphs (b), (c), and (d) in FIG. 7, graphs (b), (c), and (d) in FIG. 13 indicate a relationship between the operating voltage and the maximum impurity concentration position during 300-mA operation of a semiconductor light-emitting device having maximum Al composition ratios of 20%, 30%, and 35% in the electron barrier layer, respectively. The configuration of second semiconductor layer 19 is the same as the configuration used in the simulations indicated in FIG. 7.

In this simulation, the increasing Al composition ratio region of the electron barrier layer includes the first region, in which the Al composition ratio changes at a first rate of change, and the second region, which is disposed between first region and second semiconductor layer 19 and in which the Al composition ratio changes at a second rate of change, the second rate of change being lower than the first rate of change. In other words, the Al composition ratio of the electron barrier layer increases monotonically at two rates of change, namely the first rate of change and the second rate of change which is lower than the first rate of change, with proximity to second semiconductor layer 19 in the layering direction. When the horizontal axis represents the position in the layering direction and the vertical axis represents the Al composition ratio, the graph indicating the Al composition ratio distribution in the electron barrier layer has an upward convex shape, as indicated by the solid line in schematic diagram (a) in FIG. 13.

In this simulation, the thickness of the electron barrier layer is 10 nm, the thickness of the first region is 5 nm, and the Al composition ratio in the first region increases linearly from 0% to an Al composition ratio 5% lower than the maximum Al composition ratio. The thickness of the second region is also 5 nm, and the Al composition ratio in the second region increases linearly from an Al composition ratio 5% lower than the maximum Al composition ratio to the maximum Al composition ratio (20%, 30%, or 35%).

When the maximum impurity concentration position is located between the active layer 15-side interface and an intermediate position in the layering direction of the increasing Al composition ratio region in the electron barrier layer, the operating voltage is reduced as compared to a case of uniform impurity doping (Comparative Example 2). An increase in the waveguide loss can be suppressed as well. However, these effects are lower than when the electron barrier layer has an Al composition ratio distribution with a linear shape, as indicated in FIG. 9.

The effect of lowering the operating voltage is greater when the maximum impurity concentration position is as close as possible to the active layer 15-side interface, and can be further increased if the distance from the active layer 15-side interface side is within 25% of film thickness of the increasing Al composition ratio region.

When the Al composition ratio is at least 20% and at most 35%, the effect of lowering the operating voltage occurs when the maximum impurity concentration is at least $1.8 \times 10^{19}$ cm$^{-3}$, and thus the operating voltage can be lowered without increasing the waveguide loss by using a maximum impurity concentration of $2 \times 10^{19}$ cm$^{-3}$.

The maximum impurity concentration may be at least $2.5 \times 10^{19}$ cm$^{-3}$. This makes it possible to further increase the effect of lowering the operating voltage while suppressing an increase in waveguide loss.

2-2-10. Operating Voltage (when Impurity Concentration in Low Impurity Concentration Region is Changed)

Figure 14:
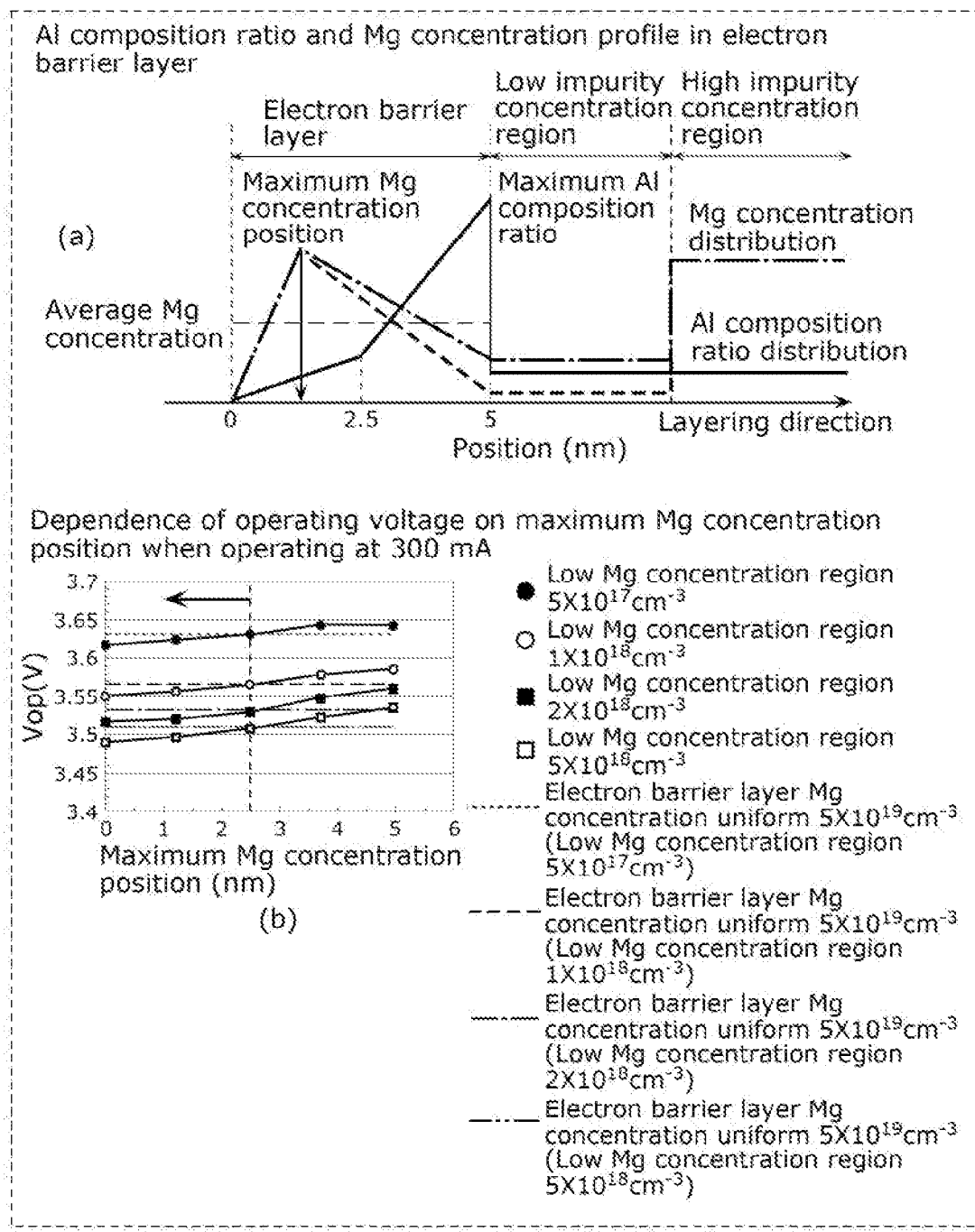
FIG. 14 is a diagram illustrating a relationship between the operating voltage and the maximum impurity concentration position when the impurity concentration of a low impurity concentration region in the second semiconductor layer is changed.

Next, simulation results for a case where the impurity concentration of the low impurity concentration region of second semiconductor layer 19 is changed will be described with reference to FIG. 14. FIG. 14 is a diagram illustrating a relationship between the operating voltage and the maximum impurity concentration position when the impurity concentration of the low impurity concentration region in second semiconductor layer 19 is changed. Like graph (a) in FIG. 7, graph (a) in FIG. 14 is a graph indicating the Al composition ratio distribution and the impurity concentration distribution in the electron barrier layer and second semiconductor layer 19. In graph (a) in FIG. 14, two examples of the impurity (Mg) concentration distributions are represented by a dot-dash line and broken line, respectively. Like graph (c) in FIG. 7, graph (b) in FIG. 14 indicates a relationship between the operating voltage and the maximum impurity concentration position during 300-mA operation of a semiconductor light-emitting device having a maximum Al composition ratio of 30% in the electron barrier layer. The configuration of second semiconductor layer 19 is the same as the configuration used in the simulations indicated in FIG. 7.

In this simulation, the increasing Al composition ratio region of the electron barrier layer includes the first region, in which the Al composition ratio changes at a first rate of change, and the second region, which is disposed between first region and second semiconductor layer 19 and in which the Al composition ratio changes at a second rate of change, the second rate of change being greater than the first rate of change. When the horizontal axis represents the position in the layering direction and the vertical axis represents the Al composition ratio, the graph indicating the Al composition ratio distribution in the electron barrier layer has a downward convex shape, as indicated by the solid line in schematic diagram (a) in FIG. 14. The thickness of the electron barrier layer is 5 nm, the thickness of the first region is 2.5 nm, and the Al composition ratio increases linearly from 0% to 5% in the first region. The thickness of the second region is also 2.5 nm, and the Al composition ratio in the second region increases linearly from 5% to the maximum Al composition ratio (30%).

In these simulations, the impurity concentration is set to $2.8 \times 10^{19}$ cm$^{-3}$, and the maximum impurity concentration position is varied from the active layer 15-side interface to the second semiconductor layer 19-side interface.

The thickness of the low impurity concentration region was set to 170 nm, and the simulations were carried out while varying the impurity concentration of the low impurity concentration region among $5 \times 10^{17}$ cm$^{-3}$, $1 \times 10^{18}$ cm$^{-3}$, $2 \times 10^{18}$ cm$^{-3}$, and $5 \times 10^{18}$ cm$^{-3}$. Graph (b) in FIG. 14 also indicates the operating voltages when the impurity concentration in the electron barrier layer is uniform and the concentration of the low impurity concentration region is varied among $5 \times 10^{17}$ cm$^{-3}$, $1 \times 10^{18}$ cm$^{-3}$, $2 \times 10^{18}$ cm$^{-3}$, and $5 \times 10^{18}$ cm$^{-3}$ as a dotted line, a broken line, a dot-dash line, and a double dot-dash line, respectively (Comparative Example 2).

As indicated in graph (b) of FIG. 14, if the impurity concentration in the low impurity concentration region is set to at least $1 \times 10^{18}$ cm$^{-3}$, a rapid increase in operating voltage can be suppressed. Furthermore, when the maximum impurity concentration position is located between the active layer 15-side interface and an intermediate position in the layering direction of the increasing Al composition ratio region in the electron barrier layer, the operating voltage can be reduced as compared to a case of uniformly doping the electron barrier layer with impurities.

The effect of lowering the operating voltage is greater when the maximum impurity concentration position is as close as possible to the active layer 15-side interface, and can be further increased if the distance from the active layer 15-side interface side is within 25% of film thickness of the increasing Al composition ratio region.

2-2-11. Operating Voltage (when Maximum Impurity Concentration Position is in Intermediate Layer)

Figure 15:
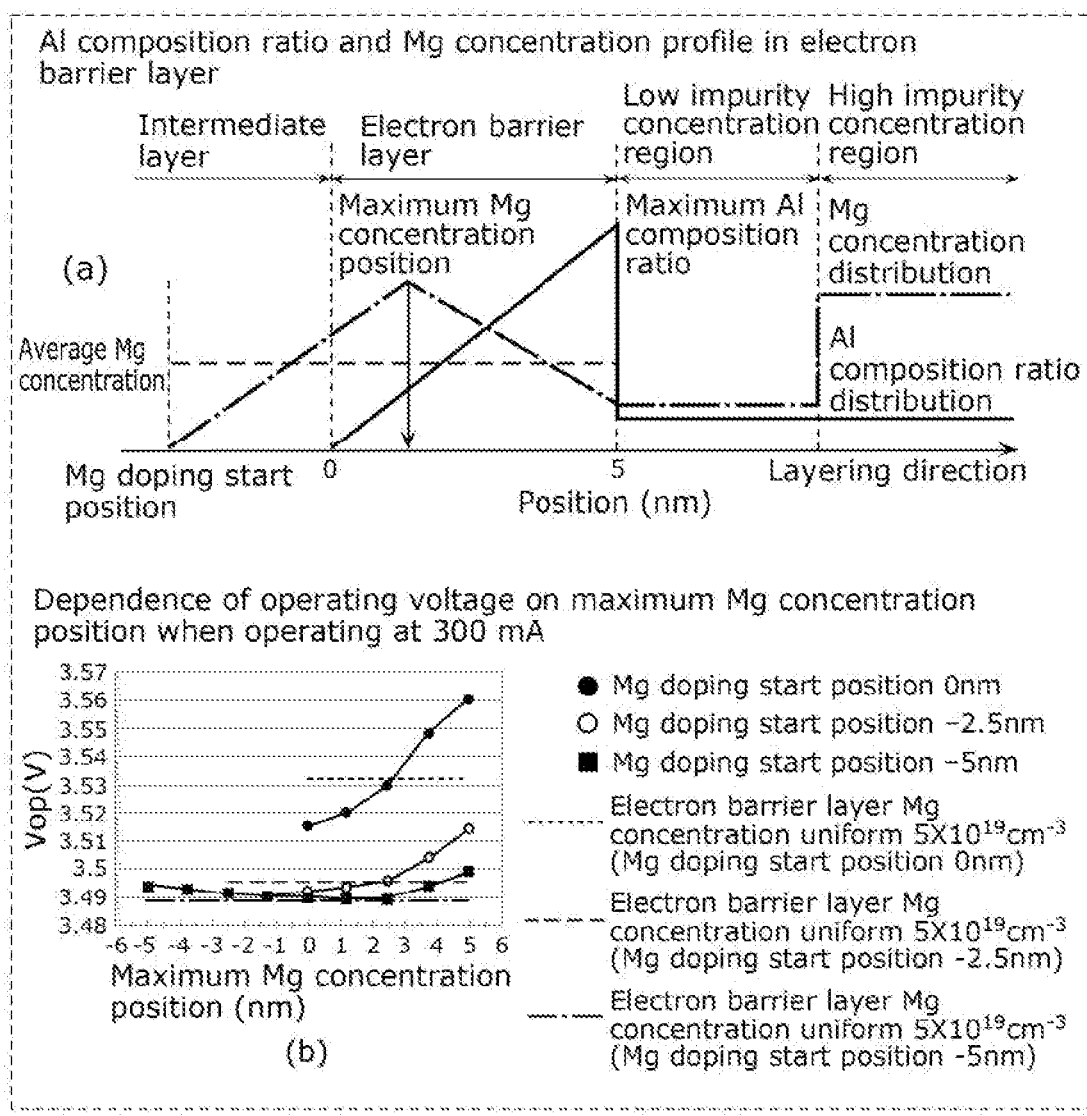
FIG. 15 is a diagram illustrating a relationship between the operating voltage and the maximum impurity concentration position when the impurity concentration of the low impurity concentration region in the second semiconductor layer is changed.

Next, simulation results for a case where intermediate layer 17 contains an impurity of the second conductivity type and the maximum impurity concentration position in intermediate layer 17 and the electron barrier layer is located in intermediate layer 17 will be described with reference to FIG. 15. FIG. 15 is a diagram illustrating a relationship between the operating voltage and the maximum impurity concentration position when the impurity concentration of the low impurity concentration region in second semiconductor layer 19 is changed.

Graph (a) in FIG. 15 is a graph indicating the Al composition ratio distribution and the impurity concentration distribution in the electron barrier layer and second semiconductor layer 19. Graph (a) in FIG. 15 also indicates the Al composition ratio in intermediate layer 17. Like graph (c) in FIG. 7, graph (b) in FIG. 15 indicates a relationship between the operating voltage and the maximum impurity concentration position during 300-mA operation of a semiconductor light-emitting device having a maximum Al composition ratio of 30% in the electron barrier layer. The configuration of second semiconductor layer 19 is the same as the configuration used in the simulations indicated in FIG. 7.

In this simulation, the Al composition ratio of the electron barrier layer increases monotonically with proximity to second semiconductor layer 19 in the layering direction. The electron barrier layer is 5 nm thick, and the Al composition ratio increases linearly from 0% to 30%. When the maximum Al composition ratio is 30% and the maximum impurity concentration is $2.8 \times 10^{19}$ cm$^{-3}$, and the impurity doping start position is 5 nm, 2.5 nm, and 0 nm (i.e., the interface position) from the interface of intermediate layer 17 with the electron barrier layer, the maximum impurity concentration position is changed from the active layer 15-side interface to the second semiconductor layer 19-side interface. The configuration of second semiconductor layer 19 is the same as the configuration used in the simulations indicated in FIG. 7. Graph (b) in FIG. 15 also indicates, as Comparative Example 2, the operating voltages for the case where the impurity concentrations in the impurity doping region of the intermediate layer and the electron barrier layer are made uniform and the impurity doping start position (i.e., the position of the edge of the impurity doping region on the active layer 15 side) is set to 5 nm, 2.5 nm, and 0 nm (i.e., the position of the interface) from the interface of intermediate layer 17 with the electron barrier layer, as a dotted line, a broken line, and a dot-dash line, respectively.

As indicated in graph (b) in FIG. 15, when the doping start position of the impurity in the electron barrier layer is 5 nm from the interface with the electron barrier layer in intermediate layer 17, there is an effect of lowering the operating voltage by approximately 0.02 V compared to a case where the starting position of doping is the interface between intermediate layer 17 and the electron barrier layer.

Furthermore, when the maximum impurity concentration position is located between the active layer 15-side interface and an intermediate position in the layering direction of the increasing Al composition ratio region in the electron barrier layer, the operating voltage can be reduced as compared to a case of uniformly doping only the electron barrier layer with impurities.

Note that locating if the impurity doping start position too close to active layer 15 will lead to an increase in waveguide loss. Because the effect of lowering the operating voltage is similar between the case where the impurity doping start position is 2.5 nm from the interface between intermediate layer 17 and the electron barrier layer and the case where the impurity doping start position is nm from the stated interface, the distance from the interface between the electron barrier layer and intermediate layer 17 to the impurity doping start position may be at most 5 nm in order to achieve lower operating voltage without causing an increase in waveguide loss.

Additionally, if the impurity doping start position in the electron barrier layer is set to a position within 1 nm in the layering direction from the active layer 15-side interface in the electron barrier layer, and the maximum impurity concentration position is located between the active layer 15-side interface and an intermediate position, in the layering direction, of the increasing Al composition ratio region in the electron barrier layer, the operating voltage can be reduced.

2-2-12. Operating Voltage (when Electron Barrier Layer has Constant Al Composition Ratio Region)

Figure 16:
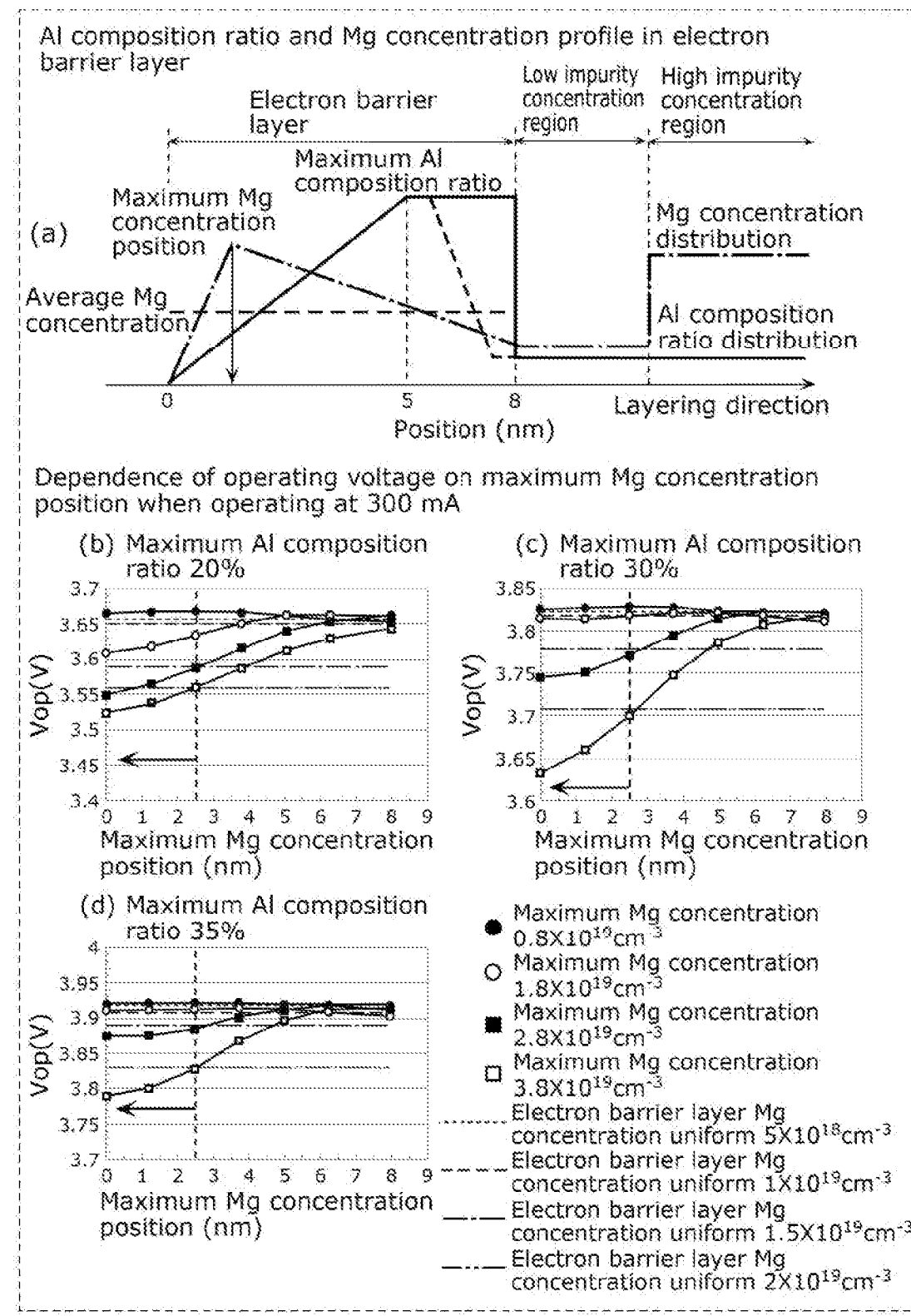
FIG. 16 is a diagram illustrating a relationship between the operating voltage and the maximum impurity concentration position when the electron barrier layer has a constant Al composition ratio region.

Next, simulation results for a case where the electron barrier layer has a constant Al composition ratio region, with a constant Al composition ratio between the increasing Al composition ratio region and second semiconductor layer 19, will be described with reference to FIG. 16. FIG. 16 is a diagram illustrating a relationship between the operating voltage and the maximum impurity concentration position when the electron barrier layer has a constant Al composition ratio region.

Like graph (a) in FIG. 7, graph (a) in FIG. 16 is a graph indicating the Al composition ratio distribution and the impurity concentration distribution in the electron barrier layer and second semiconductor layer 19. Also, like graphs (b), (c), and (d) in FIG. 7, graphs (b), (c), and (d) in FIG. 16 indicate a relationship between the operating voltage and the maximum impurity concentration position during 300-mA operation of a semiconductor light-emitting device having maximum Al composition ratios of 20%, 30%, and 35% in the electron barrier layer, respectively. The configuration of second semiconductor layer 19 is the same as the configuration used in the simulations indicated in FIG. 7.

In this simulation, the electron barrier layer is 8 nm thick. The electron barrier layer has an increasing Al composition ratio region, having a thickness of 5 nm, where the Al composition ratio increases linearly from 0 to the maximum Al composition ratio (20%, 30% or 35%), and a constant Al composition ratio region, disposed between the increasing Al composition ratio region and second semiconductor layer 19 and having a thickness of 3 nm, where the Al composition ratio is constant at the maximum Al composition ratio.

As indicated in graphs (b) to (d) in FIG. 16, when the maximum impurity concentration position is located between the active layer 15-side interface and an intermediate position in the layering direction of the increasing Al composition ratio region in the electron barrier layer, the operating voltage can be reduced as compared to a case of uniform impurity doping (Comparative Example 2). An increase in the waveguide loss can be suppressed as well.

The effect of lowering the operating voltage is greater when the maximum impurity concentration position is as close as possible to the active layer 15-side interface, and can be further increased if the distance from the active layer 15-side interface side is within 25% of film thickness of the increasing Al composition ratio region.

When the Al composition ratio is at least 20% and at most 35%, the effect of lowering the operating voltage occurs when the maximum impurity concentration is at least 1.8× $10^{19}$ cm$^{-3}$, and thus the operating voltage can be lowered without increasing the waveguide loss by using a maximum impurity concentration of 2×$10^{19}$ cm$^{-3}$.

The maximum impurity concentration may be at least 2.5×$10^{19}$ cm$^{-3}$. This makes it possible to further increase the effect of lowering the operating voltage while suppressing an increase in waveguide loss.

Even if the electron barrier layer has a constant Al composition ratio region having a thickness of 3 nm on the second semiconductor layer side of the increasing Al composition ratio region, in the constant Al composition ratio region, the band potential increases due to the influence of the piezoelectric effect in the electron barrier layer, which leads to a low impurity activation rate and little influence on variation in the operating voltage. Making the constant Al composition ratio region too thick will increase the serial resistance on holes passing through the electron barrier layer, but if the thickness of the constant Al composition ratio region is less than 5 nm, there will be no significant increase in the operating voltage. The thickness of the constant Al composition ratio region may be at most 3 nm. This makes it possible to further suppress a significant increase in the operating voltage.

Additionally, as indicated by the broken line in graph (a) of FIG. 16, a decreasing Al composition ratio region, in which the Al composition ratio decreases monotonically with proximity to second semiconductor layer 19, may be provided between the constant Al composition ratio region and second semiconductor layer 19. The Al composition ratio is lower than in the Al composition ratio distribution indicated by the solid line in graph (a) of FIG. 16, and the impurity activation rate is higher, and because a relatively greater number of holes are generated, the operating voltage drops. Accordingly, the increase in operating voltage can be suppressed by reducing the Al composition ratio, at a distance of at most 5 nm from the position in the electron barrier layer where the Al composition ratio is highest, to be the same as the average Al composition ratio of the high impurity concentration region. Additionally, the Al composition ratio, at a distance of at most 3 nm from the position in the electron barrier layer where the Al composition ratio is highest, may be reduced to be the same as the average Al composition ratio of the high impurity concentration region. This makes it possible to further suppress an increase in the operating voltage.

2-2-13. Operating Voltage (when Electron Barrier Layer has Constant Al Composition Ratio Region, and Increasing Al Composition Ratio Region has First Region and Second Region)

Figure 17:
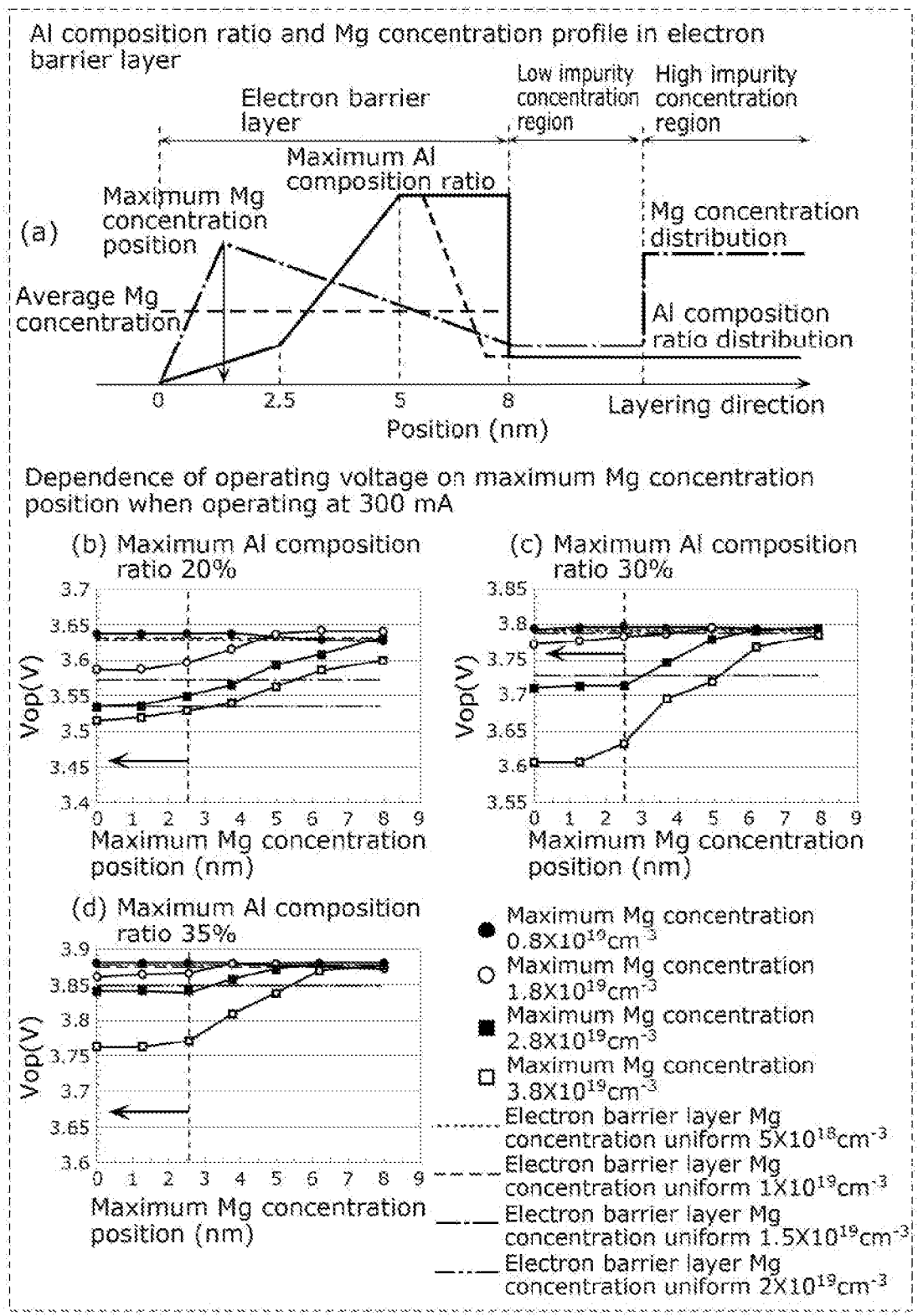
FIG. 17 is a diagram illustrating a relationship between the operating voltage and the maximum impurity concentration position when the electron barrier layer has a constant Al composition ratio region, and an increasing Al composition ratio region has a first region and a second region.

Next, simulation results in a case where the electron barrier layer includes the constant Al composition ratio region, and the increasing Al composition ratio region includes the first region and the second region, will be described with reference to FIG. 17. FIG. 17 is a diagram illustrating a relationship between the operating voltage and the maximum impurity concentration position when the electron barrier layer has a constant Al composition ratio region, and an increasing Al composition ratio region has a first region and a second region.

Like graph (a) in FIG. 7, graph (a) in FIG. 17 is a graph indicating the Al composition ratio distribution and the impurity concentration distribution in the electron barrier layer and second semiconductor layer 19. Also, like graphs (b), (c), and (d) in FIG. 7, graphs (b), (c), and (d) in FIG. 17 indicate a relationship between the operating voltage and the maximum impurity concentration position during 300-mA operation of a semiconductor light-emitting device having maximum Al composition ratios of 20%, 30%, and 35% in the electron barrier layer, respectively. The configuration of second semiconductor layer 19 is the same as the configuration used in the simulations indicated in FIG. 7.

In this simulation, the increasing Al composition ratio region of the electron barrier layer includes the first region, in which the Al composition ratio changes at a first rate of change, and the second region, which is disposed between first region and second semiconductor layer 19 and in which the Al composition ratio changes at a second rate of change, the second rate of change being greater than the first rate of change. When the horizontal axis represents the position in the layering direction and the vertical axis represents the Al composition ratio, the graph indicating the Al composition ratio distribution in the electron barrier layer has a downward convex shape, as indicated by the solid line in schematic diagram (a) in FIG. 17. The thickness of the electron barrier layer is 8 nm, the thickness of the first region is 2.5 nm, and the Al composition ratio increases linearly from 0% to 5% in the first region. The thickness of the second region is also 2.5 nm, and the Al composition ratio in the second region increases linearly from 5% to the maximum Al composition ratio (20%, 30%, or 35%). The electron barrier layer further includes the constant Al composition ratio region, disposed between the increasing Al composition ratio region and second semiconductor layer 19 and having a thickness of 3 nm, where the Al composition ratio is constant at the maximum Al composition ratio.

As indicated in graphs (b) to (d) in FIG. 17, when the maximum impurity concentration position is located between the active layer 15-side interface and an intermediate position in the layering direction of the increasing Al composition ratio region in the electron barrier layer, the operating voltage can be reduced as compared to a case of uniform impurity doping (Comparative Example 2). An increase in the waveguide loss can be suppressed as well.

The effect of lowering the operating voltage is greater when the maximum impurity concentration position is as close as possible to the active layer 15-side interface, and can be further increased if the distance from the active layer 15-side interface side is within 25% of film thickness of the increasing Al composition ratio region.

When the Al composition ratio is at least 20% and at most 35%, the effect of lowering the operating voltage occurs when the maximum impurity concentration is at least $1.8 \times 10^{19}$ cm$^{-3}$, and thus the operating voltage can be lowered without increasing the waveguide loss by using a maximum impurity concentration of $2 \times 10^{19}$ cm$^{-3}$.

The maximum impurity concentration may be at least $2.5 \times 10^{19}$ cm$^{-3}$. This makes it possible to further increase the effect of lowering the operating voltage while suppressing an increase in waveguide loss.

As described above, even if the electron barrier layer includes the 3 nm-thick constant Al composition ratio region on the second semiconductor layer-side of the increasing Al composition ratio region, there is little influence on variations in the operating voltage. Additionally, making the constant Al composition ratio region too thick will increase the serial resistance on holes passing through the electron barrier layer, but if the thickness of the constant Al composition ratio region is less than 5 nm, there will be no significant increase in the operating voltage. The thickness of the constant Al composition ratio region may be at most 3 nm. This makes it possible to further suppress a significant increase in the operating voltage.

Additionally, as indicated by the broken line in graph (a) of FIG. 17, a decreasing Al composition ratio region, in which the Al composition ratio decreases monotonically with proximity to second semiconductor layer 19, may be provided between the constant Al composition ratio region and second semiconductor layer 19. This results in a lower operating voltage, as described above. Accordingly, the increase in operating voltage can be suppressed by reducing the Al composition ratio, at a distance of at most 5 nm from the position in the electron barrier layer where the Al composition ratio is highest, to be the same as the average Al composition ratio of the high impurity concentration region. Additionally, the Al composition ratio, at a distance of at most 3 nm from the position in the electron barrier layer where the Al composition ratio is highest, may be reduced to be the same as the average Al composition ratio of the high impurity concentration region. This makes it possible to further suppress an increase in the operating voltage.

2-2-14. Waveguide Loss and Operating Voltage

Figure 18:
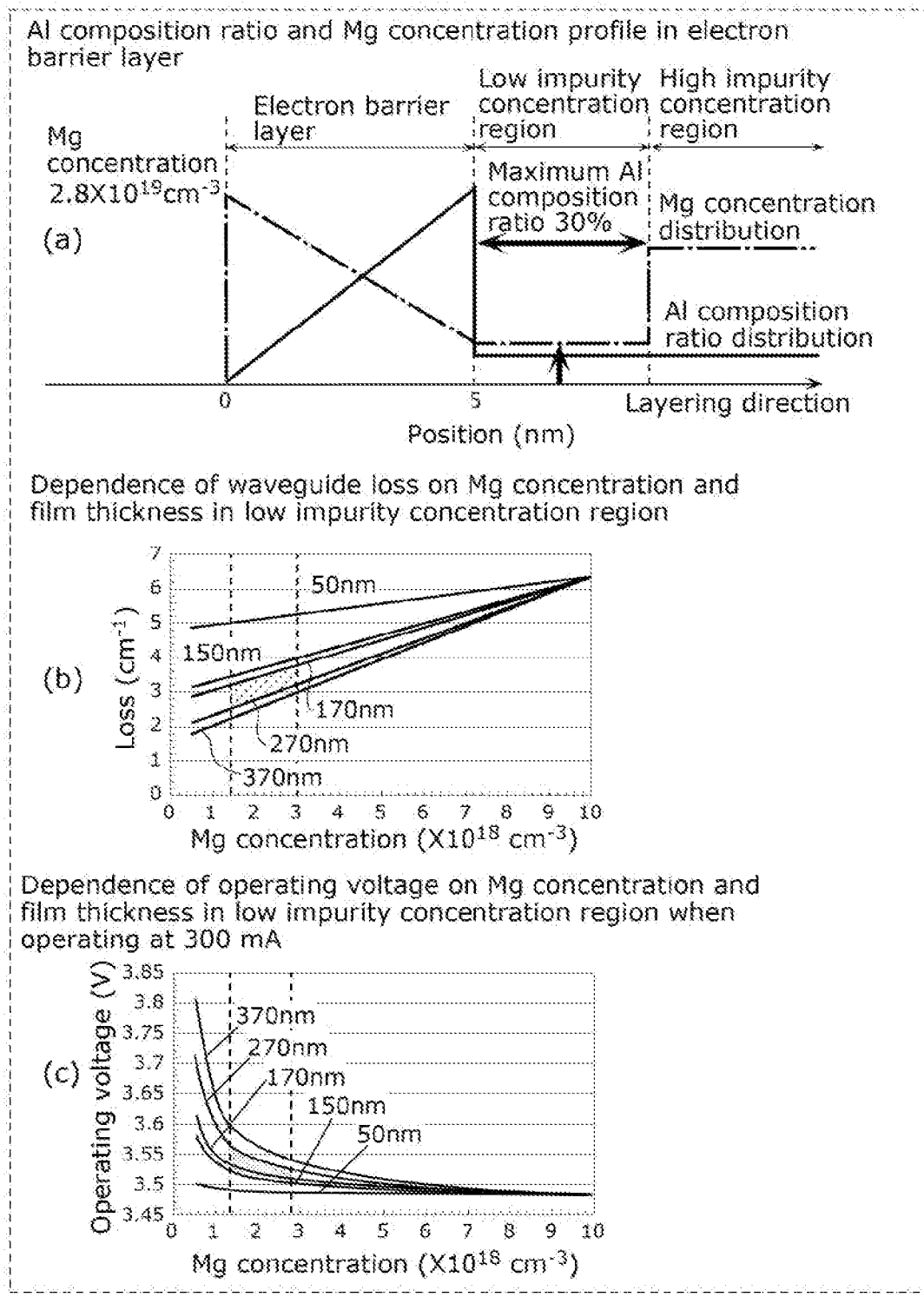
FIG. 18 is a diagram illustrating a relationship between waveguide loss and operating voltage, and the impurity concentration and thickness of the low impurity concentration region of the second semiconductor layer.

A relationship between waveguide loss and operating voltage, and the impurity concentration and thickness of the low impurity concentration region of the second semiconductor layer, will be described next with reference to FIG. 18. FIG. 18 is a diagram illustrating a relationship between waveguide loss and operating voltage, and the impurity concentration and thickness of the low impurity concentration region of the second semiconductor layer.

Like graph (a) in FIG. 7, graph (a) in FIG. 18 is a graph indicating the Al composition ratio distribution and the impurity concentration distribution in the electron barrier layer and second semiconductor layer 19. Graph (b) in FIG. 18 is a graph indicating the relationship between waveguide loss and the impurity (Mg) concentration in the low impurity concentration region. In graph (b) in FIG. 18, the graphs indicate simulation results when the thickness of the low impurity concentration region is 50 nm, 150 nm, 170 nm, 270 nm, and 370 nm, respectively.

Graph (c) in FIG. 18 is a graph indicating the relationship between the operating voltage of the semiconductor light-emitting device during 300 mA operation, and the impurity (Mg) concentration in the low impurity concentration region. Like graph (b), in graph (c) in FIG. 18, the graphs indicate simulation results when the thickness of the low impurity concentration region is 50 nm, 150 nm, 170 nm, 270 nm, and 370 nm, respectively.

In this simulation, the electron barrier layer is 5 nm thick. The electron barrier layer includes a 5 nm-thick increasing Al composition ratio region in which the Al composition ratio increases linearly from 0 to the maximum Al composition ratio (30%). The maximum impurity concentration in the electron barrier layer is set to $2.8 \times 10^{19}$ cm$^{-3}$, and the maximum impurity concentration position is at the active layer 15-side interface of the electron barrier layer. The impurity concentration of the high impurity concentration region of second semiconductor layer 19 is set to $1 \times 10^{19}$ cm$^{-3}$.

As indicated in graphs (b) and (c) in FIG. 18, by setting the impurity concentration in the low impurity concentration region to at least $1.5 \times 10^{18}$ cm$^{-3}$ and at most $3 \times 10^{18}$ cm$^{-3}$, and the thickness to at least 150 nm and at most 270 nm, a low waveguide loss of at most 4 cm$^{-1}$ can be achieved while suppressing a significant increase in the operating voltage, as compared to a case where the low impurity concentration region is not provided and the impurity concentration in the high impurity concentration region is kept constant at $1\times10^{19}$ cm$^{-3}$. Additionally, the thickness of the low impurity concentration region may be at least 170 nm and at most 270 nm. This makes it possible to achieve a low waveguide loss of at most 3.5 cm$^{-1}$, while further suppressing an increase in the operating voltage.

Although FIG. 18 indicates a simulation result for a case where the maximum Al composition ratio in the electron barrier layer is 0.3 (i.e., 30%), the same effects can be achieved even when the maximum Al composition ratio is at least 0.2 (i.e., 20%) and at most 0.35 (i.e., 35%). Additionally, although FIG. 18 indicates a simulation result for a case where the maximum value of the impurity concentration in the electron barrier layer is $2.8\times10^{19}$ cm$^{-3}$, the same effects can be achieved even when the maximum value of the impurity concentration in the electron barrier layer is at least $2\times10^{19}$ cm$^{-3}$.

2-2-15. Waveguide Loss and Optical Guide Layer Thickness

Figure 19:
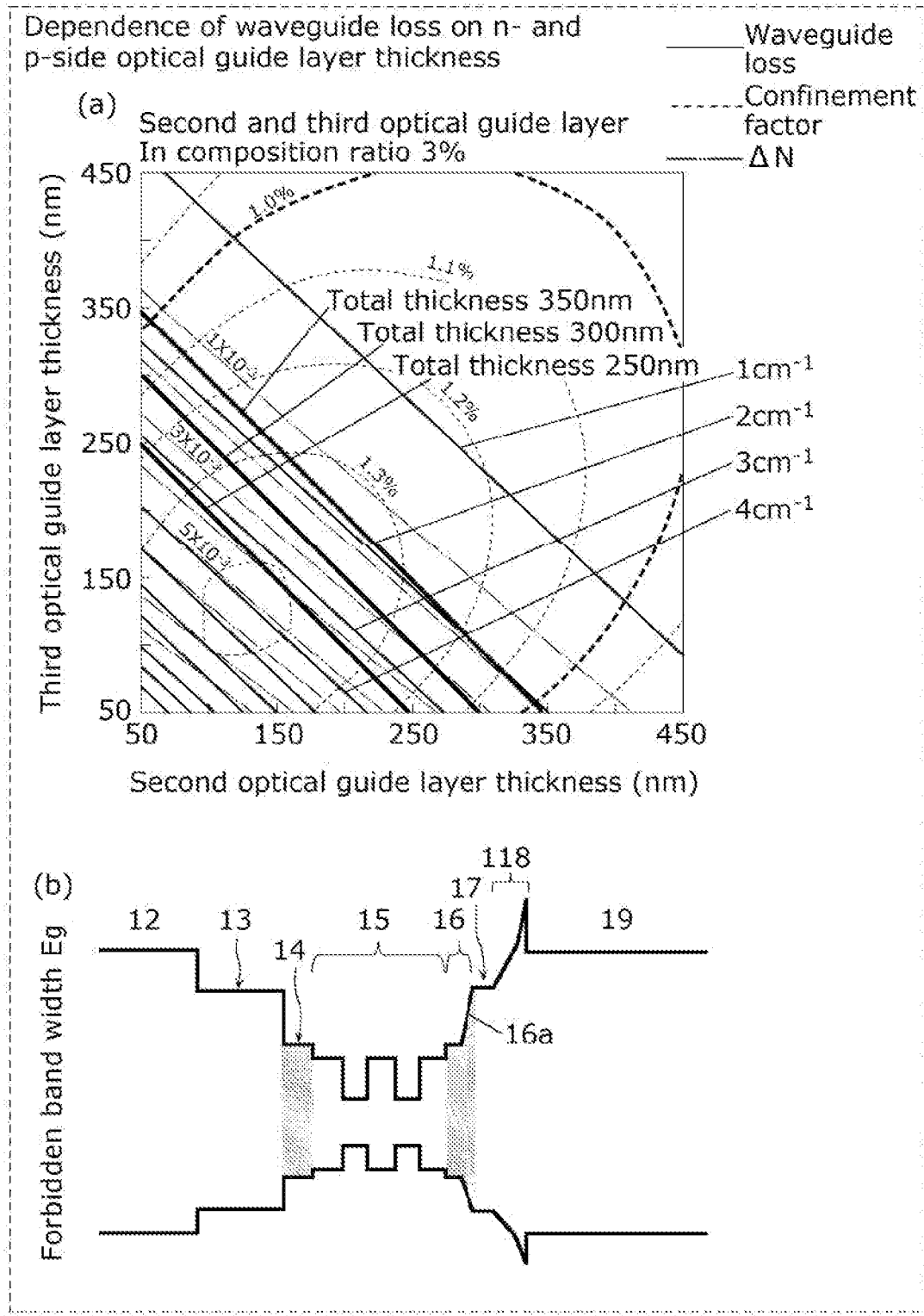
FIG. 19 is a diagram illustrating a relationship between waveguide loss and a confinement factor of the semiconductor light-emitting device according to Embodiment 2, and the thicknesses of a second optical guide layer and a third optical guide layer, when an In composition ratio of the second optical guide layer and the third optical guide layer is 3%.

A relationship between the waveguide loss of the semiconductor light-emitting device according to Embodiment 2, and the thicknesses of second optical guide layer 14 and third optical guide layer 16, will be described next with reference to FIG. 19. FIG. 19 is a diagram illustrating a relationship between waveguide loss and a confinement factor of the semiconductor light-emitting device according to Embodiment 2, and the thicknesses of second optical guide layer 14 and third optical guide layer 16, when the In composition ratio of second optical guide layer 14 and third optical guide layer 16 is 3%. Graph (a) in FIG. 19 indicates a simulation result for waveguide loss and the confinement factor with respect to the thickness of second optical guide layer 14 (the horizontal axis) and the thickness of third optical guide layer 16 (the vertical axis), when the In composition ratios of second optical guide layer 14 and third optical guide layer 16 are set to 3%. Schematic diagram (b) in FIG. 19 is a diagram schematically illustrating a forbidden band width Eg distribution of the semiconductor light-emitting device according to Embodiment 2. In schematic diagram (b), parts corresponding to second optical guide layer 14 and third optical guide layer 16 are hatched.

In this simulation, the thickness of electron barrier layer 118 is 5 nm, the thickness of the first region is 2.5 nm, and the Al composition ratio increases linearly from 0% to 5% in the first region. The thickness of the second region is also 2.5 nm, and the Al composition ratio in the second region increases linearly from 5% to the maximum Al composition ratio (30%).

The maximum impurity concentration position is located at the active layer 15-side interface of electron barrier layer 118, and the maximum impurity concentration is set to $2\times10^{19}$ cm$^{-3}$ so as to achieve an effect of lowering the operating voltage without increasing waveguide loss.

Second semiconductor layer 19 is located adjacent to electron barrier layer 118, and has a low impurity concentration region having an impurity concentration of $2\times10^{18}$ cm$^{-3}$ and a thickness of 170 nm.

Graph (a) in FIG. 19 indicates simulation results for waveguide loss, a difference in the effective refractive index ($\Delta N$) between inside and outside the ridge, and the light confinement factor to active layer 15 in the layering direction for a case where, in this structure, the ridge width W is set to 30 μm while varying the thicknesses of second optical guide layer 14 and third optical guide layer 16, which are constituted by InGaN.

"$\Delta N$" refers to the difference (N1−N2) between the effective refractive index in the layering direction determined by the layered structure of the region inside the ridge (N1) and the effective refractive index in the layering direction determined by the layered structure of the region outside the ridge (N2). When $\Delta N$ is high, the effect of confining the optical field to the interior of the waveguide in the horizontal direction is higher, and the light confinement effect in the horizontal direction of the optical field is higher. When the semiconductor light-emitting device has a single ridge structure with a ridge width W of at least 20 μm, the effect of confining light to the interior of the ridge will decrease and stable transverse mode oscillation will not be possible unless $\Delta N$ is set to at least $1\times10^{-3}$.

As indicated by graph (a) in FIG. 19, increasing the total thickness of second optical guide layer 14 and third optical guide layer 16 increases the effect of confining the optical field propagating through the waveguide, to active layer 15 in the layering direction. In this case, the abundance ratio of the optical field in active layer 15, second optical guide layer 14, and third optical guide layer 16, which are not doped with impurities, increases, which reduces the influence of free carrier loss. The waveguide loss decreases as a result.

For example, if the thickness of second optical guide layer 14 is 180 nm and the thickness of third optical guide layer 16 is 120 nm, $\Delta N$ is $4.8\times10^{-3}$ and the waveguide loss is 3.5 cm$^{-1}$, resulting in stable transverse mode operation and low waveguide loss of no more than 4 cm$^{-1}$. As a result, the current-optical output characteristics becomes close to linear, and a high slope efficiency is obtained. Note that "slope efficiency" is the ratio of the increase in optical output ($\Delta P$) to the injection current ($\Delta I$) after laser oscillation ($\Delta P/\Delta I$).

Additionally, it can be seen from graph (a) in FIG. 19 that if the total thickness of second optical guide layer 14 and third optical guide layer 16 is set to 350 nm, the waveguide loss can be reduced to 1.8 cm$^{-1}$ when $\Delta N$ is $1.1\times10^{-3}$. Additionally, it can be seen that if the total thickness of second optical guide layer 14 and third optical guide layer 16 is set to 300 nm, the waveguide loss can be reduced to approximately 2.6 cm$^{-1}$ when $\Delta N$ is at least $2\times10^{-3}$.

Accordingly, if the total thickness of second optical guide layer 14 and third optical guide layer 16 is set to at least 300 nm and at most 350 nm, and $\Delta N$ is set to at least $1\times10^{-3}$, stable transverse mode operation can be achieved, and a low waveguide loss of at most 2.6 cm$^{-1}$ can be achieved as well.

Figure 20:
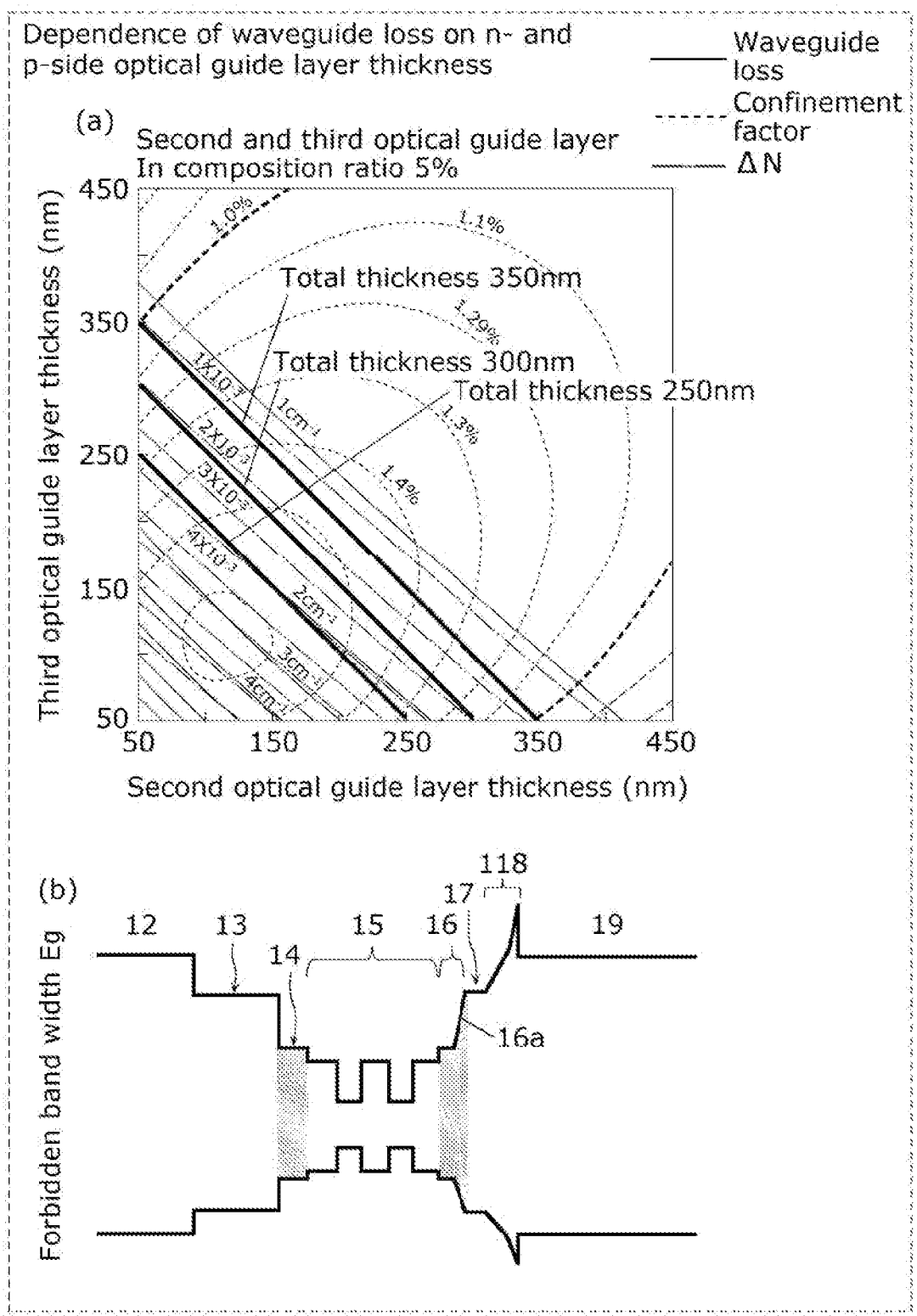
FIG. 20 is a diagram illustrating a relationship between waveguide loss and the confinement factor of the semiconductor light-emitting device according to Embodiment 2, and the thicknesses of the second optical guide layer and the third optical guide layer, when the In composition ratio of the second optical guide layer and the third optical guide layer is 5%.

A relationship between waveguide loss of the semiconductor light-emitting device according to Embodiment 2, and the thicknesses of second optical guide layer 14 and third optical guide layer 16, when the In composition ratio of second optical guide layer 14 and third optical guide layer 16 is 5%, will be described next with reference to FIG. 20. FIG. 20 is a diagram illustrating a relationship between waveguide loss and a confinement factor of the semiconductor light-emitting device according to Embodiment 2, and the thicknesses of second optical guide layer 14 and third optical guide layer 16, when the In composition ratio of second optical guide layer 14 and third optical guide layer 16 is 5%. Graph (a) in FIG. 20 indicates a simulation result for waveguide loss and the confinement factor with respect to the thickness of second optical guide layer 14 (the horizontal axis) and the thickness of third optical guide layer 16 (the vertical axis), when the In composition ratios of second optical guide layer 14 and third optical guide layer 16 are set to 5%. Schematic diagram (b) in FIG. 20 is a diagram schematically illustrating a forbidden band width Eg distribution of the semiconductor light-emitting device according to Embodiment 2. In schematic diagram (b), parts corresponding to second optical guide layer 14 and third optical guide layer 16 are hatched.

This simulation was carried out under the same conditions as the simulation described with reference to FIG. 19, aside from the In composition ratio of second optical guide layer 14 and third optical guide layer 16 being 5%.

Graph (a) in FIG. 20 indicates simulation results for waveguide loss, a difference in the effective refractive index (ΔN) between inside and outside the ridge, and the light confinement factor to active layer 15 in the layering direction for a case where, in this structure, the ridge width W is set to 30 μm while varying the thicknesses of second optical guide layer 14 and third optical guide layer 16, which are constituted by InGaN.

As indicated by graph (a) in FIG. 20, increasing the In composition ratio of second optical guide layer 14 and third optical guide layer 16 increases the effect of confining the optical field propagating through the waveguide, to active layer 15 in the layering direction. In this case, the abundance ratio of the optical field in active layer 15, the second optical guide layer, and the third optical guide layer, which are not doped with impurities, increases, which reduces the influence of free carrier loss. The waveguide loss decreases as a result.

For example, if the thickness of second optical guide layer 14 is 180 nm and the thickness of third optical guide layer 16 is 120 nm, ΔN is $3.9 \times 10^{-3}$ and the waveguide loss is 2 $cm^{-1}$, resulting in stable transverse mode operation and low waveguide loss of no more than 2 $cm^{-1}$. As a result, the current-optical output characteristics becomes close to linear, and a high slope efficiency is obtained.

Additionally, it can be seen from graph (a) in FIG. 20 that if the total thickness of second optical guide layer 14 and third optical guide layer 16 is set to 350 nm, the waveguide loss can be reduced to 1.2 $cm^{-1}$ when ΔN is $1.1 \times 10^{-3}$. Additionally, it can be seen that if the total thickness of second optical guide layer 14 and third optical guide layer 16 is set to 300 nm, the waveguide loss can be reduced to approximately 1.7 $cm^{-1}$ when ΔN is approximately $2 \times 10^{-3}$.

Additionally, it can be seen that if the total thickness of second optical guide layer 14 and third optical guide layer 16 is set to 250 nm, the waveguide loss can be reduced to approximately 2 $cm^{-1}$ when ΔN is approximately $3.5 \times 10^{-3}$.

Accordingly, if the total thickness of second optical guide layer 14 and third optical guide layer 16 is set to at least 300 nm and at most 350 nm, and ΔN is set to at least $1 \times 10^{-3}$, stable transverse mode operation can be achieved, and a low waveguide loss of at most 1.7 $cm^{-1}$ can be achieved as well.

Additionally, if the total thickness of second optical guide layer 14 and third optical guide layer 16 is set to at least 250 nm and at most 350 nm, and ΔN is set to at least $1 \times 10^{-3}$, stable transverse mode operation can be achieved, and a low waveguide loss of at most 2 $cm^{-1}$ can be achieved as well.

From the foregoing, when the In composition ratio range is at least 3% and at most 5% in each optical guide layer constituted by InGaN on the first conductivity side (the n side) and the second conductivity side (the p side), if the total thickness of second optical guide layer 14 and third optical guide layer 16 is set to at least 300 nm and at most 350 nm, ΔN of at least $1 \times 10^{-3}$ can be achieved while suppressing waveguide loss to at most 2.6 $cm^{-1}$.

Figure 21:
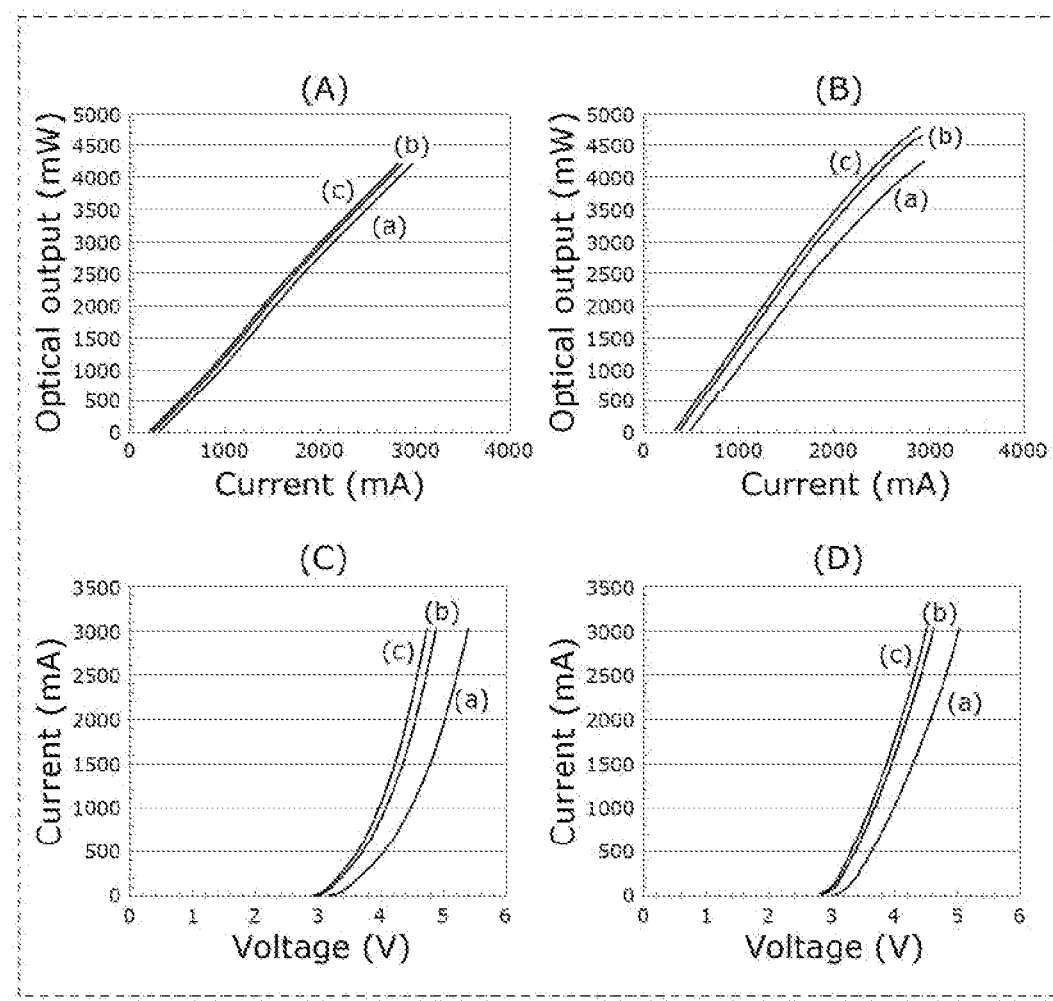
FIG. 21 is a diagram illustrating current-optical output characteristics and current-voltage characteristics of the semiconductor light-emitting device according to Embodiment 1.

2-2-16. Current-Optical Output Characteristics and Current-Voltage Characteristics Current-optical output characteristics and current-voltage characteristics of the semiconductor light-emitting device according to Embodiment 1 will be described next with reference to FIG. 21. FIG. 21 is a diagram illustrating current-optical output characteristics and current-voltage characteristics of the semiconductor light-emitting device according to Embodiment 1. Graphs (A), (B), (C), and (D) in FIG. 21 show the current-optical output characteristics at 25° C., the current-optical output characteristics at 85° C., the current-voltage characteristics at 25° C., and the current-voltage characteristics at 85° C., respectively, of the semiconductor light-emitting device.

Curve (a) in each graph represents the characteristics of the semiconductor light-emitting device according to a comparative example, which aside from the electron barrier layer has the same configuration as the semiconductor light-emitting device according to Embodiment 1. In this comparative example, the Al composition ratio distribution in the electron barrier layer, which is 5 nm thick, is uniform, and the Al composition ratio is 30%. The electron barrier layer is uniformly doped with an impurity (Mg) at a concentration of $1.5 \times 10^{19}$ $cm^{-3}$.

Curve (b) in each graph represents the characteristics of the semiconductor light-emitting device according to another comparative example, which aside from the electron barrier layer has the same configuration as the semiconductor light-emitting device according to Embodiment 1. In Comparative Example 2, the Al composition ratio in the electron barrier layer has a distribution that increases linearly from 0% to 30% with proximity to second semiconductor layer 19 in the layering direction. The electron barrier layer is uniformly doped with an impurity (Mg) at a concentration of $1.5 \times 10^{19}$ $cm^{-3}$.

Curve (c) in each graph represents the characteristics of semiconductor light-emitting device 100 according to Embodiment 1. In semiconductor light-emitting device 100, the Al composition ratio in electron barrier layer 18 has a distribution that increases linearly with proximity to second semiconductor layer 19 in the layering direction. The Al composition ratio is 0% at the active layer 15-side interface of electron barrier layer 18 and 30% at the second semiconductor layer 19-side interface. Additionally, the impurities (Mg) concentration in electron barrier layer 18 has a distribution that decreases linearly with proximity to second semiconductor layer 19 in the layering direction. The impurity concentration is $2.8 \times 10^{19}$ $cm^{-3}$ at the active layer 15-side interface of electron barrier layer 18. The average impurity concentration in electron barrier layer 18 is $1.5 \times 10^{19}$ $cm^{-3}$.

As can be seen from the graphs in FIG. 21, the semiconductor light-emitting device according to Embodiment 1 makes it possible to achieve a lower operating voltage and improved temperature characteristics by sloping the Al composition ratio in electron barrier layer 18 and setting the maximum impurity concentration position close to the active layer 15-side interface.

Embodiment 3

A semiconductor light-emitting device according to Embodiment 3 will be described next. The semiconductor light-emitting device according to the present embodiment differs from semiconductor light-emitting device 100 according to Embodiment 1 in terms of the configuration of the active layer, but is the same in other respects. The semiconductor light-emitting device according to the present embodiment will be described below with reference to FIGS. 22A and 22B, focusing on the differences from Embodiment 1.

Figure 22A:
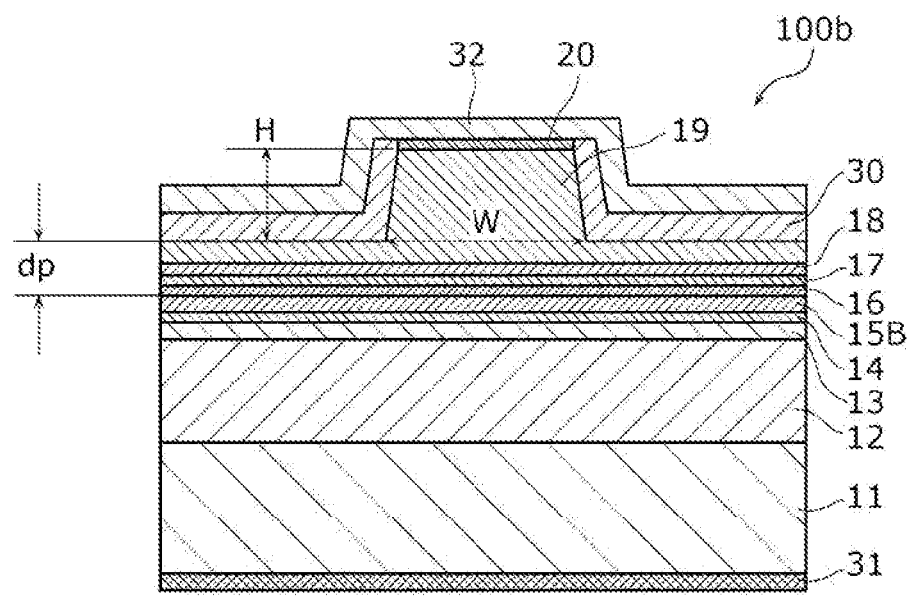
FIG. 22A is a schematic cross-sectional view illustrating the overall configuration of a semiconductor light-emitting device according to Embodiment 3.

FIG. 22A is a schematic cross-sectional view illustrating the overall configuration of semiconductor light-emitting device 100b according to the present embodiment. FIG. 22A illustrates a cross-section perpendicular to a resonance direction of semiconductor light-emitting device 100b. As illustrated in FIG. 22A, like semiconductor light-emitting device 100 according to Embodiment 1, semiconductor light-emitting device 100b according to the present embodiment includes substrate 11, first semiconductor layer 12, active layer 15B, electron barrier layer 18, and second semiconductor layer 19. Semiconductor light-emitting device 100b further includes first optical guide layer 13, second optical guide layer 14, third optical guide layer 16, intermediate layer 17, contact layer 20, current blocking layer 30, n-side electrode 31, and p-side electrode 32.

Figure 22B:
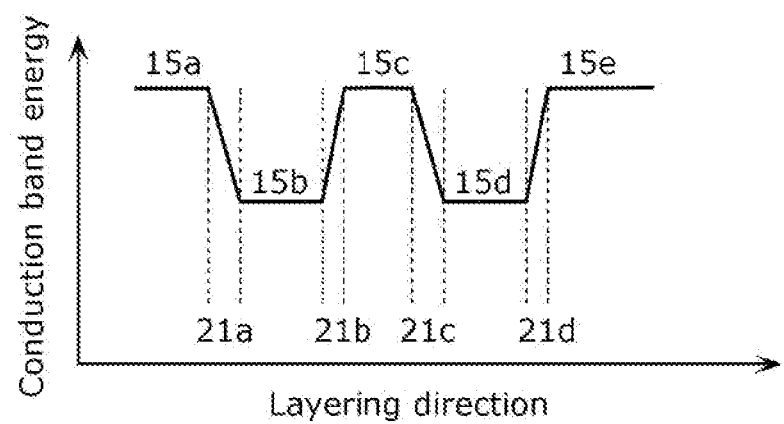
FIG. 22B is a graph illustrating a conduction band energy distribution of an active layer with respect to the layering direction, according to Embodiment 3.

Active layer 15B according to the present embodiment will be described next with reference to FIG. 22B. FIG. 22B is a graph illustrating a conduction band energy distribution of active layer 15B with respect to the layering direction, according to the present embodiment.

As illustrated in FIG. 22B, active layer 15B has a DQW structure, including two well layers 15b and 15d and three barrier layers 15a, 15c, and 15e, like active layer 15 according to Embodiment 1. The two well layers 15b and 15d are respectively disposed between two adjacent barrier layers of the three barrier layers 15a, 15c, and 15e. In the present embodiment, active layer 15B further includes four composition ratio gradient layers 21a to 21d.

Each of the four composition ratio gradient layers 21a to 21d is between one well layer of the two well layers 15b and 15d and one barrier layer of the plurality of barrier layers 15a, 15c, and 15e adjacent to the stated one well layer. An In composition ratio of each of the four composition ratio gradient layers 21a to 21d changes continuously from an In composition ratio of the one well layer to an In composition ratio of the one barrier layer. In other words, each of the four composition ratio gradient layers 21a to 21d has the same In composition ratio at the interface with the adjacent well layer as the adjacent well layer, and the same In composition ratio at the interface with the adjacent barrier layer as the adjacent barrier layer. The In composition ratio of each of the four composition ratio gradient layers 21a to 21d decreases monotonically from the interface with the adjacent barrier layer to the interface with the adjacent well layer.

Figure 23:
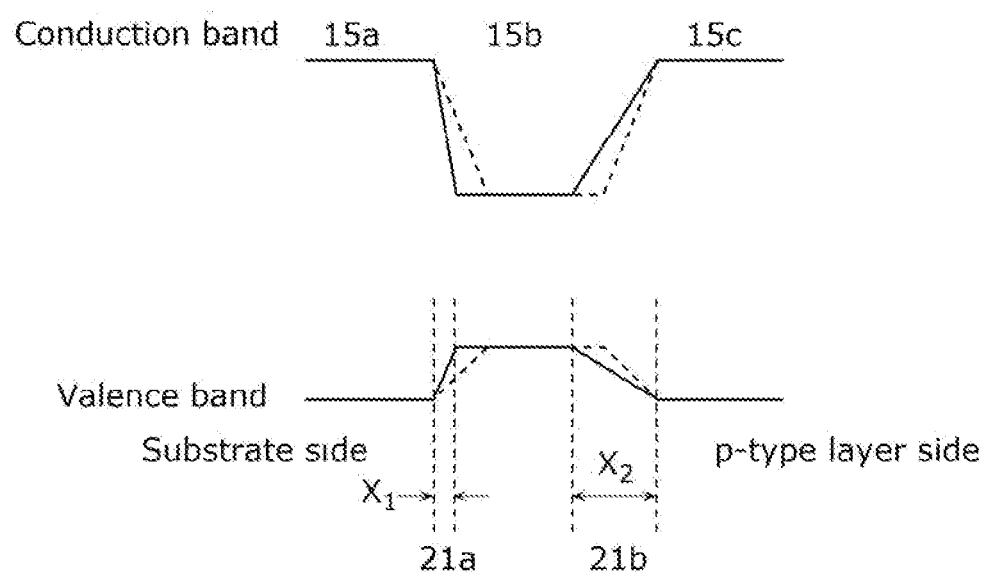
FIG. 23 is a schematic diagram illustrating the band structure in a region near a well layer, according to Embodiment 3.

Active layer 15B according to the present embodiment will be described in further detail next with reference to FIG. 23. FIG. 23 is a schematic diagram illustrating the band structure in a region near well layer 15b, according to the present embodiment. FIG. 23 illustrates the band structure in well layer 15b, barrier layers 15a and 15c, and composition ratio gradient layers 21a and 21b.

In this structure, the thicknesses of composition ratio gradient layer 21a and composition ratio gradient layer 21b are $X_1$ and $X_2$, respectively. At this time, well layer 15b is located closer to substrate 11 with respect to an intermediate position between barrier layer 15a and barrier layer 15c when $X_1-X_2<0$, in the intermediate position when $X_1-X_2=0$, and closer to second semiconductor layer 19 when $X_1-X_2>0$.

Likewise, the thicknesses of composition ratio gradient layer 21c and composition ratio gradient layer 21d are $X_3$ and $X_4$, respectively (not shown). At this time, well layer 15d is located closer to substrate 11 with respect to an intermediate position between barrier layer 15c and barrier layer 15d when $X_3-X_4<0$, in the intermediate position when $X_3-X_4=0$, and closer to second semiconductor layer 19 (i.e., the p-type layer) when $X_3-X_4>0$.

Figure 24:
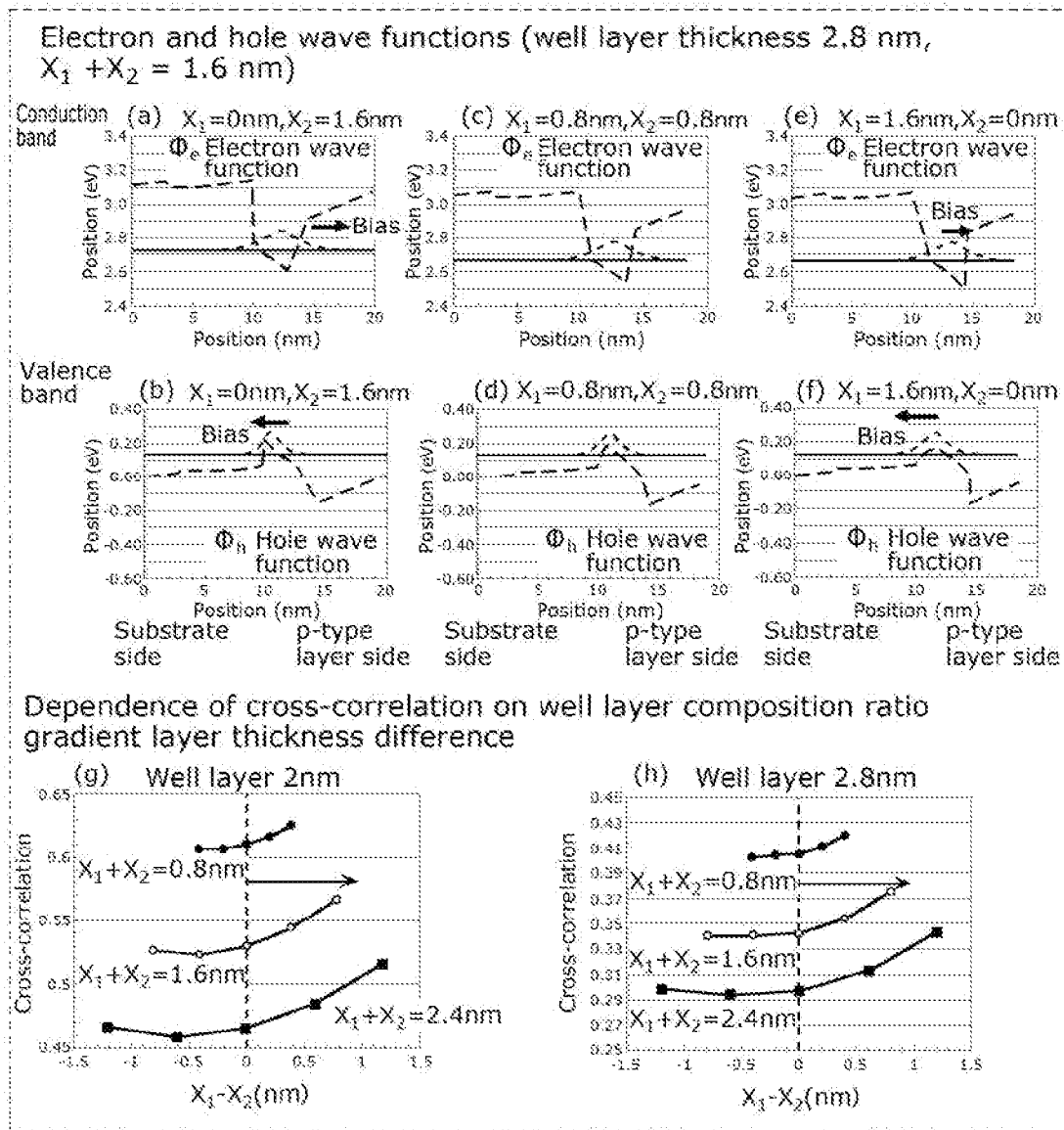
FIG. 24 is a diagram illustrating a relationship between the band structure and wave function, and the thickness of a composition ratio gradient layer, in the semiconductor light-emitting device according to Embodiment 3.

Here, results of calculating a wave function for a ground state of the band structure and carriers when the thicknesses of composition ratio gradient layers 21a and 21b of active layer 15B are varied in semiconductor light-emitting device 100b according to the present embodiment will be described with reference to FIG. 24. FIG. 24 is a diagram illustrating a relationship between the band structure and wave function, and the thickness of a composition ratio gradient layer, in semiconductor light-emitting device 100b according to the present embodiment. Graphs (a) and (b) in FIG. 24 indicate the band structure of the conduction band and valence band and the wave functions of the ground states of electrons and holes when $X_1$ is set to 0 nm, $X_2$ is set to 1.6 nm, and the thickness of well layer 15b is set to 2.8 nm. Graphs (c) and (d) in FIG. 24 indicate the band structure of the conduction band and valence band and the wave functions of the ground states of electrons and holes when $X_1$ is set to 0.8 nm, $X_2$ is set to 0.8 nm, and the thickness of well layer 15b is set to 2.8 nm. Graphs (e) and (f) in FIG. 24 indicate the band structure of the conduction band and valence band and the wave functions of the ground states of electrons and holes when $X_1$ is set to 1.6 nm, $X_2$ is set to 0 nm, and the thickness of well layer 15b is set to 2.8 nm. In graphs (a) to (f) in FIG. 24, the horizontal axis represents the position in the layering direction, and the vertical axis represents potential. In graphs (a) to (f) in FIG. 24, the wave function, band structure, and ground level energy of the carrier are represented by the dotted line, the broken line, and the solid line, respectively. The solid lines in graphs (a), (c) and (e) of FIG. 24 represent the ground level energy potential of electrons formed in the conduction band, and the solid lines in graphs (b), (d) and (f) represent the ground level energy potential of holes formed in the valence band.

FIG. 24 also indicates a relationship between the thickness of well layer 15b and the cross-correlation of the electron wave function and the hole wave function. Graph (g) in FIG. 24 indicates the relationship between a difference between $X_1$ and $X_2$ ($X_1-X_2$) and the cross-correlation when the thickness of well layer 15b is set to 2 nm. Graph (h) in FIG. 24 indicates the relationship between a difference between $X_1$ and $X_2$ ($X_1-X_2$) and the cross-correlation when the thickness of well layer 15b is set to 2.8 nm. Graphs (g) and (h) in FIG. 24 indicate the results of calculating the cross-correlation when the sum of $X_1$ and $X_2$ is 0.8 nm, 1.6 nm, or 2.4 nm.

Assuming that the electron and hole wave functions are φe and φh, respectively, the cross-correlation between the electron wave function and the hole wave function is expressed by Equation 1 below.

$$\int |\phi_e \phi_h|^2 dx \qquad \text{Equation 1}$$

In a semiconductor laser device having nitride semiconductors layered on the (0001) surface of substrate 11, due to the piezoelectric effect, the graph representing the band potential of well layer 15b is slanted such that the second semiconductor layer 19 (p-type layer) side becomes lower. As a result, the electron wave function is biased toward second semiconductor layer 19, and the hole wave function toward substrate 11. The electron wave function is more likely to spread outside well layer 15b than the hole wave function, and is more susceptible to influence of the composition ratio gradient layer.

When composition ratio gradient layer 21a is located between well layer 15b and barrier layer 15a (i.e., when composition ratio gradient layer 21a is located on the substrate 11 side of well layer 15b), the electron wave function expands toward the substrate 11 side more easily, and cross-correlation with the hole wave function increases. Making the thickness $X_1$ of composition ratio gradient layer 21a on the substrate 11 side of well layer 15b thicker than the thickness $X_2$ of composition ratio gradient layer 21b on the second semiconductor layer 19 side increases the cross-correlation between the electron wave function and the hole wave function.

Locating composition ratio gradient layer 21a on the substrate 11 side of well layer 15b reduces the bias of the electron wave function, which in turn increases the cross-correlation between the electron wave function and the hole wave function. The increase in cross-correlation increases the light emission recombination probability and improves the amplification gain in active layer 15B, which reduces the oscillation threshold current value and the operating carrier density, and therefore reduces the leakage current and the operating current.

Figure 25:
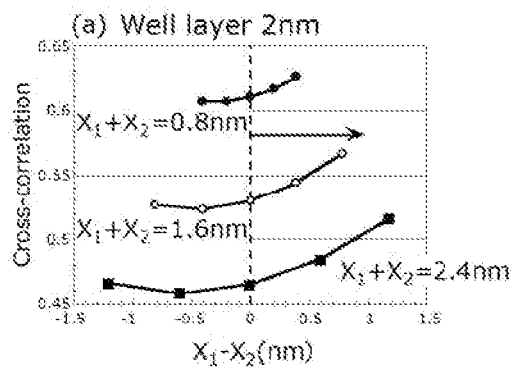
FIG. 25 is a graph illustrating a relationship between the In composition ratio of a barrier layer, and cross-correlation of an electron wave function and a hole wave function, according to Embodiment 3.
Figure 25:
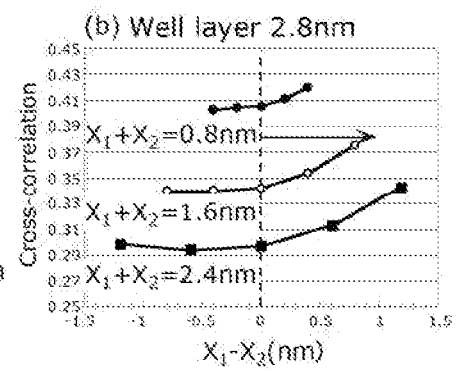
Figure 25:
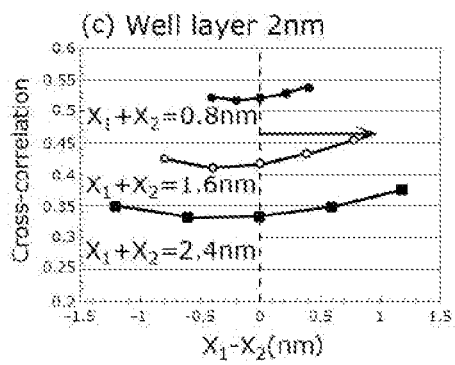
Figure 25:
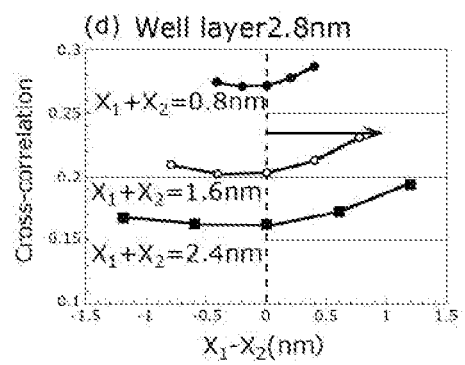

A relationship between the In composition ratio of barrier layers 15a and 15c, and the cross-correlation of the electron wave function and the hole wave function, will be described next with reference to FIG. 25. FIG. 25 is a graph illustrating a relationship between the In composition ratio of barrier layers 15a and 15c, and cross-correlation of an electron wave function and a hole wave function, according to the present embodiment. Graphs (a) and (b) in FIG. 25 indicate the results of calculating the cross-correlation when the In composition ratio of barrier layers 15a and 15c is 0.04 (i.e., 4%). Graphs (c) and (d) in FIG. 25 indicate the results of calculating the cross-correlation when the In composition ratio of barrier layers 15a and 15c is 0. Graphs (a) and (c) in FIG. 25 indicate the relationship between a difference between $X_1$ and $X_2$ ($X_1-X_2$) and the cross-correlation when the thickness of well layer 15b is set to 2 nm. Graphs (b) and (d) in FIG. 25 indicate the relationship between a difference between $X_1$ and $X_2$ ($X_1-X_2$) and the cross-correlation when the thickness of well layer 15b is set to 2.8 nm. The graphs in FIG. 25 indicate the results of calculating the cross-correlation when the sum of $X_1$ and $X_2$ is 0.8 nm, 1.6 nm, or 2.4 nm.

Electrons have a smaller effective mass than holes, and thus when the composition ratio gradient layer according to the present embodiment is provided, the wave function spreads significantly outside well layer 15b and is more likely to be influenced by the composition ratio gradient layer. As such, increasing the In composition ratio of barrier layers 15a and 15c has a greater effect on improving the cross-correlation.

Making the thickness $X_1$ of composition ratio gradient layer 21a on the substrate 11 side of well layer 15b relatively thicker than the thickness $X_2$ of composition ratio gradient layer 21b on the second semiconductor layer 19 side makes it easier for the electron wave function to be distributed to an intermediate position of well layer 15b in the layering direction, which increases the cross-correlation between the electron wave function and the hole wave function.

If well layer 15b becomes too thin, the light confinement to well layer 15b in the layering direction drops, leading to an increase in the oscillation threshold current value. Conversely, if well layer 15b becomes too thick, a high In composition ratio of at least 15% is required in well layer 15b to obtain blue laser light in the 450 nm band. Accordingly, well layer 15b cannot be made too thick, because the piezoelectric field in well layer 15b will increase, the band slope will also increase, and the cross-correlation between the electron wave function and the hole wave function will decrease.

As indicated in FIGS. 24 and 25, for example, the thickness of well layer is at least 2 nm and at most 2.8 nm, the total thickness ($X_1+X_2$) of the well layer and the two adjacent composition ratio gradient layers is at least 0.8 nm and at most 2.4 nm, and the In composition ratio of the barrier layer is at least 0% and at most 4%. The first conductivity type may be the n-type, the second conductivity type may be the p-type, and of the plurality of composition ratio gradient layers, the composition ratio gradient layer adjacent to the substrate 11 side of one well layer may be thicker than the composition ratio gradient layer adjacent to the electron barrier layer 18 side of the stated one well layer. In this case, the cross-correlation can be increased without causing a drop in light confinement to well layer 15b. This makes it possible to reduce the oscillation threshold current value and operating current, which in turn makes it possible to suppress the increase in power consumption during high-temperature and high-output operation. The reliability of the semiconductor light-emitting device can thus be ensured for long-term operation.

Embodiment 4

A semiconductor light-emitting device according to Embodiment 4 will be described next. The semiconductor light-emitting device according to the present embodiment differs from semiconductor light-emitting device 100b according to Embodiment 3 in that the active layer has a single well layer, but is the same in other respects. The semiconductor light-emitting device according to the present embodiment will be described below with reference to FIGS. 26A and 26B, focusing on the differences from semiconductor light-emitting device 100b according to Embodiment 3.

Figure 26A:
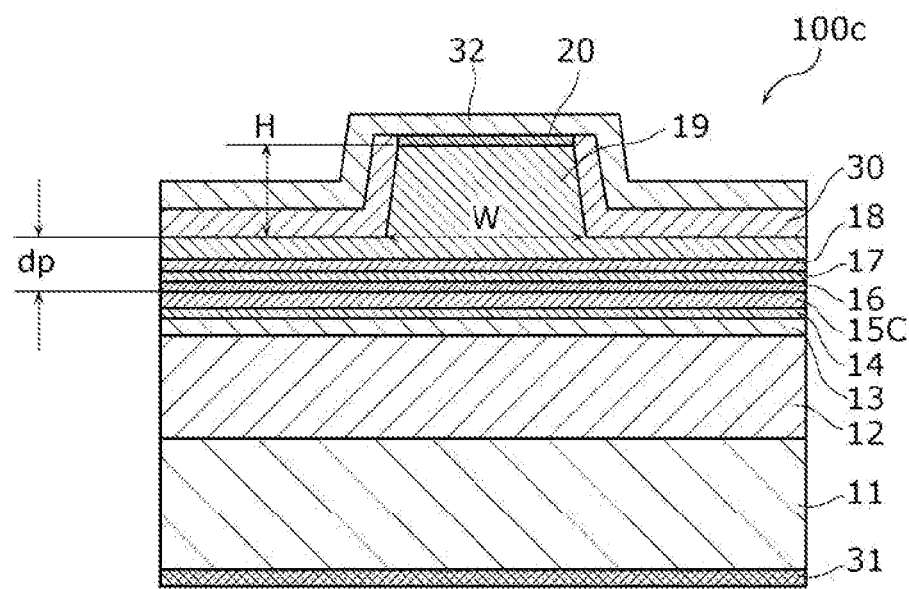
FIG. 26A is a schematic cross-sectional view illustrating the overall configuration of a semiconductor light-emitting device according to Embodiment 4.

FIG. 26A is a schematic cross-sectional view illustrating the overall configuration of semiconductor light-emitting device 100c according to the present embodiment. FIG. 26A illustrates a cross-section perpendicular to a resonance direction of semiconductor light-emitting device 100c. As illustrated in FIG. 26A, like semiconductor light-emitting device 100b according to Embodiment 3, semiconductor light-emitting device 100c according to the present embodiment includes substrate 11, first semiconductor layer 12, active layer 15C, electron barrier layer 18, and second semiconductor layer 19. Semiconductor light-emitting device 100c further includes first optical guide layer 13, second optical guide layer 14, third optical guide layer 16, intermediate layer 17, contact layer 20, current blocking layer 30, n-side electrode 31, and p-side electrode 32.

Figure 26B:
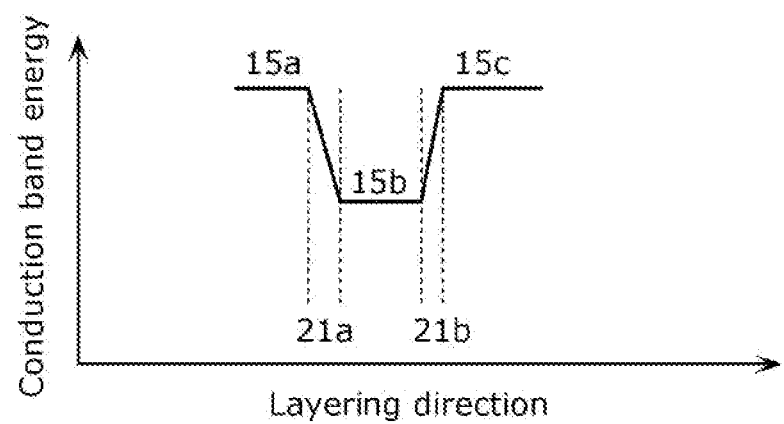
FIG. 26B is a graph illustrating a conduction band energy distribution of an active layer with respect to the layering direction, according to Embodiment 4.

Active layer 15C according to the present embodiment will be described next with reference to FIG. 26B. FIG. 26B is a graph illustrating a conduction band energy distribution of active layer 15C with respect to the layering direction, according to the present embodiment.

As illustrated in FIG. 26C, active layer 15C has one well layer 15b and two barrier layers 15a and 15b. In other words, active layer 15C has a single quantum well structure in which the number of well layers is one. Active layer 15C further has composition ratio gradient layers 21a and 21b. The configurations of composition ratio gradient layers 21a and 21b are the same as composition ratio gradient layers 21a and 21b according to Embodiment 3.

Figure 27A:
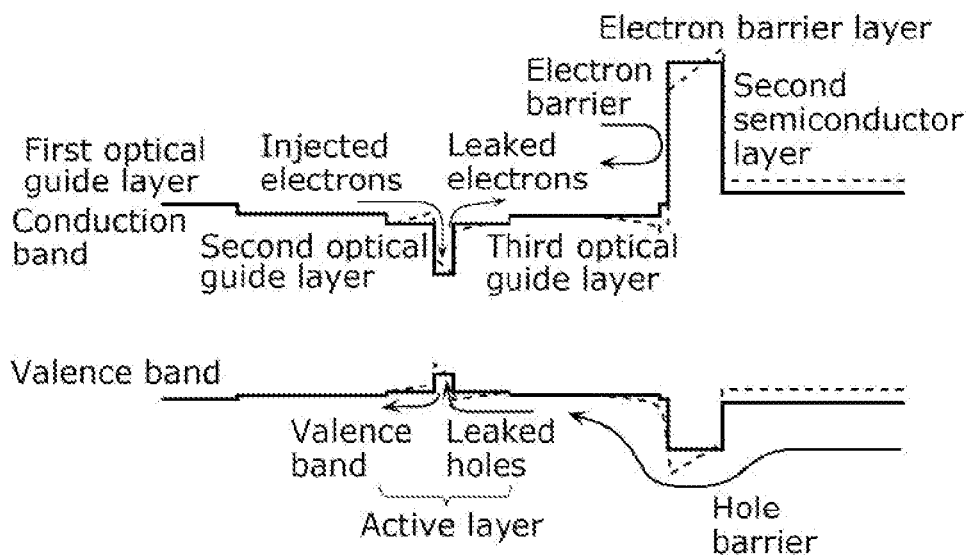
FIG. 27A is a schematic diagram illustrating a band structure and carrier state near an active layer of a semiconductor light-emitting device according to a comparative example.
Figure 27B:
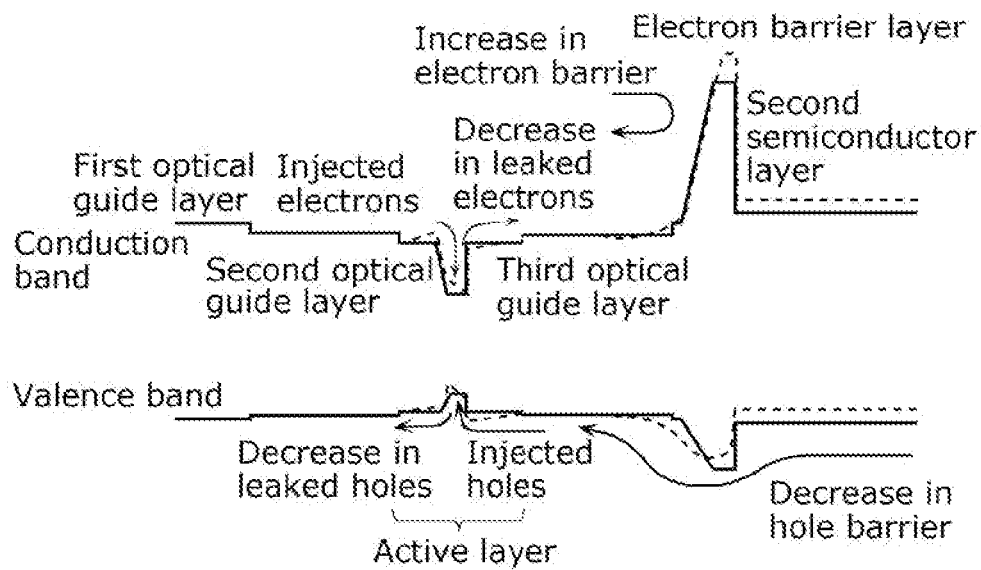
FIG. 27B is a schematic diagram illustrating a band structure and carrier state near an active layer of the semiconductor light-emitting device according to Embodiment 4.

The effects of semiconductor light-emitting device 100c according to the present embodiment will be described with reference to FIGS. 27A and 27B, with comparison to a comparative example. FIGS. 27A and 27B are schematic diagrams illustrating a band structure and carrier state near an active layer of the semiconductor light-emitting device according to the comparative example and the present embodiment, respectively. The semiconductor light-emitting device according to the comparative example, illustrated in FIG. 27A, differs from semiconductor light-emitting device 100c according to Embodiment 4 in that the Al composition ratio of the electron barrier layer is uniform, but is the same in other respects.

In the semiconductor light-emitting device according to the comparative example, the electron barrier layer is constituted by an AlGaN layer having a uniform Al composition ratio, and the piezoelectric effect generated in the electron barrier layer lowers the band potential of the valence band of the electron barrier layer (see the broken line in FIG. 27A). This increases the potential barrier with respect to holes.

In an active layer having a single quantum well structure, the light confinement factor to the well layer in the layering direction is low, which can easily lead to an increase in the oscillation threshold, the operating current value, and the operating carrier density. As such, during high-temperature and high-output operation, electrons injected into the active layer are thermally excited and easily leak to the second semiconductor layer side.

The potential barrier for holes in the electron barrier layer is also high, and thus a high operating voltage is required to inject holes into the active layer, resulting in increased power consumption. An increase in power consumption leads to an increase in self-heating of the semiconductor light-emitting device. Employing an active layer having a single quantum well structure in this manner makes it more likely that leakage current will occur, leading to an increase in the operating current and operating carrier density during high-temperature and high-output operation and resulting in thermal saturation of optical output during high-temperature and high-output operation. It is therefore possible that the reliability will decrease for long-term high-temperature and high-output operation.

On the other hand, in semiconductor light-emitting device 100c according to the present embodiment, the Al composition ratio in electron barrier layer 18 has a distribution that increases gradually with proximity to second semiconductor layer 19 in the layering direction. Mg, which is an impurity, is doped so as to take on a maximum value at a position between the active layer 15C-side interface and the intermediate position of the increasing Al composition ratio region in the layering direction.

This makes it possible to reduce the potential barrier of electron barrier layer 18 with respect to holes without increasing the waveguide loss, which makes it possible to reduce the operating voltage.

In active layer 15C, the In composition ratio is sloped providing composition ratio gradient layer 21a on the substrate 11 side of well layer 15b. This makes it possible to increase the cross-correlation between the electron wave function and the hole wave function, and reduce the hole barrier in electron barrier layer 18.

As a result, with semiconductor light-emitting device 100c according to the present embodiment, the occurrence of leakage current in active layer 15C, which has a single quantum well structure, can be suppressed, which makes it possible to reduce the operating current. Accordingly, using the single quantum well structure and the electron barrier layer structure according to the present embodiment makes it possible to ensure reliability in long-term operation at high temperature and high power in semiconductor light-emitting device 100c, which uses an active layer having a single quantum well structure.

Variation on Embodiment 4

A variation on the semiconductor light-emitting device according to Embodiment 4 will be described next. Although the foregoing embodiments described semiconductor light-emitting devices which emit blue laser light as an oscillation wavelength of 450 nm, the wavelength band of the laser light emitted by the semiconductor light-emitting device is not limited thereto. The present variation will describe a semiconductor light-emitting device that emits blue-violet laser light at an oscillation wavelength of 405 nm as an example of a semiconductor light-emitting device having an oscillation wavelength aside from the 450 nm band, focusing on the differences from semiconductor light-emitting device 100c according to Embodiment 4.

The semiconductor light-emitting device according to the present variation has a layer configuration similar to that of semiconductor light-emitting device 100c according to Embodiment 4, illustrated in FIGS. 26A and 26B. In other words, the semiconductor light-emitting device according to the present variation includes substrate 11, first semiconductor layer 12, active layer 15C, electron barrier layer 18, and second semiconductor layer 19. The semiconductor light-emitting device according to the present variation further includes first optical guide layer 13, second optical guide layer 14, third optical guide layer 16, intermediate layer 17, contact layer 20, current blocking layer 30, n-side electrode 31, and p-side electrode 32.

First semiconductor layer 12 according to the present variation is a 3.0 µm-thick n-type AlGaN layer. First optical guide layer 13 is a 130 nm-thick n-type GaN layer. Second optical guide layer 14 is a 170 nm-thick InGaN layer. Third optical guide layer 16 is a 40 nm-thick InGaN layer. Intermediate layer 17 is a 3 nm-thick p-type GaN layer. Electron barrier layer 18 is a p-type AlGaN layer. Second semiconductor layer 19 is a 660 nm-thick p-type AlGaN cladding layer. Contact layer 20 is a 50 nm-thick p-type GaN layer. Current blocking layer 30, n-side electrode 31, and p-side electrode 32 have the same configurations as in semiconductor light-emitting device 100c according to Embodiment 4 (and semiconductor light-emitting device 100 according to Embodiment 1). The ridge width W is approximately 30 µm in the present variation as well. The resonator length of the semiconductor light-emitting device is approximately 1,200 µm.

Here, in the present variation, in order to confine light to active layer 15C in the layering direction, the Al composition ratios of first semiconductor layer 12 constituted by an n-type AlGaN layer and second semiconductor layer 19 constituted by a p-type AlGaN layer are set to 0.026 (2.6%). As a result, the refractive indices of first semiconductor layer 12 and second semiconductor layer 19 become smaller than the effective refractive indices in the optical field range of the semiconductor light-emitting device, and these layers therefore function as cladding layers.

Active layer 15C according to the present variation has a single quantum well structure, and includes a single well layer 15b and two barrier layers 15a and 15c. To achieve laser oscillation at a wavelength of 405 nm, well layer 15b is constituted by undoped InGaN having a thickness of 7.5 nm and an In composition ratio of 0.066 (6.6%). Barrier layers 15a and 15c are InGaN layers having an In composition ratio of 0.008 (0.8%), and have thicknesses of 20 nm and 18 nm, respectively.

Active layer 15C further has composition ratio gradient layers 21a and 21b. Composition ratio gradient layer 21a is a layer located between barrier layer 15a and well layer 15b, having a thickness of 0.8 nm, and in which the In composition ratio changes continuously from 0.8% to 6.6% in the layering direction. Composition ratio gradient layer 21b is a layer located between barrier layer 15c and well layer 15b, having a thickness of 0.2 nm, and in which the In composition ratio changes continuously from 6.6% to 0.8% in the layering direction.

To achieve laser oscillation in the 400 nm wavelength band, well layer 15b may be made 4 nm thick, and the energy between quantum levels formed in well layer 15b may be increased. Alternatively, the In composition ratio of well layer 15b may be set to 0.056 (5.6%) to increase the band-gap energy of well layer 15b itself. In this case, the In composition ratio of composition ratio gradient layer 21a changes from 0.8% to 5.6% with proximity to well layer 15b in the layering direction, and the In composition ratio of composition ratio gradient layer 21b changes from 5.6% to 0.8% with distance from well layer 15b in the layering direction. The energy between the quantum levels formed in well layer 15b may be increased by making barrier layers 15a and 15c GaN layers. In this case, the In composition ratio of composition ratio gradient layers 21a and 21b changes from 0% to the In composition ratio of the well layer with proximity to well layer 15b in the layering direction.

Second optical guide layer 14 and third optical guide layer 16 are layers which, by containing In, have higher refractive indices than first semiconductor layer 12, which is constituted by n-type AlGaN, and second semiconductor layer 19, which is constituted by a p-type AlGaN layer. This makes it possible to increase the effective refractive index for the optical field propagating through a waveguide corresponding to the ridge, and increase the effect of confining the optical field in the layering direction by first semiconductor layer 12 and second semiconductor layer 19. Waveguide loss in the semiconductor light-emitting device can therefore be reduced.

In the 405 nm wavelength band, the difference in refractive index between AlGaN and InGaN at the same composition ratio is larger than that at 450 nm, and the effect of confining light to active layer 15C in the layering direction of the optical field can be enhanced without forming second optical guide layer 14. Accordingly, in the present variation, second optical guide layer 14, which is constituted by InGaN, does not necessarily need to be formed.

Here, when the In composition ratios of second optical guide layer 14 and third optical guide layer 16 are low, the effect of confining light in the layering direction toward the well layers decreases, which increases the oscillation threshold and the operating carrier density. This results in an increase in leakage current during high-temperature operation. Conversely, if the In composition ratio of second optical guide layer 14 and third optical guide layer 16 is high, optical absorption loss will occur for laser light having a wavelength of 405 nm. Accordingly, the In composition ratio of second optical guide layer 14 and third optical guide layer 16 may be at least 0.001 (0.1%) and at most 0.008 (0.8%). In the present variation, the In composition ratio of second optical guide layer 14 and third optical guide layer 16 is set to 0.003 (i.e., 0.3%) to increase the light confinement factor to the well layer in the layering direction.

Additionally, if the In composition ratio of second optical guide layer 14 is 0.008 (0.8%), which is higher than the In composition ratio of third optical guide layer 16, the optical distribution of the waveguide can be located closer to first semiconductor layer 12. Doping first semiconductor layer 12, which is constituted by an n-type AlGaN layer, with an n-type impurity at a concentration of $1 \times 10^{18}$ cm$^{-3}$ to $1 \times 10^{18}$ cm$^{-3}$ makes it possible to reduce the resistance of first semiconductor layer 12. This concentration is a lower impurity concentration than second semiconductor layer 19, which is doped with an impurity at a concentration of approximately $1 \times 10^{19}$ cm$^{-3}$. Accordingly, if the optical distribution is closer to first semiconductor layer 12, the free carrier loss can be reduced, which makes it possible to reduce waveguide loss.

Additionally, first optical guide layer 13 is a GaN layer having a lattice constant and forbidden band width energy of a magnitude between the lattice constants and the forbidden band width energies of first semiconductor layer 12 and second optical guide layer 14, respectively. This makes it possible to shrink spike-shaped deformation of the band structure caused by the piezoelectric effect arising at the interface, compared to a case where second optical guide layer 14 is formed directly above first semiconductor layer 12, which is constituted by AlGaN. This makes it possible to facilitate the electrical conduction of electrons to active layer 15C.

Intermediate layer 17 is a GaN layer having a lattice constant and forbidden band width energy of a magnitude between the lattice constants and the forbidden band width energies of electron barrier layer 18, which is constituted by AlGaN, and third optical guide layer 16, which is constituted by InGaN.

Additionally, if second optical guide layer 14, active layer 15C, and third optical guide layer 16, which contain In and have compressive lattice strain, are layered in that order, and electron barrier layer 18, which is constituted by an AlGaN layer having tensile lattice strain, is layered directly thereabove, stress arising at the interface will increase, and crystal defects may occur. On the other hand, if intermediate layer 17 is a GaN layer with a thickness of 3 nm, stress acting between third optical guide layer 16 and electron barrier layer 18 can be alleviated.

Third optical guide layer 16 may have composition ratio gradient region 16a on the intermediate layer 17 side, in which the In composition ratio gradually changes, in the layering direction, from the In composition ratio at the interface of third optical guide layer 16 with active layer 15C to the In composition ratio of intermediate layer 17. This makes it possible to disperse the polarization charge produced by the piezoelectric effect at the interface between third optical guide layer 16 and intermediate layer 17 into composition ratio gradient region 16a. This makes it possible to suppress a spike-shaped deformation of the band potential formed at the interface between third optical guide layer 16 and intermediate layer 17, which makes it possible to reduce the operating voltage.

If intermediate layer 17 becomes too thick, the distance between second semiconductor layer 19, which has a low refractive index, from active layer 15C will increase, which weakens the effect of confining light in the layering direction to active layer 15. Accordingly, the thickness of intermediate layer 17 may be as thin as possible, i.e., at most 10 nm. In the present variation, intermediate layer 17 is 3 nm thick.

Additionally, in the semiconductor light-emitting device according to the present variation, dielectric current blocking layer 30 constituted by SiO$_2$ and having a thickness of 0.1 µm is formed on the ridge-side surface. In this structure, current blocking layer 30 ensures that current injected from contact layer 20 flows only to the ridge area. Accordingly, the injection of current is focused on the region of active layer 15C located below a bottom part of the ridge. As a result, a population inversion state necessary for laser oscillation can be achieved with a relatively low injection current of about one hundred mA. Light generated by recombination of carriers constituted by electrons and holes injected into active layer 15C is confined by second optical guide layer 14, third optical guide layer 16, first semiconductor layer 12, and second semiconductor layer 19 in the layering direction of active layer 15C, and in the direction perpendicular to the layering direction (i.e., the horizontal direction), the refractive index of current blocking layer 30 is lower than the refractive indices of first semiconductor layer 12 and second semiconductor layer 19, which causes light confinement to occur. In addition, current blocking layer 30 has low optical absorption with respect to laser oscillation light, and thus a low-loss waveguide can be realized. In addition, the optical field propagating through the waveguide can be largely spread on the current blocking layer, so that ΔN (a difference in the effective refractive index in the layering direction inside and outside the ridge) of the order of $1 \times 10^{-3}$, which is suitable for high-output operation, can be realized with precision. Furthermore, by adjusting distance dp between current blocking layer 30 and active layer 15C, the magnitude of ΔN can be precisely adjusted on the order of $10^{-3}$ as well. This makes it possible to achieve a semiconductor light-emitting device having low operating current and high output while precisely adjusting the optical field. In the present variation, distance dp and the like are adjusted so that ΔN is $3 \times 10^{-3}$.

Electron barrier layer 18 is formed on intermediate layer 17 constituted by p-type GaN, and the magnitude of the forbidden band width energy of electron barrier layer 18 is greater than that of second semiconductor layer 19, which is constituted by p-type AlGaN. This makes it possible to increase the potential of the conduction band of electron barrier layer 18 and form an energy barrier. As a result, a phenomenon in which electrons injected into active layer 15C are thermally excited and leak into second semiconductor layer 19 can be suppressed, which makes it possible to improve the high-temperature operation characteristics of the semiconductor light-emitting device.

In the present variation, electron barrier layer 18 is 5 nm thick. Electron barrier layer 18 has an increasing Al composition ratio region in which the Al composition ratio increases monotonically with proximity to second semiconductor layer 19. The increasing Al composition ratio region includes the first region, which is 2.5 nm thick and in which the Al composition ratio changes at a first rate of change, and the second region, which is 2.5 nm thick, is disposed between first region and second semiconductor layer 19, and in which the Al composition ratio changes at a second rate of change, the second rate of change being greater than the first rate of change. In the first region, the Al composition ratio increases linearly from 0% to 5%, and in the second region, the Al composition ratio increases linearly from 5% to 30%.

The maximum impurity concentration of Mg, which is the impurity in electron barrier layer 18, is set to $2 \times 10^{19}$ cm$^{-3}$, and the maximum impurity concentration position in the layering direction is located between the active layer 15-side interface and the intermediate position, in the layering direction, of the increasing Al composition ratio region of electron barrier layer 18.

The low impurity concentration region of second semiconductor layer 19 is 170 nm thick and has an impurity concentration of $2 \times 10^{18}$ cm$^{-3}$, and therefore achieves both a lower waveguide loss and a lower operating voltage.

In the semiconductor light-emitting device according to the present variation, using the Al composition ratio distribution shape, impurity doping profile, and composition ratio gradient structure at the hetero interface of electron barrier layer 18 that have been described thus far makes it possible to realize a 405-nm blue-violet laser device with excellent temperature characteristics and low operating voltage, in the same manner as the 450-nm band blue laser device.

Additionally, in the semiconductor light-emitting device according to the present variation, if the ridge width W is set to at least 30 µm, an ultra-high power laser device capable of watt-class high-output operation can be realized.

Embodiment 5

A semiconductor light-emitting device according to Embodiment 5 will be described next. The semiconductor light-emitting device according to the present embodiment differs from semiconductor light-emitting device 100 according to Embodiment 1 in terms of the configurations of the second optical guide layer and the third optical guide layer. The semiconductor light-emitting device according to the present embodiment will be described below with reference to FIG. 28, focusing on the differences from semiconductor light-emitting device 100 according to Embodiment 1.

Figure 28:
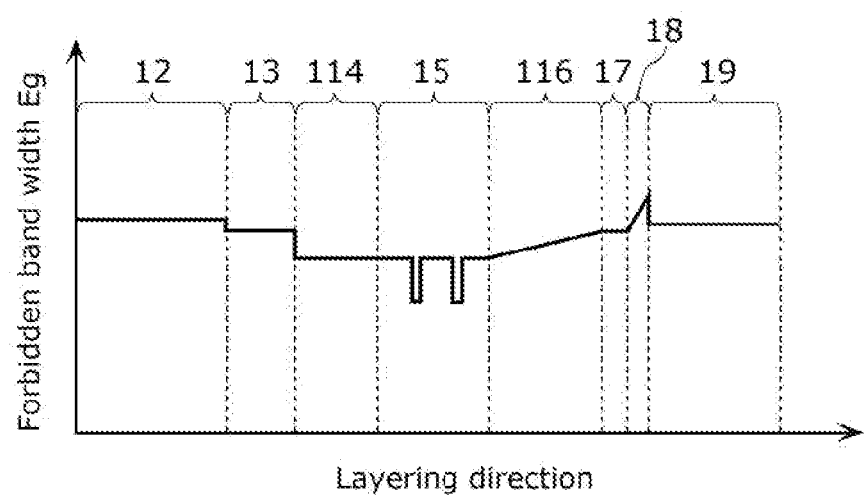
FIG. 28 is a graph illustrating a distribution of a forbidden band width in the layering direction of a semiconductor light-emitting device according to Embodiment 5.
Figure 29A:
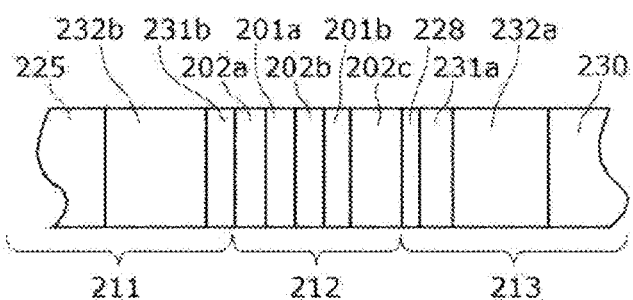
FIG. 29A is a schematic diagram illustrating the layered structure of the semiconductor light-emitting device disclosed in PTL 1.
Figure 29B:
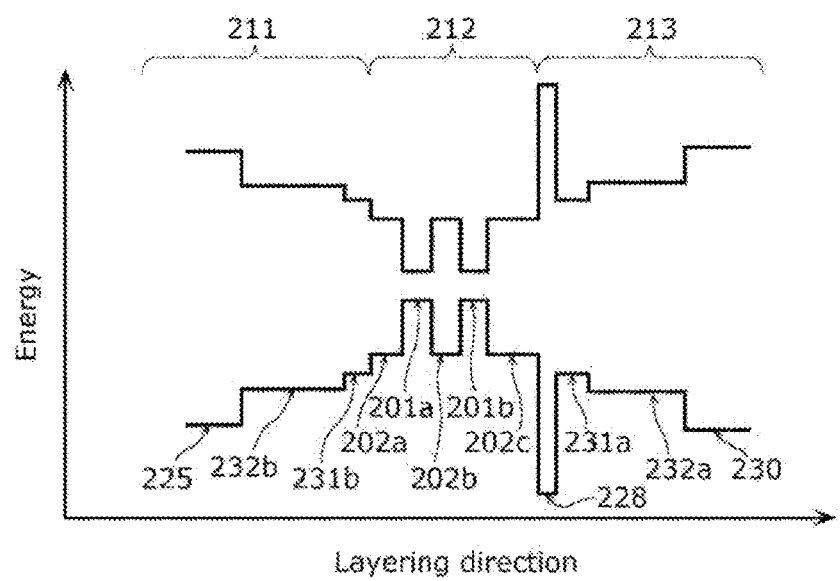
FIG. 29B is a graph illustrating the band structure of the semiconductor light-emitting device disclosed in PTL 1.
Figure 30:
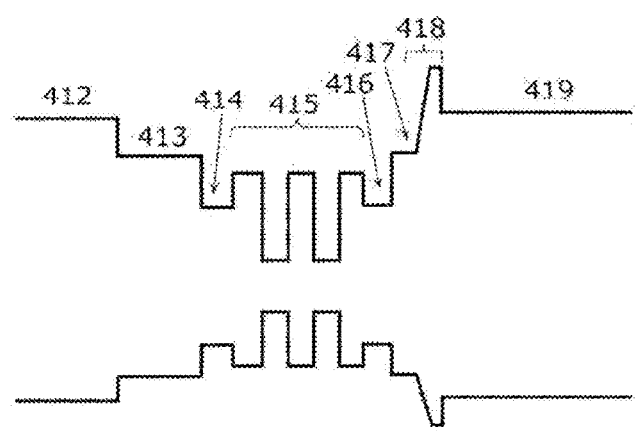
FIG. 30 is a schematic diagram illustrating a band-gap energy distribution of the semiconductor light-emitting device disclosed in PTL 2.

FIG. 28 is a graph illustrating a distribution of a forbidden band width in the layering direction of a semiconductor light-emitting device according the present embodiment. As illustrated in FIG. 28, the semiconductor light-emitting device according to the present embodiment includes first semiconductor layer 12, first optical guide layer 13, second optical guide layer 114, active layer 15, third optical guide layer 116, intermediate layer 17, electron barrier layer 18, and second semiconductor layer 19. Although not illustrated in FIG. 28, the semiconductor light-emitting device according to the present embodiment includes substrate 11, contact layer 20, current blocking layer 30, n-side electrode 31, and p-side electrode 32, like semiconductor light-emitting device 100 according to Embodiment 1.

Like third optical guide layer 16 according to Embodiment 1, third optical guide layer 116 is a second conductivity-side optical guide layer disposed between active layer 15 and electron barrier layer 18 and containing In. Like third optical guide layer 16 according to Embodiment 1, third optical guide layer 116 has a composition ratio gradient region in which a composition ratio of the In decreases with proximity to electron barrier layer 18. In the present embodiment, third optical guide layer 116 as a whole is a composition ratio gradient region. Accordingly, forbidden band width Eg of third optical guide layer 116 increases from the interface with active layer 15 toward the interface with intermediate layer 17, as illustrated in FIG. 28.

Through this, the piezoelectric polarization charge at the interface between intermediate layer 17 and third optical guide layer 116 can be spread across third optical guide layer 116 as a whole. This makes it possible to suppress a spike-shaped deformation in the band structure at the interface. As a result, a local increase in electron and hole concentrations at the stated interface can be suppressed. By having forbidden band width Eg of third optical guide layer 116 increase gradually with proximity to second semiconductor layer 19, the valence band potential of third optical guide layer 116 also increases with proximity to second semiconductor layer 19. As a result, the valence band potential of third optical guide layer 116 increases from intermediate layer 17 toward active layer 15, which makes it possible to increase the conductivity of holes from third optical guide layer 116 to active layer 15.

Here, the Fermi potential of the holes in third optical guide layer 116 is distributed so as to increase from intermediate layer 17 toward active layer 15 in order to conduct the holes electrically from intermediate layer 17 toward active layer 15. This makes it possible to keep a difference between the valence band potential of third optical guide layer 116 and the Fermi potential of the holes constant, which makes it easy to keep the hole concentration in third optical guide layer 116 at a constant low value. As a result, it is easy to achieve a reduction in free carrier loss caused by holes in third optical guide layer 116 and a reduction in the non-light emission recombination probability.

In contrast when forbidden band width Eg of third optical guide layer 116 is constant, the valence band potential of third optical guide layer 116 is almost constant between intermediate layer 17 and active layer 15. Additionally, as described earlier, the Fermi potential of the holes in third optical guide layer 116 is distributed so as to increase from intermediate layer 17 toward active layer 15 in order to conduct the holes electrically from intermediate layer 17 toward active layer 15. Accordingly, the difference between the valence band potential in third optical guide layer 116 and the Fermi potential of the holes increases from intermediate layer 17 toward active layer 15. As such, the concentration of holes in third optical guide layer 116 will increase from active layer 15 toward intermediate layer 17. Therefore, because the hole concentration increases near intermediate layer 15, the free carrier loss near intermediate layer 15 and the non-light emission recombination probability increase.

Additionally, in the present embodiment, third optical guide layer 116 is thicker than second optical guide layer 114. This increases the waveguide loss reduction effect due to the reduction in the hole concentration of third optical guide layer 116. At this time, the effective refractive index difference (ΔN) between the inside and outside of the ridge also decreases, which reduces the horizontal divergence angle of the emitted light and improves the beam quality of the laser light.

Third optical guide layer 116 is, for example, a 220 nm-thick layer constituted by InGaN. The In composition ratio of third optical guide layer 116 is 4% at the interface between third optical guide layer 116 and active layer 15C in the layering direction, decreasing gradually from the stated interface toward intermediate layer 17, and reaching 0% at the interface with intermediate layer 17. Although in the example illustrated in FIG. 28, the In composition ratio in third optical guide layer 116 changes linearly at a constant rate of change in the layering direction, but the In composition ratio may change non-linearly.

Like second optical guide layer 14 according to Embodiment 1, second optical guide layer 114 is a first conductivity-side optical guide layer, containing In, located between active layer 15 and first semiconductor layer 12. In the present embodiment, the In composition ratio of second optical guide layer 114 is greater than the average In composition ratio of third optical guide layer 116. As described above, in the present embodiment, third optical guide layer 116 is thicker than second optical guide layer 114, and thus the optical field in the layering direction is easily biased toward second semiconductor layer 19 from the center of active layer 15. However, by making the In composition ratio of second optical guide layer 114 greater than the average In composition ratio of third optical guide layer 116, the refractive index of second optical guide layer 114 can be made higher than the average refractive index of third optical guide layer 116. Bias in the optical field in the layering direction can be suppressed, and thus an increase in the waveguide loss can be suppressed.

Second optical guide layer 114 is, for example, a 160 nm-thick layer constituted by undoped InGaN having an In composition ratio of 4%.

Additionally, in the present embodiment, the In composition ratio of each barrier layer in active layer 15 is at least the In composition ratio of each optical guide layer (i.e., first optical guide layer 13, second optical guide layer 114, and third optical guide layer 116). This makes it easier to bring the peak position of the optical field intensity in the layering direction closer to the vicinity of each well layer in active layer 15. It is therefore easier to increase the light confinement factor.

Although in the present embodiment, second optical guide layer 114 is an undoped InGaN layer, an n-type InGaN layer may be used as second optical guide layer 114. In other words, second optical guide layer 114 may be doped with an n-type impurity. For example, second optical guide layer 114 may be an InGaN layer doped with Si as the n-type impurity. This makes it possible to achieve a reduction in operating voltage and a reduction in the hole concentration in second optical guide layer 114 in a laser oscillation state. This in turn reduces the free carrier loss caused by holed produced in second optical guide layer 114, which makes it possible to reduce the waveguide loss. Accordingly, the slope efficiency in the current-optical output characteristics of the semiconductor light-emitting device can be improved.

The concentration of the n-type impurity in second optical guide layer 114 may be, for example, at least $1 \times 10^{17}$ cm$^{-3}$ and at most $1 \times 10^{18}$ cm$^{-3}$. If the concentration of the n-type impurity is increased too much, the free carrier loss of electrons caused by the n-type impurity will increase. Thus to suppress free carrier loss, the concentration of the n-type impurities may be set to at least $1 \times 10^{17}$ cm$^{-3}$ and at most $6 \times 10^{17}$ cm$^{-3}$.

Variations, Etc.

A semiconductor light-emitting device according to the present disclosure has been described based on embodiments. However, the present disclosure is not limited to the foregoing embodiments.

For example, although the foregoing embodiments have described blue laser devices with an oscillation wavelength in the 450 nm band and blue-violet laser devices with an oscillation wavelength in the 405 nm band, the present disclosure can be applied to nitride-based laser devices for other wavelength bands, which use nitrides.

Additionally, in each of the above semiconductor light-emitting devices, the number of well layers in the active layer is set to 1 or 2, but the number of well layers is not limited thereto. The number of well layers may be at number of at least 1. In other words, the active layer may include a plurality of barrier layers and at least one well layer.

Additionally, the number of composition ratio gradient layers may be determined as appropriate in accordance with the number of well layers. In other words, the active layer may include a plurality of barrier layers containing at least Ga, at least one well layer, and a plurality of composition ratio gradient layers. Each of the at least one well layer may be located between two adjacent barrier layers of the plurality of barrier layers, and each of the plurality of composition ratio gradient layers may be disposed between one well layer of the at least one well layer and one barrier layer, of the plurality of barrier layers, that is adjacent to the stated one well layer.

Additionally, in the foregoing embodiments, the semiconductor light-emitting device includes the first optical guide layer, the second optical guide layer, the third optical guide layer, and the intermediate layer, but these layers are not necessary constituent elements.

Additionally, although the foregoing embodiments described examples in which the semiconductor light-emitting device is a semiconductor laser device, the semiconductor light-emitting device is not limited to a semiconductor laser device. For example, the semiconductor light-emitting device may be a superluminescent diode.

Additionally, in the semiconductor light-emitting devices according to each of the above embodiments and variations thereon, a ridge structure is used to achieve a narrowing in current, but the means for achieving a narrowing in current is not limited thereto. Electrode stripe structures, embedded structures, and the like may also be used.

Additionally, embodiments achieved by one skilled in the art making various conceivable variations on the embodiments, embodiments achieved by combining constituent elements and functions from the embodiments as desired within a scope which does not depart from the spirit of the present disclosure, and the like are also included in the present disclosure.

INDUSTRIAL APPLICABILITY

The semiconductor light-emitting device according to the present disclosure can be applied, for example, to a vehicle-mounted headlight light source as a light source that consumes little power even in high-temperature operation.

The invention claimed is:

1. A semiconductor light-emitting device, comprising:
a first semiconductor layer above a substrate, the first semiconductor layer containing a nitride semiconductor of a first conductivity type;
an active layer above the first semiconductor layer, the active layer containing a nitride semiconductor that includes Ga or In;
an electron barrier layer above the active layer, the electron barrier layer containing a nitride semiconductor including at least Al and being of a second conductivity type different from the first conductivity type; and
a second semiconductor layer above the electron barrier layer, the second semiconductor layer containing a nitride semiconductor of the second conductivity type, wherein:
the electron barrier layer includes an increasing Al composition ratio region in which an Al composition ratio increases monotonically with proximity to the second semiconductor layer,
a maximum impurity concentration position of an impurity of the second conductivity type in the electron barrier layer is located in the increasing Al composition ratio region,
an impurity concentration of the impurity of the second conductivity type at the maximum impurity concentration position is higher than an impurity concentration of the impurity of the second conductivity type at an edge of the increasing Al composition ratio region, the edge being closer to the second semiconductor layer,
a band-gap energy of the electron barrier layer is highest at least at an interface of the electron barrier layer closer to the second semiconductor layer, and
an impurity concentration of the impurity of the second conductivity type decreases from the maximum impurity concentration position toward the interface.

2. The semiconductor light-emitting device according to claim 1,
wherein an average lattice constant of the electron barrier layer is lower than an average lattice constant of the substrate.

3. The semiconductor light-emitting device according to claim 1,
wherein an average strain of a lattice in a direction parallel to a main surface of the substrate occurring in the electron barrier layer is a tensile strain.

4. The semiconductor light-emitting device according to claim 2,
wherein when x represents an atomic composition ratio of In and y represents an atomic composition ratio of Ga, the substrate has a composition expressed by $In_xGa_yAl_{1-x-y}N$, where $0 \le x < 1$, $0 < y \le 1$, and $0 \le 1-x-y \le 1$.

5. The semiconductor light-emitting device according to claim 1,
wherein the impurity concentration of the impurity of the second conductivity type in the electron barrier layer decreases monotonically from the maximum impurity concentration position toward the interface.

6. The semiconductor light-emitting device according to claim 1, further comprising:
a second conductivity-side optical guide layer between the active layer and the electron barrier layer, the second conductivity-side optical guide layer containing In.

7. The semiconductor light-emitting device according to claim 6, further comprising:
a first conductivity-side optical guide layer between the active layer and the first semiconductor layer, the first conductivity-side optical guide layer containing In,
wherein a total thickness of the first conductivity-side optical guide layer and the second conductivity-side optical guide layer is at least 250 nm.

8. The semiconductor light-emitting device according to claim 6, further comprising:
an intermediate layer between the electron barrier layer and the active layer, the intermediate layer being constituted by $Ga_{1-x}In_xN$ of the second conductivity type, where $0 \le x < 1$,
wherein the intermediate layer has an In composition ratio lower than an In composition ratio of the second conductivity-side optical guide layer.

9. The semiconductor light-emitting device according to claim 8,
wherein the intermediate layer contains an impurity of the second conductivity type, and
the maximum impurity concentration position in the intermediate layer and the electron barrier layer is located in the intermediate layer.

10. The semiconductor light-emitting device according to claim 6,
wherein the second conductivity-side optical guide layer includes a composition ratio gradient region in which a composition ratio of the In decreases with proximity to the electron barrier layer.

11. The semiconductor light-emitting device according to claim 10, further comprising:

a first conductivity-side optical guide layer between the active layer and the first semiconductor layer, the first conductivity-side optical guide layer containing In, wherein the second conductivity-side optical guide layer is thicker than the first conductivity-side optical guide layer.

12. The semiconductor light-emitting device according to claim 11, wherein the average In composition ratio of the first conductivity-side optical guide layer is higher than an average In composition ratio of the second conductivity-side optical guide layer.

13. The semiconductor light-emitting device according to claim 11, wherein the active layer includes a plurality of barrier layer containing at least In and at least one well layer, and an Al composition of the barrier layers is at least a maximum In composition ratio of the first conductivity-side optical guide layer and the second conductivity-side optical guide layer.

14. The semiconductor light-emitting device according to claim 11, wherein the first conductivity-side optical guide layer is doped with an n-type impurity.

15. The semiconductor light-emitting device according to claim 14, wherein a concentration of the n-type impurity with which the first conductivity-side optical guide is doped at least $1 \times 10^{17}$ cm$^{-3}$ and at most $6 \times 10^{17}$ cm$^{-3}$.

16. The semiconductor light-emitting device according to claim 1, wherein the increasing Al composition ratio region includes a first region in which the Al composition ratio changes at a first change rate, and a second region between the first region and the second semiconductor layer and in which the Al composition ratio changes at a second change rate, and the second change rate is higher than the first change rate.

17. The semiconductor light-emitting device according to claim 1, wherein the second semiconductor layer includes a low impurity concentration region and a high impurity concentration region, the low impurity concentration region being adjacent to the electron barrier layer, and the high impurity concentration region being located between the low impurity concentration region and an interface of second semiconductor layer on a side farther from the electron barrier layer and having an impurity concentration of the impurity of the second conductivity type that is higher than that an impurity concentration region of the impurity of the second conductivity type in the low impurity concentration region.

18. The semiconductor light-emitting device according to claim 17, wherein a maximum value of the Al composition ratio of the electron barrier layer is at least 0.2 and at most 0.35, a maximum value of the impurity concentration of the impurity of the second conductivity type in the electron barrier layer is at least $2 \times 10^{19}$ cm$^{-3}$, the impurity concentration of the low impurity concentration region m the second semiconductor layer is at least $1.5 \times 10^{18}$ cm$^{-3}$ and at most $3 \times 10^{18}$ cm$^{-3}$, a thickness of the low impurity concentration region in the second semiconductor layer is at least 150 nm and at most 270 nm.

19. The semiconductor light-emitting device according to claim 1, wherein the active layer includes:

a plurality of barrier layer containing at least Ga;

at least one well layer; and a plurality of composition ratio gradient layers;

each of the plurality of composition ratio gradient layers is between one well layer of the at least one well layer and one barrier layer, of the plurality of barrier layers, that is adjacent to the one well layer, and an In composition ratio of each of the plurality of composition ratio gradient layers changes continuously from an In composition ratio of the one well layer to an In composition ratio of the one barrier layer.

20. The semiconductor light-emitting device according to claim 19, wherein the first conductivity type is n-type, the second conductivity type is n-type, and of the plurality of composition ratio layers, a composition ratio gradient layer adjacent to the one well layer on a substrate side of the one well layer is thicker than a composition ratio gradient layer adjacent to the one well layer on an electron barrier layer side of the one well layer.

21. The semiconductor light-emitting device according to claim 19, wherein of the plurality of composition ratio gradient layers, a total thickness of two composition ratio gradient layers adjacent to the one well layer is at least 0.8 mm and at most 2.4 mm.

22. The semiconductor light-emitting device according to claim 19, wherein the at least one well layer is a single well layer.

23. The semiconductor light-emitting device according to claim 1, wherein the maximum impurity concentration position of the impurity of the second conductivity type in the electron barrier layer is closer to the active layer than a middle position, the middle position being a position between a position in the increasing Al composition ratio region where the Al composition ratio of the electron barrier layer is maximum and an interface on an active layer side of the electron barrier layer.

* * * * *